US007861010B2

(12) United States Patent
Ishii

(10) Patent No.: US 7,861,010 B2
(45) Date of Patent: Dec. 28, 2010

(54) OPERATION MONITOR SYSTEM, SEMICONDUCTOR APPARATUS, AND INFORMATION COLLECTION APPARATUS

(75) Inventor: Masahiro Ishii, Hyogo (JP)

(73) Assignee: Panasonic Corporation, Osaka (JP)

( * ) Notice: Subject to any disclaimer, the term of this patent is extended or adjusted under 35 U.S.C. 154(b) by 903 days.

(21) Appl. No.: 11/797,868

(22) Filed: May 8, 2007

(65) Prior Publication Data
US 2007/0296446 A1 Dec. 27, 2007

(30) Foreign Application Priority Data
May 8, 2006 (JP) .............................. 2006-128796

(51) Int. Cl.
*G06F 3/00* (2006.01)
*G06F 11/00* (2006.01)
(52) U.S. Cl. ................ 710/15; 710/7; 710/10; 714/1; 714/5; 714/47
(58) Field of Classification Search ...... 710/7, 710/15, 20; 714/1, 5, 47
See application file for complete search history.

(56) References Cited

U.S. PATENT DOCUMENTS 5,317,711 A * 5/1994 Bourekas et al. .............. 714/47
6,738,853 B1 * 5/2004 Higashida et al. ........... 710/305
7,190,696 B1 * 3/2007 Manur et al. ................. 370/392
2002/0059511 A1 * 5/2002 Sudo et al. ................... 712/207

FOREIGN PATENT DOCUMENTS

JP 2001-51972 2/2001

* cited by examiner

*Primary Examiner*—Alford W Kindred
*Assistant Examiner*—Farley J Abad
(74) *Attorney, Agent, or Firm*—Wenderoth, Lind & Ponack, L.L.P.

(57) ABSTRACT

An operation monitor system externally outputs a sufficient amount of condition information that indicates an internal operation condition, without using a dedicated terminal, that is to say, without a significant increase in cost. An output control unit of a semiconductor apparatus specifies an IF unit that is not currently performing input/output with respect to an IO unit, selects a selector connected to the specified IF unit, and outputs thereto a select signal indicating that the selected selector is to be used in the output of an internal operation output signal (internal monitoring data), which is the operation condition. The selector that has received the select signal selects the internal condition output signal, and outputs the selected internal condition output signal to an information collection apparatus via the IO unit. The information collection apparatus receives data from the semiconductor apparatus via connection terminals of the semiconductor apparatus, and select the internal monitoring data from among the received data.

18 Claims, 26 Drawing Sheets

FIG. 19

| | | 128c |
|---|---|---|
| IO INFORMATION HOLDING UNIT | T300 | |

| IO | IN-USE | NOT-IN-USE |
|---|---|---|
| IO-A 117c | 2 | 3 |
| IO-B 118c | 2 | 4 |
| IO-C 119c | 3 | 4 |
| IO-D 120c | 1 | 2 |

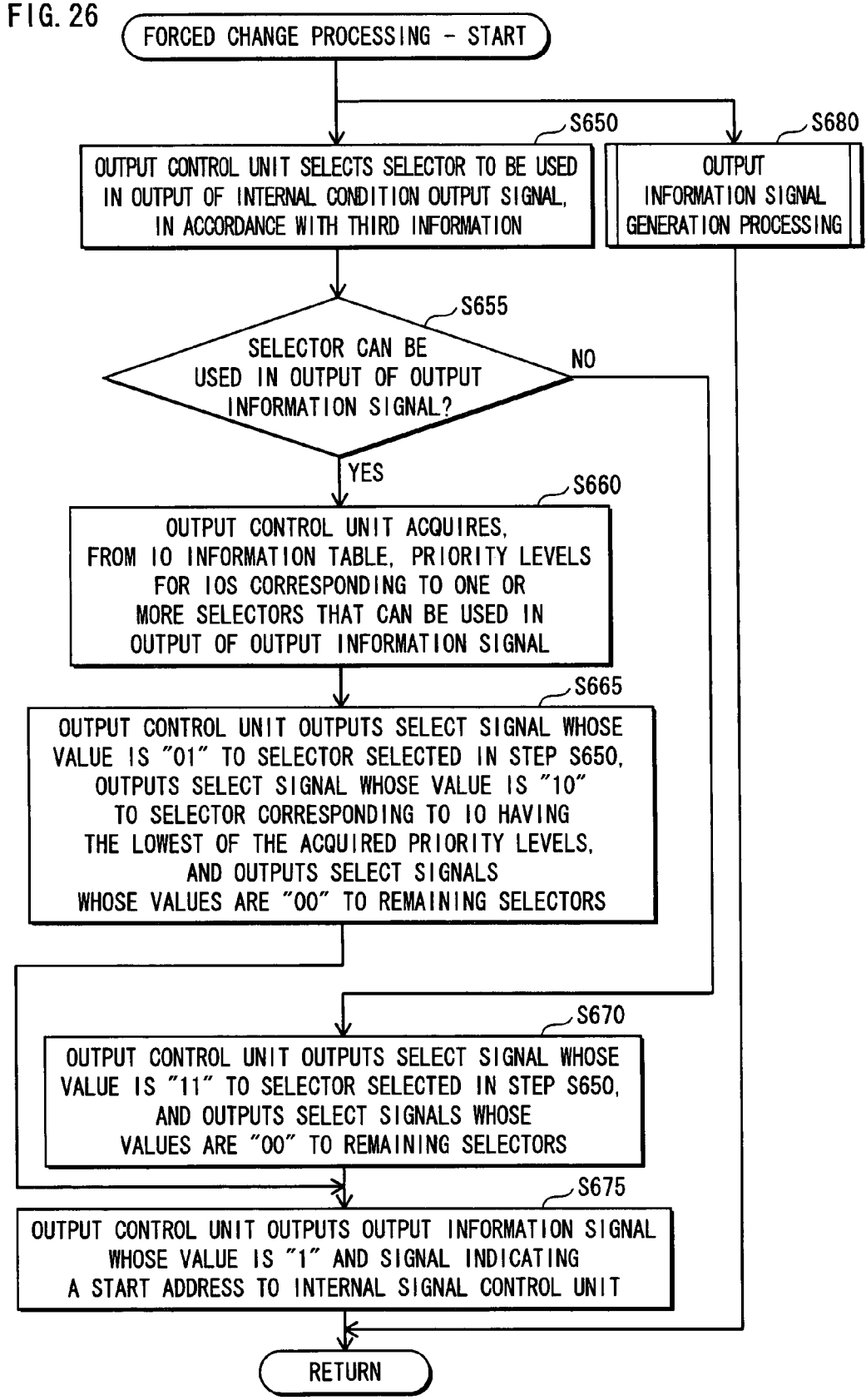

OPERATION MONITOR SYSTEM, SEMICONDUCTOR APPARATUS, AND INFORMATION COLLECTION APPARATUS

This application is based on an application no. 2006-128796 filed in Japan, the content of which is hereby incorporated by reference.

BACKGROUND OF INVENTION

1. Field of the Invention

The present invention relates to technology for outputting and displaying information pertaining to debugging, in the debugging of a system LSI that includes a plurality of functional blocks.

2. Related Art

In recent years, the scale and complexity of system LSIs have been increasing, and system debugging for such system LSIs is becoming more difficult at an accelerating pace. A system LSI normally includes a plurality of functional blocks, and debugging requires monitoring the condition of the blocks and signal lines connecting the blocks together. Conventionally, the condition information is output from LSI terminals. Japanese Patent Application Publication No. 2001-51972 discloses an exemplary conventional debugging method. According to this method, signals in a system LSI are output from an LSI terminal by using time-division to switch between the original input/output function of the terminal and a debug condition input/output function.

However, given that time-division is used in structures such as mentioned above, debugging information is not output while the time period allocated to the original input/output function of the terminal, and a sufficient amount of debugging information therefore cannot be obtained. Obtaining a sufficient amount of debugging information would require the provision of a dedicated debugging terminal, which would increase the cost of the LSI.

The present invention has been achieved in light of the above problem, and an aim thereof is to provide a semiconductor apparatus, an information collection apparatus, and an operation monitor system that externally outputs a sufficient amount of condition information, such as debugging information, that indicates an internal operation condition, without using a dedicated terminal, that is to say, without a significant increase in cost.

Patent document 1: Japanese Patent Application Publication No. 2001-51972

SUMMARY OF INVENTION

In order to achieve the above aim, the present invention is an operation monitor system including a semiconductor apparatus that has one or more connection terminals and one or more devices connected thereto in one-to-one correspondence, and an information collection apparatus that collects condition information from the semiconductor apparatus, the condition information indicating an operation condition of the semiconductor apparatus, the semiconductor apparatus including: one or more functional blocks, each operable to perform a predetermined operation, one or more of the functional blocks being an IO functional block whose predetermined operation includes performing input/output of operation information with respect to at least one of the one or more devices; an acquisition unit operable to acquire the condition information from one of the one or more functional blocks; an instruction generation unit operable to generate one of a first instruction and a second instruction for each IO functional block in accordance with a current input/output condition of the IO functional block; and one or more selectors provided in one-to-one correspondence with the one or more connection terminals, each selector being operable to perform connection switching so as to (i) when the first instruction has been generated for the IO functional block that is to perform the input/output of the operation information via the corresponding connection terminal, connect the corresponding connection terminal and said IO functional block, and (ii) when the second instruction has been generated for said IO functional block, connect the corresponding connection terminal and the acquisition unit, wherein while the acquisition unit and the corresponding connection terminal are connected via the selector, the semiconductor apparatus outputs the condition information to the information collection apparatus via the corresponding connection terminal, and the information collection apparatus collects the condition information from the corresponding connection terminal that is connected to the acquisition unit via the selector.

According to this structure, there is no need to use a dedicated terminal for outputting condition information in the semiconductor apparatus of the operation monitor system since the selectors switch connections based on instructions generated by the instruction generation unit, and when a selector is connected to the acquisition unit, the selector outputs the condition information via the corresponding connection terminal.

Also, the present invention is a semiconductor apparatus that has one or more connection terminals and one or more devices connected thereto in one-to-one correspondence, and that externally outputs condition information indicating an internal operation condition, including: one or more functional blocks, each operable to perform a predetermined operation, one or more of the functional blocks being an IO functional block whose predetermined operation includes performing input/output of operation information with respect to at least one of the one or more devices; an acquisition unit operable to acquire the condition information from one of the one or more functional blocks; an instruction generation unit operable to generate one of a first instruction and a second instruction for each IO functional block in accordance with a current input/output condition of the IO functional block; and one or more selectors provided in one-to-one correspondence with the one or more connection terminals, each selector being operable to perform connection switching so as to (i) when the first instruction has been generated for the IO functional block that is to perform the input/output of the operation information via the corresponding connection terminal, connect the corresponding connection terminal and said IO functional block, and (ii) when the second instruction has been generated for said IO functional block, connect the corresponding connection terminal and the acquisition unit.

According to this structure, there is no need to use a dedicated terminal for output condition information in the semiconductor apparatus since the selectors switch connections in accordance with instructions generated by the instruction generation unit, and when a selector is connected to the acquisition unit, the selector outputs the condition information via the corresponding connection terminal.

Here, each IO functional block may be further operable to judge whether the input/output of the operation information is being performed by the IO functional block, and output a judgment result to the instruction generation unit, and the instruction generation unit may be further operable to receive the judgment result from the each IO functional block, perform a search based on each received judgment result for one or more functional blocks that are not performing the input/output of the operation information, upon finding one or more functional blocks that are not performing the input/output of the operation information, specify the one or more selectors whose connection targets are said one or more functional blocks, select one of the specified selectors to be used in output of the condition information, and generate the second instruction to cause the selected selector to connect the connection terminal corresponding thereto and the acquisition unit.

According to this structure, the semiconductor apparatus specifies one or more functional blocks that are not currently being used to perform input/output with a device, and generates a second instruction to cause the selector connected to one of the specified functional blocks to connect the acquisition unit and the connection terminal corresponding to the selector. This enables the selector that has connected the acquisition unit and the connection terminal to output the condition information to an external apparatus without influencing the input/output of operation information.

Also, in a case of performing switching by time division, condition information is not output during the time period allocated for the connection's original input/output function, even if a functional block is not performing input/output with a device. However, in the present invention, a connection terminal not being used in the input/output of operation information is used to output the condition information, thereby obtaining a more sufficient amount of condition information than when performing switching by time division, in order to inform a user of the operation condition of the functional blocks.

Here, the instruction generation unit may be further operable to output the second instruction to the selected selector, and output the first instruction to remaining ones of the one or more selectors, and each selector may be further operable to receive the first instruction or the second instruction from the instruction generation unit, set one of the one or more functional blocks as the connection target upon receiving the first instruction, and the acquisition unit as the connection target upon receiving the second instruction.

This structure enables the selectors of the semiconductor apparatus to reliably perform connection switching in accordance with an instruction received from the instruction generation unit.

Here, the semiconductor apparatus may further include: an output terminal, wherein the instruction generation unit may be further operable to, upon selecting the selector to be used in the output of the condition information, generate identification information that identifies the selected selector, and externally output the generated identification information via the output terminal.

According to this structure, the semiconductor apparatus outputs identification information to the information collection apparatus with use of the output terminal, which is a dedicated terminal. Given that the output terminal may be provided with only signal lines for outputting the identification information, there may be fewer signal lines than in a case of outputting condition information, thereby enabling suppressing cost, unlike a case of providing a dedicated terminal for outputting condition information.

Also, given that the semiconductor apparatus outputs the identification information, the external apparatus can specify the connection terminal corresponding to the selector that has output the condition information.

Here, the instruction generation unit may be further operable to, upon selecting the selector to be used in the output of the condition information, generate identification information that identifies the selected selector, and generate a third instruction, and each selector may be further operable to, when the third instruction has been generated by the instruction generation unit, set the instruction generation unit as the connection target, and externally output the identification information via the corresponding connection terminal.

This structure enables the selectors of the semiconductor apparatus to make a connection with the instruction generation unit.

Here, the instruction generation unit may be further operable to, upon performing the selection, select, from among the one or more specified selectors, a selector to be used in the output of the identification information, output the second instruction to the selector selected to be used in the output of the condition information, output the third instruction to the selector selected to be used in the output of the identification information, and output the first instruction to remaining ones of the one or more selectors, and each selector may be further operable to receive the first instruction, the second instruction or the third instruction from the instruction generation unit, and upon receiving the first instruction, set one of the one or more IO functional blocks as the connection target, upon receiving the second corresponding, set the acquisition unit as the connection target, and upon receiving the third instruction, set the instruction generation unit as the connection target.

This structure enables the selectors of the semiconductor apparatus to reliably perform switching to receive operation information, condition information or identification in accordance with an instruction received from the instruction generation unit.

Here, upon finding two or more functional blocks that are not currently performing the input/output, the instruction generation unit may select, from among two or more of the specified selectors, another selector other than the selector selected to be used in the output of the condition information, the another selector to be used in output of the identification information.

According to this structure, the semiconductor apparatus outputs the identification information using, from among the selectors corresponding to the plurality of functional blocks not currently performing input/output, a selector other than the selector to be used in the output of the condition information, thereby enabling separate output of the condition information and identification information.

Here, upon finding only one functional block that is not currently performing the input/output, the instruction generation unit may select the selector that is to be used in the output of the condition information to also be used in the output of the identification information, the instruction generation unit may be further operable to generate a fourth instruction and output the generated fourth instruction to the selector that has been selected to be used in the output of both the identification information and the condition information, and each selector may be further operable to receive the fourth instruction and set the acquisition unit and the instruction generation unit as the connection targets.

This structure enables the semiconductor apparatus to output both the condition information and the identification information together using the selector corresponding to the one functional block that is not currently performing input/output.

Here, the instruction generation unit may be further operable to attach header information to the identification information, the header information indicating that the identification information is identification information.

According to this structure, the semiconductor apparatus attaches header information to the identification information that is output, thereby enabling the receiving-side external apparatus to specify the identification information from among received information pieces.

Here, the semiconductor apparatus may further include: a storage unit operable to have stored therein the condition information, wherein the acquisition unit may acquire the condition information stored in the acquisition unit only when the instruction generation unit has selected the selector to be used in the output of the condition information.

According to this structure, the semiconductor apparatus outputs the condition information to the external apparatus only upon selecting a selector to be used in output of the condition information, thereby enabling output of stored condition information when a selector to be used in output of the condition information has not been selected. This enables the user to get a sufficient amount of condition information.

Here, the semiconductor apparatus may further include: a storage unit operable to have stored therein one or more in-use priority levels and not-in-use priority levels in one-to-one correspondence with the one or more connection terminals, wherein the instruction generation unit may acquire, in accordance with a result of the search, the in-use priority levels or not-in-use priority levels corresponding to at least two connection terminals, and select the selector corresponding to the connection terminal that has a lowest priority level among the received priority levels, the selected selector to be used in the output of the condition information.

According to this structure, the semiconductor apparatus selects a selector to be used in output of condition information, with use of in-use priority levels and not-in-use priority levels for the connection terminals. This reduces the influence on the input/output of operation information.

Here, the semiconductor apparatus may further include: a storage unit operable to have stored therein one or more terminal information pieces in one-to-one correspondence with the one or more connection terminals, each terminal information piece indicating a property of the corresponding connection terminal, wherein the instruction generation unit may acquire property information that indicates a property of the condition information, and with use of the acquired property information and each terminal information piece, specify one or more of the functional blocks to be a target for the search.

According to this structure, the semiconductor apparatus narrows down the search targets with use of the property information and the terminal information pieces corresponding to the connection terminals, thereby reducing the time required to select a selector to be used in output of the condition information.

Here, the semiconductor apparatus may further include: an instruction reception unit operable to externally receive specification information that specifies one of the one or more connection terminals to output the condition information, wherein upon reception of the specification information, the instruction generation unit may generate an instruction for causing the selector connected to the specified connection terminal to be used in the output of the condition information, so as to cause the condition information to be output via the connection terminal specified by the specification information, regardless of a result of the search.

According to this structure, the semiconductor apparatus receives specification information, and outputs a selection instruction to cause the selector connected to the connection terminal indicated by the received specification information to select the condition information. This enables the external apparatus to easily specify the connection terminal from which the condition has been output.

Also, the present invention is an information collection apparatus that is connected to a semiconductor apparatus which has one or more connection terminals and one or more devices connected thereto in one-to-one correspondence, the information collection apparatus including: an apparatus information reception unit operable to receive one or more information pieces from the semiconductor apparatus via the one or more connection terminals; and a selection unit operable to select, from among the one or more received information pieces, condition information that indicates an operation condition of the semiconductor apparatus.

According to this structure, the information collection apparatus selects condition information from among the information pieces output from the semiconductor apparatus, thereby informing the user of an internal condition of the semiconductor apparatus.

Here, the reception unit may include: an identification information reception unit operable to receive, from the semiconductor apparatus, identification information indicating the connection terminal that is to output the condition information, and the selection unit may select an information piece received from the connection terminal indicated by the identification information as the condition information.

Here, the semiconductor apparatus may attach header information to the identification information that indicates the connection terminal that is to output the condition information, the header information indicating that the identification information is identification information, and thereafter output the identification information, and the apparatus information reception unit may receive the one or more information pieces from the one or more connection terminals, and if one of the one or more received information pieces includes information having the header information attached thereto, select the one information piece as the identification information, and select, as the condition information, the information piece that has been output from the connection terminal corresponding to the selector indicated by the selected identification information.

According to this structure, the information collection apparatus specifies the connection terminal that has output the condition information with use of identification information, thereby making it possible to easily select the condition information from among the information pieces received from the semiconductor apparatus via the connection terminals.

BRIEF DESCRIPTION OF DRAWINGS

These and other objects, advantages, and features of the invention will become apparent from the following description thereof taken in conjunction with the accompanying drawings, which illustrate specific embodiments of the present invention.

In the drawings:

FIG. 9 shows a structure of an information processing unit 201a;

FIG. 11 is a flowchart showing selector switch processing in a semiconductor apparatus 101a;

FIG. 12 is a flowchart showing selector selection processing in the semiconductor apparatus 101a;

FIG. 13 is a flowchart showing output information signal generation processing in the semiconductor apparatus 101a;

FIG. 14 is a flowchart showing data output processing in an information collection apparatus 200a;

FIG. 19 shows an exemplary data structure of an IO information table T300;

FIG. 26 is a flowchart showing forced switch processing in the semiconductor apparatus 101d.

DETAILED DESCRIPTION OF PREFERRED EMBODIMENTS

Embodiments of the present invention are described below with reference to the drawings.

Embodiment 1

Figure 1:
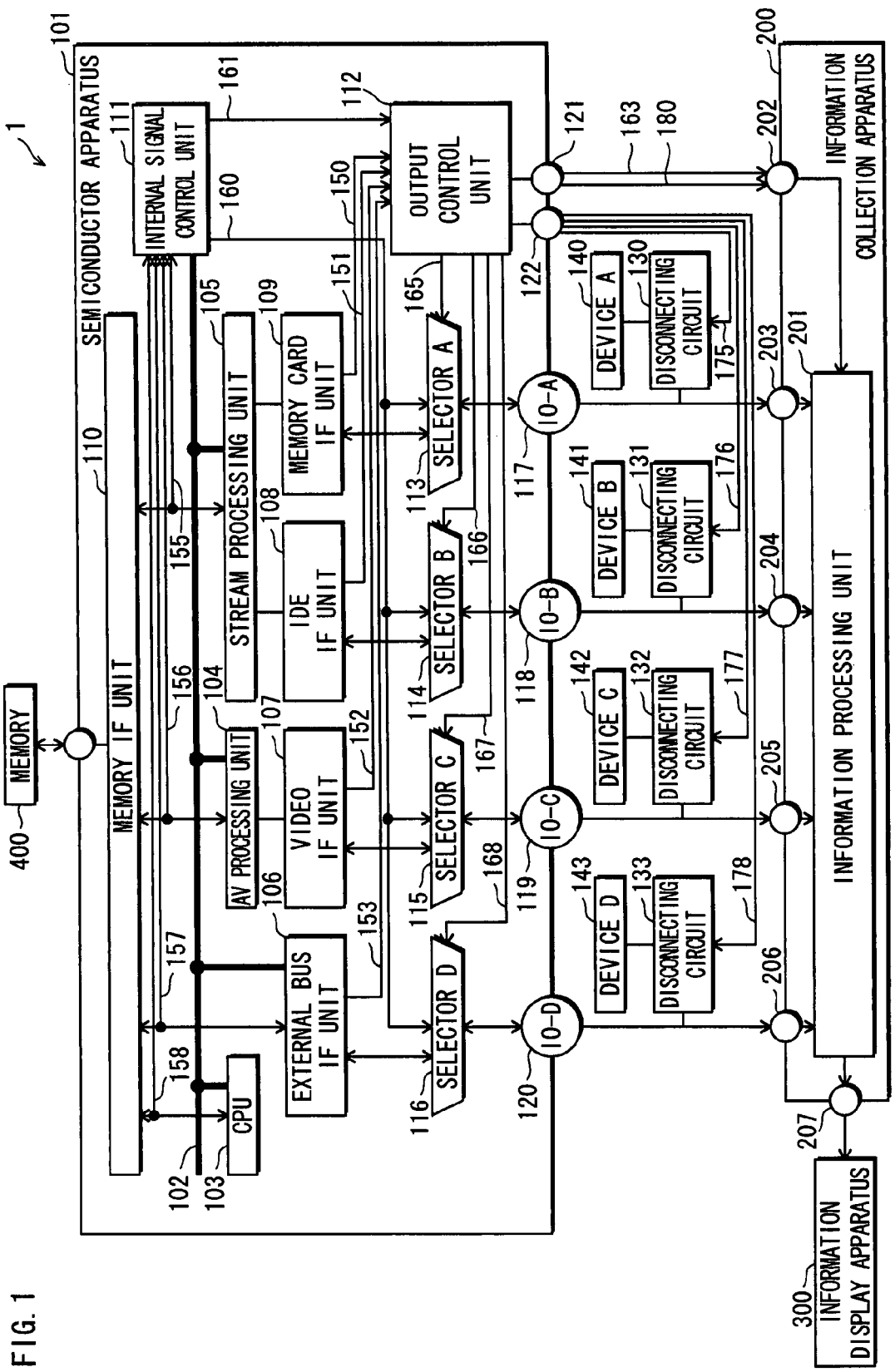
FIG. 1 shows a structure of a semiconductor operation monitor system 1.

FIG. 1 is a block diagram showing a structure of a semiconductor operation monitor system 1 in embodiment 1 of the present invention.

As shown in FIG. 1, the semiconductor operation monitor system 1 includes a semiconductor apparatus 101, an information collection apparatus 200, an information display apparatus 300, a memory 400 such as an SDRAM, disconnecting circuits 130, 131, 132 and 133, and devices A 140, B 141, C 142 and D 143.

The semiconductor apparatus 101 is, for example, a system LSI. The semiconductor apparatus 101 monitors a condition therein by running a debugging program, and output data necessary for debugging (hereinafter, referred to as "internal monitoring data") to the information collection apparatus 200.

The information collection apparatus 200 is, for example, a logic analyzer. The information collection apparatus 200 receives the internal monitoring data from the semiconductor apparatus 101, and outputs the received internal monitoring data to the information display apparatus 300.

The information display apparatus 300 is, for example, a monitor. Upon receiving the internal monitoring data from the information collection apparatus 200, the information display apparatus 300 displays the received internal monitoring data.

The disconnecting circuits 130 to 133 connect the semiconductor apparatus 101 to the devices A 140, B 141, C 142 and D 143 respectively, and break such connections, in accordance with instruction from the semiconductor apparatus 101.

The device A 140 is a memory card-mountable device such as, specifically, a memory card drive.

The device B 141 is a hard disk or optical drive device. One example of the device B 141 is an optical drive device into which a CD-R/RW can be inserted.

The device C 142 is a device that performs processing pertaining to image processing.

The device D 143 is a ROM provided external to the semiconductor apparatus 101.

1.1 Semiconductor Apparatus 101

As shown in FIG. 1, the semiconductor apparatus 101 includes an internal bus 102, a CPU 103, an AV processing unit 104, a stream processing unit 105, an external bus IF unit 106, a video IF unit 107, an IDE (Integrated Drive Electronics) IF unit 108, a memory card IF unit 109, a memory IF unit 110, an internal signal control unit 111, an output control unit 112, selectors A 113, B 114, C 115 and D 116, an IO-A 117, an IO-B 118, an IO-C 119, an IO-D 120, a first output terminal 121, and a second output terminal 122.

Here, the selectors A 113, B 114, C 115 and D 116 have been provided in one-to-one correspondence with the IO-A 117, IO-B 118, IO-C 119 and IO-D 120.

(1) Internal Bus 102

The internal bus 102 connects a plurality of internal blocks to each other.

Here, the internal bus 102 connects the CPU 103, the AV processing unit 104, the stream processing unit 105, the external bus IF unit 106, and the internal signal control unit 111 to each other.

(2) CPU 103

The CPU 103 controls overall operations of the semiconductor apparatus 101.

The CPU 103 also executes the debugging program and controls debugging processing.

The CPU 103 controls overall operations of the semiconductor apparatus 101 and debugging processing while inputting/outputting data from/to the memory 400.

(3) Stream Processing Unit 105

The stream processing unit 105 inputs/outputs data from/to the device A 140 that has a memory card mounted therein and the device B 141 that has a disc such as a CD-R/RW inserted therein.

The stream processing unit 105 receives, for example, stream data, which is playback data of a video, from the device A 140 or the device B 141, and retrieves various types of information such as AV data from the received stream data in real-time. The stream processing unit 105 also generates stream data, and outputs the generated stream data to the device A 140 or the device B 141.

Note that the stream processing unit 105 performs the aforementioned operations (stream processing) while inputting/outputting data from/to the memory 400.

Also note that a detailed description of the stream processing unit 105 has been omitted since it is known technology.

Here, the inputting/outputting of data refers to only the input of data, only the output of data, or both the input and output of data.

(4) AV Processing Unit 104

The AV processing unit 104 performs processing for generating a video signal with use of the AV data retrieved by the stream processing unit 105.

The AV processing unit 104 outputs the generated video signal to the device C 142. Also, upon receiving data from the device C 142, the AV processing unit 104 performs processing for, for example, generating a video signal with use of the received data.

The AV processing unit 104 performs the aforementioned operations (AV processing) while inputting/outputting data from/to the memory 400.

Note that a detailed description of the AV processing unit 104 has been omitted since it is known technology.

(5) External Bus IF Unit 106

The external bus IF unit 106 is a bus connection interface for connecting to an external device (here, the device D 143). The external bus IF unit 106 inputs/outputs data from/to the device D 143.

Specifically, upon receiving data from the device D 143, the external bus IF unit 106 outputs the received data to the CPU 103, the AV processing unit 104 or the stream processing unit 105 via the internal bus 102. Also, upon receiving data from the CPU 103, the AV processing unit 104 or the stream processing unit 105 via the internal bus 102, the external bus IF unit 106 outputs the received data to the device D 143.

Note that the external bus IF unit 106 inputs/outputs data from/to the device D 143 while inputting/outputting data from/to the memory 400.

The external bus IF unit 106 continuously judges whether the selector D 116 must be used (i.e., a condition in which data is being input/output from/to the device D 143) or whether the selector D 116 does not need to be used (i.e., a condition in which data is not being input/output from/to the device D 143), and outputs a result of the judgment to the output control unit 112 as an IO usage condition notification signal 153.

(IO Usage Condition Notification Signal 153)

The following describes an example of the IO usage condition notification signal 153.

The IO usage condition notification signal 153 is a 1-bit signal, where a value "0" indicates a condition in which a corresponding selector must be used (i.e., a condition in which the selector is being used for the input/output of data) and a value "1" indicates a condition in which a corresponding selector does not need to be used (i.e., a condition in which the selector is not being used for the input/output of data). Note that the external bus IF unit 106 outputs the IO usage condition notification signal 153 to the output control unit 112 with use of one signal line.

(6) Video IF Unit 107

The video IF unit 107 performs the input/output of the video signal generated by the AV processing unit 104. Specifically, the video IF unit 107 receives the video signal from the AV processing unit 104, and outputs the received video signal to the selector C 115. Also, upon receiving data from the device C 142, the video IF unit 107 outputs the received data to the AV processing unit 104.

The video IF unit 107 continuously judges whether the AV processing unit 104 is inputting/outputting data from/to the selector C 115, or whether the AV processing unit 104 is not inputting/outputting data from/to the selector C 115, and outputs a result of the judgment to the output control unit 112 as an IO usage condition notification signal 152.

Note that a detailed description of the IO usage condition notification signal 152 has been omitted since it is the same as the IO usage condition notification signal 153. Also, the video IF unit 107 outputs the IO usage condition notification signal 152 to the output control unit 112 with use of one signal line.

(7) IDE IF Unit 108

The IDE IF unit 108 performs the input/output of an IDE signal to/from the stream processing unit 105. Specifically, the IDE IF unit 108 receives an IDE signal from the device B 141 that has inserted therein a disc such as CD-R/RW on which stream data is recorded, and outputs the received IDE signal to the stream processing unit 105. The IDE IF unit 108 also receives an IDE signal from the stream processing unit 105, and outputs the received IDE signal to the device B 141 via the selector B 114 and the IO-B 118.

The IDE IF unit 108 continuously judges whether the stream processing unit 105 is inputting/outputting data from/to the selector B 114, or whether the stream processing unit 105 is not inputting/outputting data from/to the selector B 114, and outputs a result of the judgment to the output control unit 112 as an IO usage condition notification signal 151.

Note that a detailed description of the IO usage condition notification signal 151 has been omitted since it is the same as the IO usage condition notification signal 153. Also, the IDE IF unit 108 outputs the IO usage condition notification signal 151 to the output control unit 112 with use of one signal line.

(8) Memory Card IF Unit 109

The memory card IF unit 109 performs the input/output of a data signal between the stream processing unit 105 and the device A 140 that has mounted therein a memory card on which stream data is recorded. Specifically, the memory card IF unit 109 receives the data signal from the device A 140, and outputs the received data signal to the stream processing unit 105. Also, upon receiving data from the stream processing unit 105, the memory card IF unit 109 outputs the received data signal to the device A 140 via the selector A 113 and the IO-A 117.

The memory card IF unit 109 continuously judges whether the stream processing unit 105 is inputting/outputting data to/from the selector A 113, or whether the stream processing unit 105 is not inputting/outputting data to/from the selector A 113, and outputs a result of the judgment to the output control unit 112 as an IO usage condition notification signal 150.

Note that a detailed description of the IO usage condition notification signal 150 has been omitted since it is the same as the IO usage condition notification signal 153. Also, the memory card IF unit 109 outputs the IO usage condition notification signal 150 to the output control unit 112 with use of one signal line.

(9) Memory IF Unit 110

The memory IF unit 110 transfers data between the memory 400 and the semiconductor apparatus 101.

As one example, the memory IF unit 110 inputs/outputs data to/from the stream processing unit 105, the AV processing unit 104, the external bus IF unit 106, and the CPU 103.

(10) Internal Signal Control Unit 111

The internal signal control unit 111 receives data, which is being transferred between the memory IF unit 110 and the stream processing unit 105, as an internal condition signal 155.

The internal signal control unit 111 also receives data, which is being transferred between the memory IF unit 110 and the AV processing unit 104, as an internal condition signal 156.

The internal signal control unit 111 also receives data, which is being transferred between the memory IF unit 110 and the external bus IF unit 106, as an internal condition signal 157.

The internal signal control unit 111 also receives data, which is being transferred between the memory IF unit 110 and the CPU 103, as an internal condition signal 158.

In this way, the internal signal control unit 111 receives the four internal condition signals 155 to 158 that have been input/output to/from the memory IF unit 110.

In accordance with an instruction from the debugging program being executed, the internal signal control unit 111 selects, from among the received internal condition signals, one internal condition signal to be output to the information collection apparatus 200, and outputs the selected internal condition signal to the selectors A 113, B 114, C 115 and D 116 as an internal condition output signal 160. The internal condition output signal 160 is debugging information, that is to say, internal monitoring data.

The internal signal control unit 111 outputs a type of the internal condition output signal 160 currently being output to the information collection apparatus 200, to the output control unit 112 as an internal condition notification signal 161.

(Internal Condition Transmission Signal 161)

The following describes an example of the internal condition notification signal 161.

The internal condition notification signal 161 is a 2-bit signal, and the values "00", "01", "10" and "11" indicate the type of the internal condition output signal 160 being output to the information collection apparatus 200.

The value "00" indicates that the internal condition output signal 160 (internal monitoring data) currently being output is data being transferred between the stream processing unit 105 and the memory IF unit 110.

The value "01" indicates that the internal condition output signal 160 (internal monitoring data) currently being output is data being transferred between the AV processing unit 104 and the memory IF unit 110.

The value "10" indicates that the internal condition output signal 160 (internal monitoring data) currently being output is data being transferred between the external bus IF unit 106 and the memory IF unit 110.

The value "11" indicates that the internal condition output signal 160 (internal monitoring data) currently being output is data being transferred between the CPU 103 and the memory IF unit 110.

In this case, the internal signal control unit 111 outputs the internal condition notification signal 161 to the output control unit 112 with use of two signal lines. For example, the internal signal control unit 111 outputs higher-order bits of the internal condition notification signal 161 with use of one signal line, and lower-order bits of the internal condition notification signal 161 with use of the other signal line.

(11) Output Control Unit 112

The output control unit 112 receives the IO usage condition notification signals 150 to 153 from the external bus IF unit 106, the video IF unit 107, the IDE IF unit 108, and the memory card IF unit 109 respectively.

The output control unit 112 receives the internal condition notification signal 161 from the internal signal control unit 111.

The output control unit 112 judges, according to the received IO usage condition notification signals 150, 151, 152 and 153, whether any selectors are not being used in the input/output of data.

According to a result of the judgment, the output control unit 112 generates select signals 165, 166, 167 and 168 for the selectors A 113, B 114, C 115 and D 116 respectively. Each select signal indicates an instruction for the corresponding selector to either be used in the input/output of normal data or be used in the output of the internal condition output signal 160. The output control unit 112 outputs the generated select signals 165, 166, 167 and 168 to the corresponding selector.

The output control unit 112 outputs an active data identification signal 180 to the information collection apparatus 200 via the first output terminal 121. The active data identification signal 180 indicates whether active internal monitoring data is currently being output from the semiconductor apparatus 101 or not being output from anywhere.

Although the output control unit 112 is described above as generating a select signal for each selector, this is the same as generating a select signal for each IF unit connected to a selector. This is because the selectors and IF units are connected in one-to-one correspondence. It can also be said that the output control unit 112 generates one or more select signals for each processing unit connected to the IF units (the AV processing unit 104, the stream processing unit 105, and the external bus IF unit 106.

The following describes operations performed in accordance with the result of judging whether any of the selectors are not being used in the input/output of data.

(If all of the Selectors are being Used in the Input/Output of Data)

In the case of judging that all of the selectors are being used in the input/output of data, the output control unit 112 outputs, to each of the selectors, a select signal indicating an instruction for the selectors to be used in the input/output of normal data. The output control unit 112 also outputs, to the information collection apparatus 200, the active data identification signal 180 which indicates that active internal monitoring data is not currently being output from the semiconductor apparatus 101.

(If any of the Selectors are not being Used in the Input/Output of Data)

In the case of judging that any of the selectors are not being used in the input/output of data, the output control unit 112 selects one of the selectors not being used and outputs, to the selected selector, a select signal indicating an instruction to be used in the output of an internal condition output signal. The output control unit 112 outputs, to the remaining selectors, select signals indicating an instruction to be used in the input/output of normal data.

Furthermore, the output control unit 112 generates a selected selector notification signal 162 that indicates the selected selector. The output control unit 112 generates an output information signal 163 including the generated selected selector notification signal 162 and the internal condition notification signal 161 received from the internal signal control unit 111. The output information signal 163 is generated by, for example, concatenating the selected selector notification signal 162 and the internal condition notification signal 161.

The output control unit 112 outputs, to the information collection apparatus 200 via the first output terminal 121, the generated output information signal 163 and the active data identification signal 180 indicating that active internal monitoring data is currently being output from the semiconductor apparatus 101. Note that the internal condition notification signal 161 and selected selector notification signal 162 to be output to the information collection apparatus 200 from the semiconductor apparatus 101 are not depicted in FIG. 1 between the first output terminal 121 and the information collection apparatus 200 since they are included in the output information signal 163.

The output control unit 112 outputs disconnect instruction signals 175, 176, 177 and 178 to the disconnecting circuits 130 to 133 respectively. The disconnect instruction signals 175 to 178 respectively indicate an instruction to break a connection between the semiconductor apparatus 101 and the device A 140, B 141, C 142 or D 143 connected thereto.

When a selector and an IO are to be used in the output of the internal condition output signal 160, the output control unit 112 outputs a disconnect instruction signal to the disconnecting circuit corresponding to the selector and IO. Here, the disconnect instruction signal indicates an instruction to break the connection between the IO and a device connected thereto such that data cannot be output from the selector to the device.

When a selector and an IO are to be used in the output of normal data, the output control unit 112 outputs a disconnect instruction signal to the disconnecting circuit corresponding to the selector and IO. Here, the disconnect instruction signal indicates an instruction to connect the IO and the device connected to the selector.

For example, if selector A 113 is to be used in the output of the internal condition output signal 160, the output control unit 112 outputs, to the disconnecting circuit 130, a disconnect instruction signal 175 that indicates an instruction to break the connection between the IO-A 117 and the device A 140. Given that the remaining selectors are to be used in the output of normal data, the output control unit 112 outputs, to the disconnecting circuits 131, 132 and 133, disconnect instruction signals 176, 177 and 178 that indicate an instruction to make a connection between the IOs and the devices connected thereto.

(Disconnect Instruction Signal 175)

The following describes an example of the disconnect instruction signal 175.

The disconnect instruction signal 175 is a 1-bit signal, where a value "0" indicates an instruction to connect an IO and a device, and a value "1" indicates an instruction to break a connection between the IO and the device.

Note that descriptions of the disconnect instruction signals 176, 177 and 178 have been omitted since they are the same as the disconnect instruction signal 175.

(Select Signal 165)

The following describes an example of the select signal 165.

The select signal 165 is a 1-bit signal, where a value "0" indicates an instruction to be used in the input/output of normal data, and a value "1" indicates an instruction to be used in the output of an internal condition output signal.

Note that descriptions of the select signals 166, 167 and 168 have been omitted since they are the same as the select signal 165.

(Selected Selector Notification Signal 162)

The following describes an example of the selected selector notification signal 162.

The selected selector notification signal 162 is a 2-bit signal.

A value "00" indicates that the selector A 113 has been selected, and a value "01" indicates that the selector B 114 has been selected. Also, a value "10" indicates that the selector C 115 has been selected, and a value "11" indicates that the selector D 116 has been selected.

Here, the output control unit 112 outputs the output information signal 163 to the information collection apparatus 200 with use of 4 signal lines (called first, second, third and fourth signal lines).

For example, in a case of outputting the selected selector notification signal 162, the output control unit 112 outputs the lower-order bits thereof to the information collection apparatus 200 with use of the first signal line, and outputs the higher-order bits thereof to the information collection apparatus 200 with use of the second signal line. In a case of outputting the internal condition notification signal 161, the output control unit 112 outputs the lower-order bits thereof to the information collection apparatus 200 with use of the third signal line, and outputs the higher-order bits thereof to the information collection apparatus 200 with use of the fourth signal line.

(Active Data Identification Signal 180)

The following describes an example of the active data identification signal 180.

The active data identification signal 180 is a 1-bit signal, where a value "0" indicates that active internal monitoring data is being output, and a value "1" indicates that active internal monitoring data is not being output from anywhere.

Here, the output control unit 112 outputs the active data identification signal 180 to the information collection apparatus 200 with use of the first output terminal 121.

(12) Selectors A 113, B 114, C 115 and D 116

The selector A 113 determines, according to the select signal 165 received from the output control unit 112, data to be output to the IO-A 117. In other words, the selector A 113 determines a source from which to receive data, receives data from the determined source, and outputs the received data to the information collection apparatus 200 via the IO-A 117.

Specifically, upon receiving the select signal 165 whose value is "0" from the output control unit 112, the selector A 113 performs the input/output of data between the memory card IF unit 109 and the device A 140 via the IO-A 117. In other words, the selector A 113 receives data from the memory card IF unit 109, and outputs the received data to the IO-A 117. Also, upon receiving data from the device A 140 via the IO-A 117, the selector A 113 outputs the received data to the memory card IF unit 109. Upon receiving the select signal 165 whose value is "1" from the output control unit 112, the selector A 113 outputs the internal condition output signal 160 (internal monitoring data) received from the internal signal control unit 111 to the information collection apparatus 200 via the IO-A 117.

Also, the selectors B 114, C 115 and D 116 perform similar operations to the selector A 113.

Upon receiving the select signal 166 whose value is "0" from the output control unit 112, the selector B 114 performs the input/output of data between the IDE IF unit 108 and the device B 141 via the IO-B 118. Upon receiving the select signal 166 whose value is "1" from the output control unit 112, the selector B 114 outputs the internal condition output signal 160 (internal monitoring data) received from the internal signal control unit 111 to the information collection apparatus 200 via the IO-B 118.

Upon receiving the select signal 167 whose value is "0" from the output control unit 112, the selector C 115 performs the input/output of data between the video IF unit 107 and the device C 142 via the IO-C 119. Upon receiving the select signal 167 whose value is "1" from the output control unit 112, the selector C 115 outputs the internal condition output signal 160 (internal monitoring data) received from the internal signal control unit 111 to the information collection apparatus 200 via the IO-C 119.

Upon receiving the select signal 168 whose value is "0" from the output control unit 112, the selector D 116 performs the input/output of data between the external bus IF unit 106 and the device D 143 via the IO-D 120. Upon receiving the select signal 166 whose value is "1" from the output control unit 112, the selector D 116 outputs the internal condition output signal 160 (internal monitoring data) received from the internal signal control unit 111 to the information collection apparatus 200 via the IO-D 120.

(13) IO-A 117, IO-B 118, IO-C 119 and IO-D 120

The IO-A 117, IO-B 118, IO-C 119 and IO-D 120 are each provided with a plurality of pins. The number of pins provided in each IO is, for example, equal to the number of bits forming one piece of data (e.g., 128 bits). Each IO is connected to the information collection apparatus 200 and a device which is a connection-destination, by signal lines in a one-to-one correspondence with the pins.

The IO-A 117 receives data (data output from the memory card IF unit 109 or the internal condition output signal 160 (internal monitoring data)) from the selector A 113, and thereafter outputs the received data to the information collection apparatus 200 and the device A 140 which is the connection-destination, or to only the information collection apparatus 200. Upon receiving data from the device A 140, the IO-A 117 outputs the received data to the selector A 113.

The IO-B 118 receives data (data output from the IDE IF unit 108 or the internal condition output signal 160) from the selector B 114, and thereafter outputs the received data to the information collection apparatus 200 and the device B 141 which is the connection-destination, or to only the information collection apparatus 200. Upon receiving data from the device B 141, the IO-B 118 outputs the received data to the selector B 114.

The IO-C 119 receives data (data output from the video IF unit 107 or the internal condition output signal 160) from the selector C 115, and thereafter outputs the received data to the information collection apparatus 200 and the device C 142 which is the connection-destination, or to only the information collection apparatus 200. Upon receiving data from the device C 142, the IO-C 119 outputs the received data to the selector C 115.

The IO-D 120 receives data (data output from the external bus IF unit 106 or the internal condition output signal 160) from the selector D 116, and thereafter outputs the received data to the information collection apparatus 200 and the device D 143 which is the connection-destination, or to only the information collection apparatus 200. Upon receiving data from the device D 143, the IO-D 120 outputs the received data to the selector D 116.

(14) First Output Terminal 121

Upon receiving the output information signal 163 from the output control unit 112, the first output terminal 121 outputs the received output information signal 163 to the information collection apparatus 200.

Upon receiving the active data identification signal 180 from the output control unit 112, the first output terminal 121 outputs the received active data identification signal 180 to the information collection apparatus 200.

(15) Second Output Terminal 122

Upon receiving the disconnect instruction signals 175 to 178 from the output control unit 112, the second output terminal 122 outputs the received disconnect instruction signals 175 to 178 to the disconnecting circuits 130 to 133 respectively.

Specifically, the second output terminal 122 outputs the disconnect instruction signal 175 to the disconnecting circuit 130, outputs the disconnect instruction signal 176 to the disconnecting circuit 131, outputs the disconnect instruction signal 177 to the disconnecting circuit 132, and outputs the disconnect instruction signal 178 to the disconnecting circuit 133.

1.2 Disconnecting Circuits 130 to 133

Upon receiving the disconnect instruction signal 175 whose value is "1" from the semiconductor apparatus 101, the disconnecting circuit 130 breaks the connection between the corresponding device A 140 and the semiconductor apparatus 101. Upon receiving the disconnect instruction signal 175 whose value is "0" from the semiconductor apparatus 101, the disconnecting circuit 130 makes a connection between the corresponding device A 140 and the semiconductor apparatus 101.

Upon receiving the disconnect instruction signal 176 whose value is "1" from the semiconductor apparatus 101, the disconnecting circuit 131 breaks the connection between the corresponding device B 141 and the semiconductor apparatus 101. Upon receiving the disconnect instruction signal 176 whose value is "0" from the semiconductor apparatus 101, the disconnecting circuit 131 makes a connection between the corresponding device B 141 and the semiconductor apparatus 101.

Upon receiving the disconnect instruction signal 177 whose value is "1" from the semiconductor apparatus 101, the disconnecting circuit 132 breaks the connection between the corresponding device C 142 and the semiconductor apparatus 101. Upon receiving the disconnect instruction signal 177 whose value is "0" from the semiconductor apparatus 101, the disconnecting circuit 132 makes a connection between the corresponding device C 142 and the semiconductor apparatus 101.

Upon receiving the disconnect instruction signal 178 whose value is "1" from the semiconductor apparatus 101, the disconnecting circuit 133 breaks the connection between the corresponding device D 143 and the semiconductor apparatus 101. Upon receiving the disconnect instruction signal 178 whose value is "0" from the semiconductor apparatus 101, the disconnecting circuit 133 makes a connection between the corresponding device D 143 and the semiconductor apparatus 101.

1.3 Information Collection Apparatus 200

As shown in FIG. 1, the information collection apparatus 200 includes an information processing unit 201, and connection terminals 202 to 207.

(1) Connection Terminal 202

The connection terminal 202 receives the output information signal 163 and active data identification signal 180 output from the first output terminal 121 of the semiconductor apparatus 101, and outputs the received output information signal 163 and active data identification signal 180 to the information processing unit 201.

(2) Connection Terminals 203 to 206

The connection terminals 203 to 206 receive data (normal data or internal monitoring data) output from the IO-A 117, IO-B 118, IO-C 119 and IO-D 120 of the semiconductor apparatus 101 respectively, and output the received data to the information processing unit 201.

(3) Connection Terminal 207

The connection terminal 207 is connected to the information display apparatus 300 by a plurality of signal lines.

Upon receiving data from the information processing unit 201, the connection terminal 207 outputs the received data to the information display apparatus 300.

(4) Information Processing Unit 201

Figure 2:
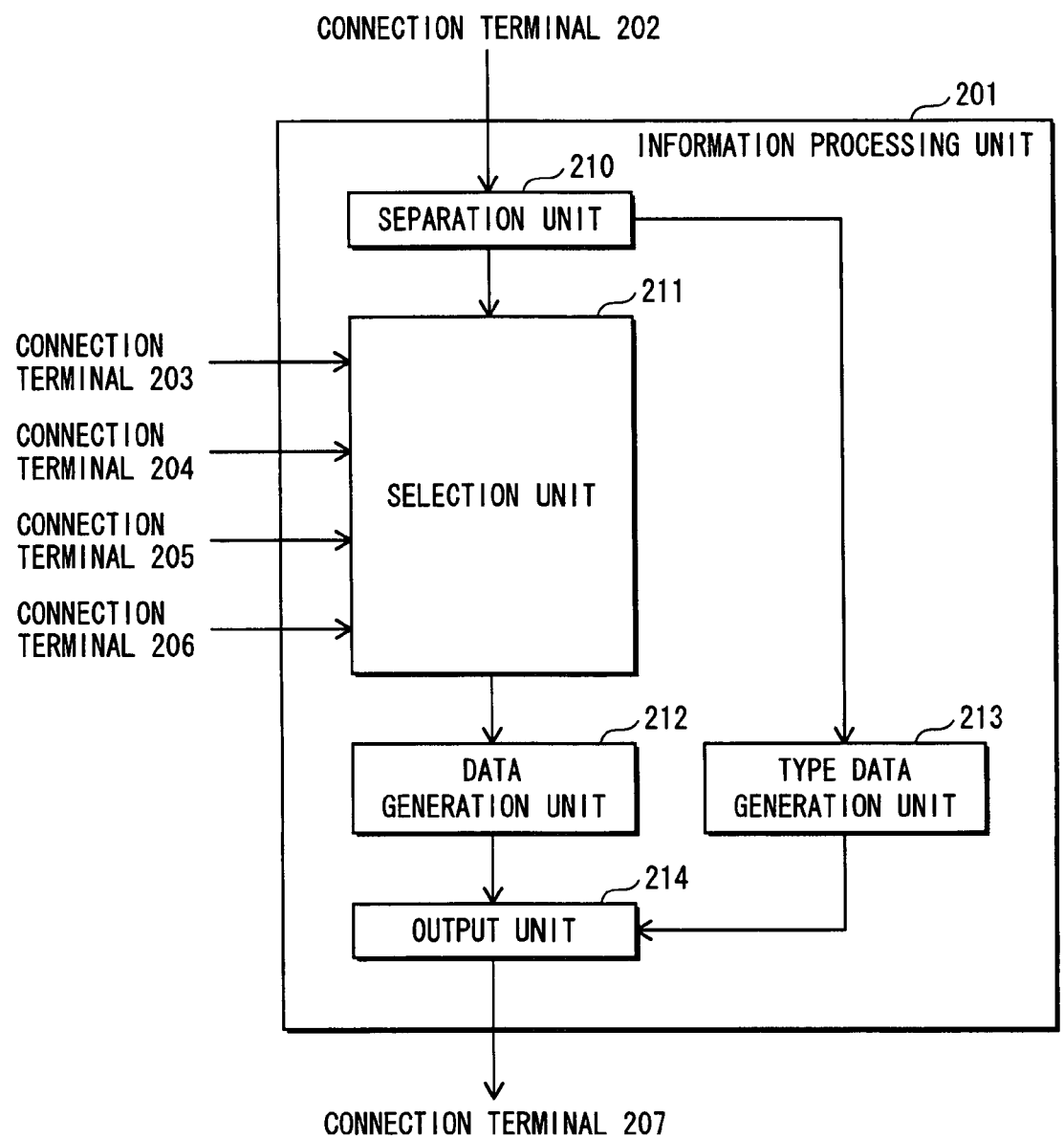
FIG. 2 shows a structure of an information processing unit 201.

As shown in FIG. 2, the information processing unit 201 includes a separation unit 210, a selection unit 211, a data generation unit 212, a type data generation unit 213, and an output unit 214.

(Separation Unit 210)

The separation unit 210 receives the output information signal 163 and the active data identification signal 180 from the semiconductor apparatus 101 via the connection terminal 202.

The separation unit 210 judges whether the received active data identification signal 180 indicates that the active internal condition output signal 160 (internal monitoring data) is being output, that is to say, judges whether the value of the active data identification signal 180 is "0".

In a case of judging that the active data identification signal 180 indicates that active internal monitoring data is being output, that is to say, a case of judging that the value is "0", the separation unit 210 separates the received output information signal 163 into the selected selector notification signal 162 and the internal condition notification signal 161. The separation unit 210 outputs the selected selector notification signal 162 to the selection unit 211, and outputs the internal condition notification signal 161 to the type data generation unit 213.

In a case of judging that the value is "1", the separation unit 210 does not perform operations pertaining to processing for outputting internal monitoring data to the information display apparatus 300.

(Selection Unit 211)

The selection unit 211 receives data output from the IO-A 117, IO-B 118, IO-C 119 and IO-D 120 of the semiconductor apparatus 101 via the connection terminals 203, 204, 205 and 206 respectively. Here, the connection terminals 203 to 206 are in one-to-one correspondence with the selectors A 113, B 114, C 115 and D 116 of the semiconductor apparatus 101.

The selection unit 211 receives the selected selector notification signal 162 from the separation unit 210.

According to the value of the received selected selector notification signal 162, the selection unit 211 determines which of the selectors A 113 to D 116 has output the internal condition output signal 160 (internal monitoring data).

The selection unit 211 selects, from among the four types of data received from the connection terminal 203 to 206, the data that has been received from the connection terminal corresponding to the determined selector, that is to say, selects the internal condition output signal 160 (internal monitoring data).

The selection unit 211 outputs the selected data (internal monitoring data) to the data generation unit 212.

(Data Generation Unit 212)

The data generation unit 212 receives internal monitoring data from the selection unit 211, successively concatenates the received internal monitoring data and outputs the resulting internal monitoring data to the output unit 214.

(Type Data Generation Unit 213)

The type data generation unit 213 receives the internal condition notification signal 161 from the separation unit 210.

According to the value of the received internal condition notification signal 161, the type data generation unit 213 determines a type of the internal monitoring data currently being output from the semiconductor device 101, generates type data indicating the determined type, and outputs the generated type data to the output unit 214.

(Output Unit 214)

The output unit 214 successively receives internal monitoring data from the data generation unit 212, and outputs the received internal monitoring data to the information display apparatus 300 via the connection terminal 207.

The output unit 214 receives the type data from the type data generation unit 213, and outputs the received type data to the information display apparatus 300 via the connection terminal 207.

1.4 Information Display Apparatus 300

The information display apparatus 300 receives the internal monitoring data and type data from the information collection apparatus 200, and displays information based on the received data.

1.5 Operations of the Semiconductor Operation Monitor System 1

(1) Overview of Operations

Figure 3:
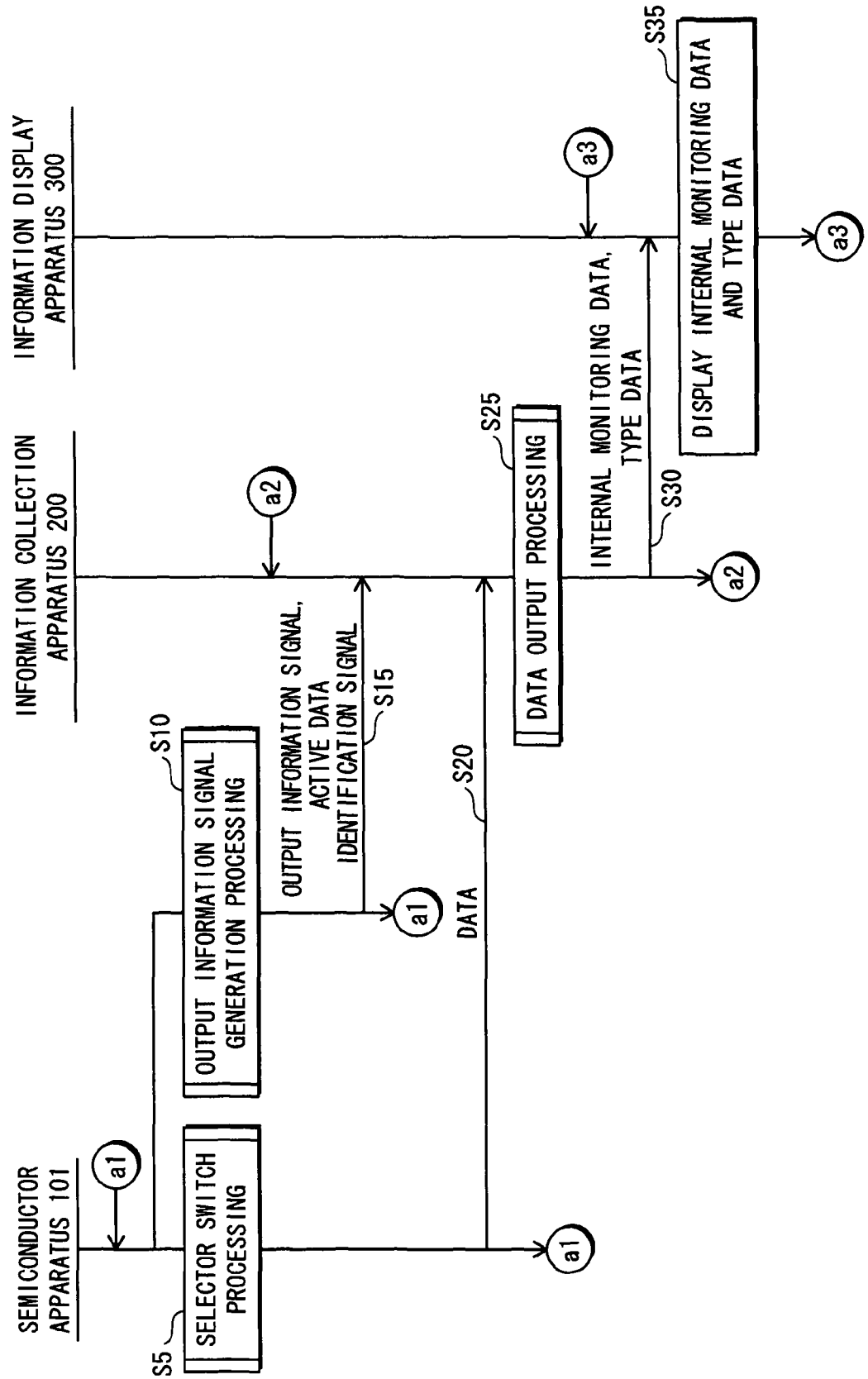
FIG. 3 is a flowchart showing an outline of operations performed by the semiconductor operation monitor system 1.

The following is an overview of operations performed in the semiconductor operation monitor system 1 with reference to the flowchart shown in FIG. 3.

While the debugging program is being executed, the semiconductor apparatus 101 performs selector switch processing for determining sources for the selectors and output information signal generation processing (step S5 and S10).

The semiconductor apparatus 101 outputs the output information signal 163 and active data identification signal 180 generated in the output information signal generation processing to the information collection apparatus 200 (step S15). The semiconductor apparatus 101 outputs, to the information collection apparatus 200, data received from the sources determined in the selector switch processing (step S20).

The information collection apparatus 200 executes data output processing with use of the output information signal 163, active data identification signal 180 and data received from the semiconductor apparatus 101 (step S25).

The information collection apparatus 200 outputs the internal monitoring data and type data generated in the data output processing to the information display apparatus 300 (step S30).

The information display apparatus 300 displays the internal monitoring data and type data received from the information collection apparatus 200 (step S35).

Note that the selector switch processing of step S5 and the output information signal generation processing of step S10 are performed in parallel.

(2) Selector Switch Processing

Figure 4:
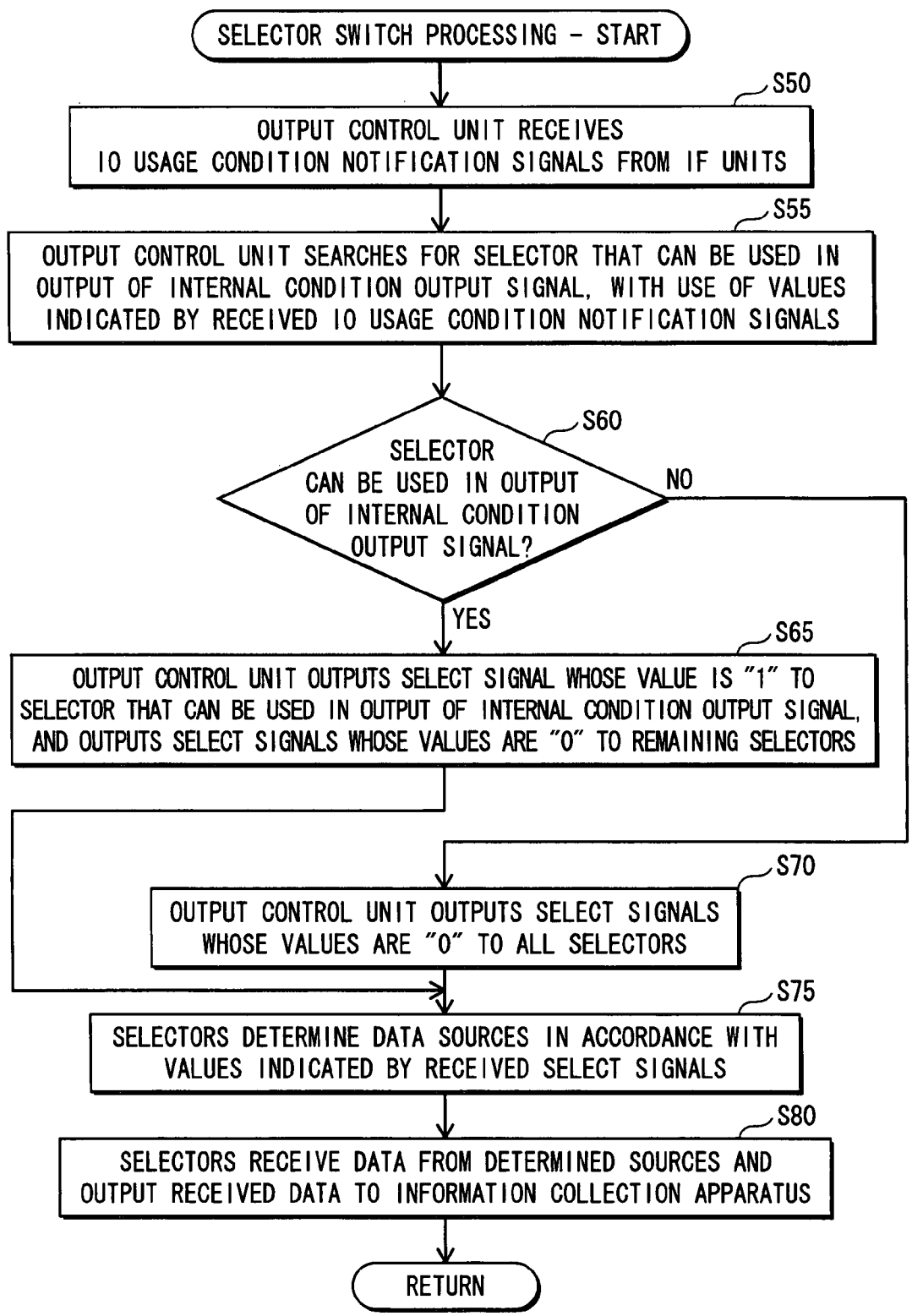
FIG. 4 is a flowchart showing selector switch processing in a semiconductor apparatus 101.

The following describes the selector switch processing performed in step S5 of FIG. 3, with reference to the flowchart shown in FIG. 4.

The output control unit 112 receives the IO usage condition notification signals 150, 151, 152 and 153 from the external bus IF unit 106, the video IF unit 107, the IDE IF unit 108 and the memory card IF unit 109 respectively (step S50).

The output control unit 112 searches, with use of the received IO usage condition notification signals 150 to 153, for a selector that is not being used in the input/output of data, that is to say, a selector that can be used in the output of an internal condition output signal (step S55).

The output control unit 112 judges, in accordance with a result of the search, whether any of the selectors can be used in the output of an internal condition output signal (step S60).

In a case of judging that one or more of the selectors can be used in the output of an internal condition output signal (step S60: YES), the output control unit 112 selects one of the selectors that can be used in the output of an internal condition output signal, generates a select signal whose value is "1", outputs this generated select signal to the selected selector, generates select signals whose values are "0", and outputs these generated select signals to the remaining selectors (step S65). The selectors A 113, B 114, C 115 and D 116 each receive a select signal from the output control unit 112, and determine a data source according to the received select signal (step S75). The selectors each receive data from the respectively determined source, and output the received data to the information collection apparatus 200 (step S80).

In a case of judging that none of the selectors can be used in the output of an internal condition output signal (step S60: NO), the output control unit 112 generates select signals whose values are "0", and outputs the generated select signal to the selectors (step S70). Thereafter, the selectors perform the above-described steps S75 and S80.

(3) Output Information Signal Generation Processing

Figure 5:
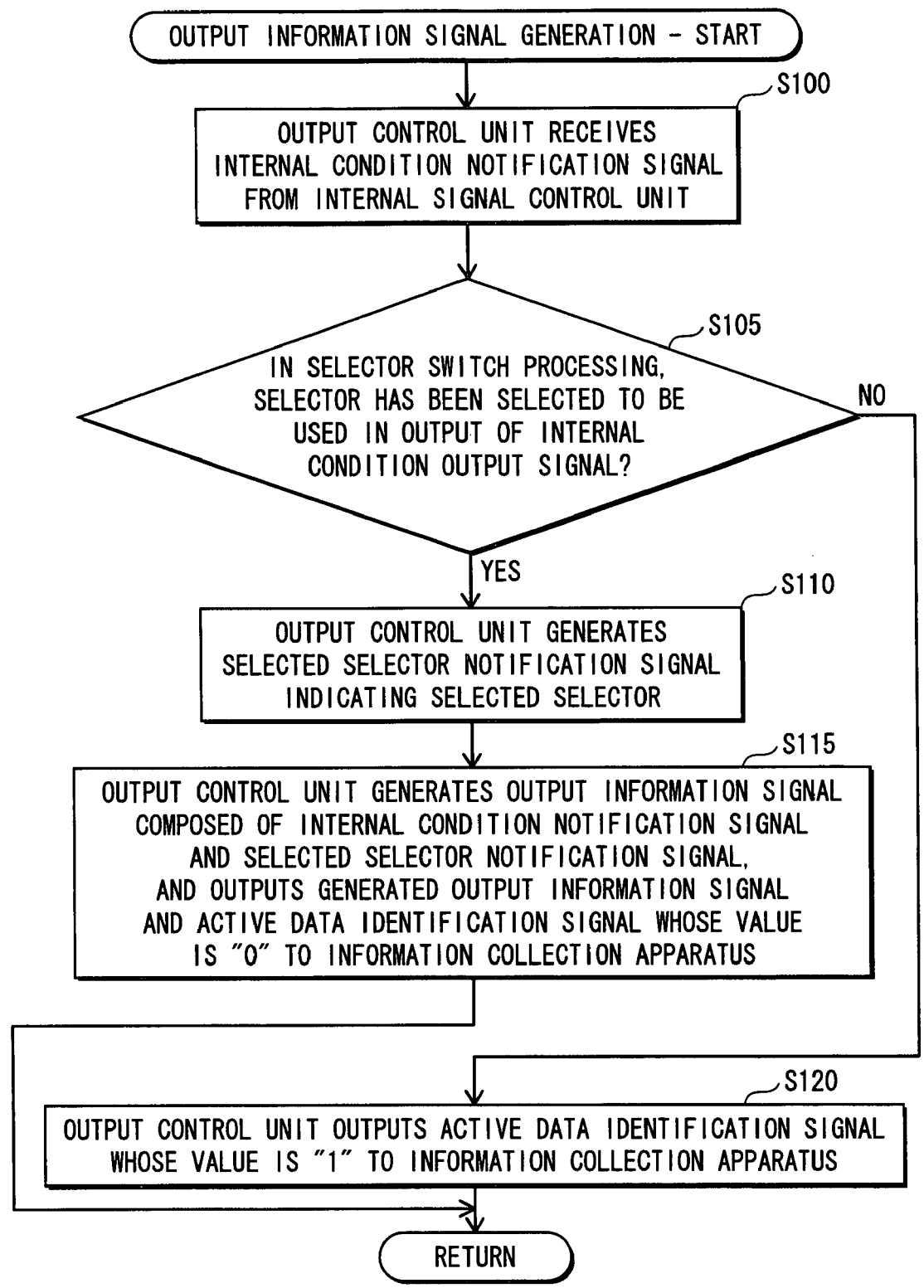
FIG. 5 is a flowchart showing output information signal generation processing in the semiconductor apparatus 101.

The following describes output information signal generation processing performed in step S10 of FIG. 3, with reference to the flowchart shown in FIG. 5.

The output control unit 112 receives the internal condition notification signal 161 from the internal signal control unit 111.

The output control unit 112 judges whether a selector that can be used in the output of an internal condition output signal in the selector switch processing has been selected (step S105).

In a case of judging that a selector has been selected (step S105: YES), the output control unit 112 generates a selected selector notification signal 162 that indicates the selected selector (step S110), and outputs, to the information collection apparatus 200, an active data identification signal 180 whose value is "0" and an output information signal 163 composed of the internal condition notification signal 161 and the selected selector notification signal 162 (step S115).

In a case of judging that a selector has not been selected (step S105: NO), the output control unit 112 outputs an active data identification signal 180 whose is "1" to the information collection apparatus 200 (step S120).

(4) Data Output Processing

Figure 6:
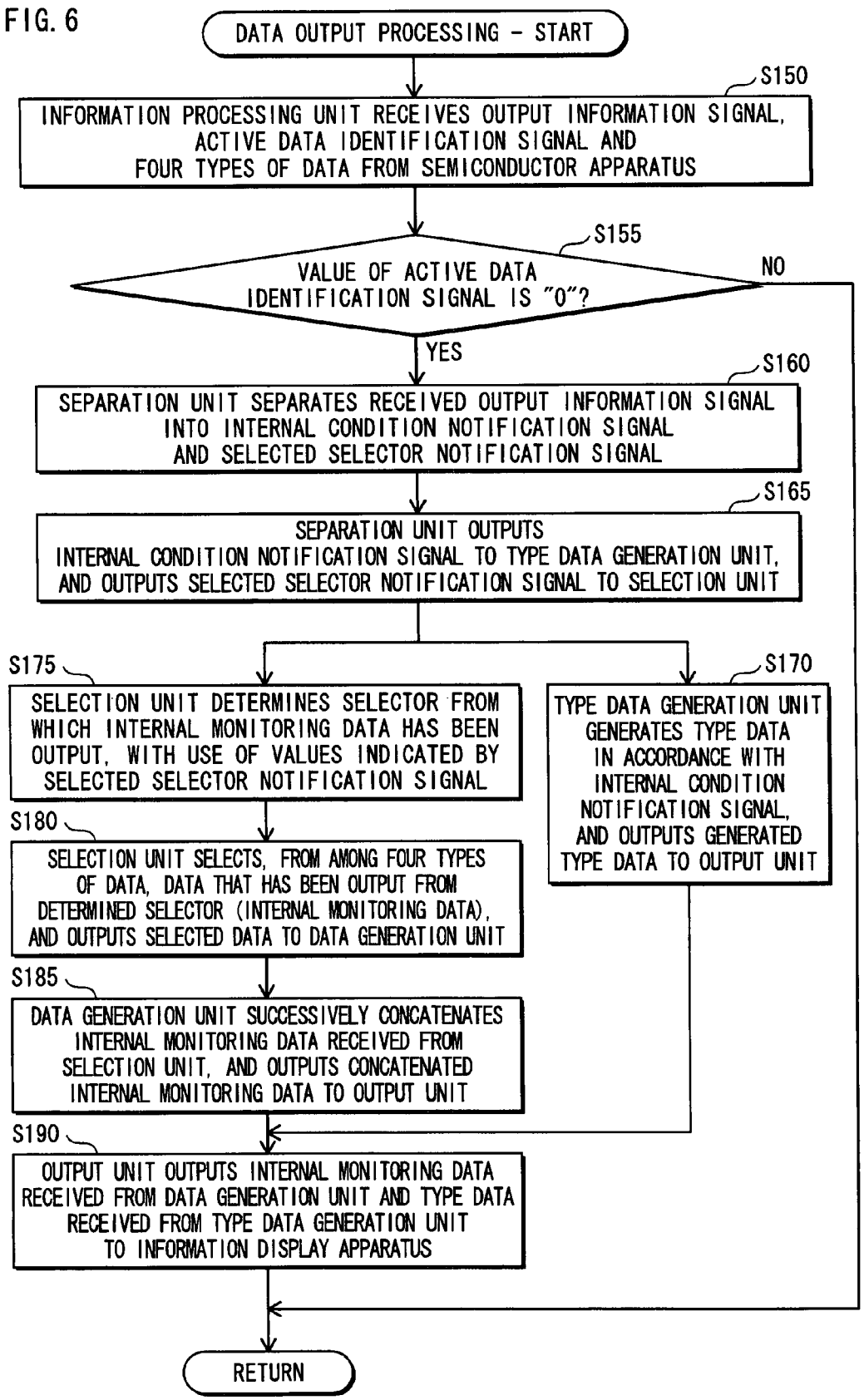
FIG. 6 is a flowchart showing data output processing in an information collection apparatus 200.

The following describes the data output processing performed in step S25 of FIG. 3, with reference to the flowchart of FIG. 6.

The information processing unit 201 receives the output information signal 163, the active data identification signal 180, and the four types of data from the semiconductor apparatus 101 (step S150).

The separation unit 210 of the information processing unit 201 judges whether the received active data identification signal 180 indicates that the active internal condition output signal 160 (internal monitoring data) is being output, that is to say, judges whether the value of the active data identification signal 180 is "0" (step S155).

In a case of the value not being "0", that is to say, in a case of the value being "1" (step S155: NO), the information collection apparatus 200 does not perform operations pertaining to processing for outputting internal monitoring data to the information display apparatus 300.

In a case of the active data identification signal 180 indicating that active internal monitoring data is being output, that is to say, in a case of the value being "0" (step S155: YES), the separation unit 210 separates the received output information signal 163 into the selected selector notification signal 162 and the internal condition notification signal 161 (step S160). The separation unit 210 outputs the selected selector notification signal 162 to the selection unit 211, and outputs the internal condition notification signal 161 to the type data generation unit 213 (step S165).

The type data generation unit 213 receives the internal condition notification signal 161 from the separation unit 210, determines, according to the value indicated thereby, the type of the internal monitoring data that is currently being output from the semiconductor apparatus 101, generates type data that indicates the determined type, and outputs the generated type data to the output unit 214 (step S170).

The selection unit 211 receives the selected selector notification signal 162 from the separation unit 210, and determines, according to the value indicated thereby, which one the selectors A 113, B 114, C 115 and D 116 output the internal condition output signal 160 (internal monitoring data) (step S175).

The selection unit 211 selects, from among the four types of received data, the data received from the connection terminal corresponding to the determined selector, that is to say, selects the internal condition output signal 160 (internal monitoring data), and outputs the selected data (internal monitoring data) to the data generation unit 212 (step S180).

The data generation unit 212 receives the internal monitoring data from the selection unit 211, successively concatenates the received internal monitoring data and outputs the resulting internal monitoring data to the output unit 214 (step S185).

The output unit 214 successively receives the internal monitoring data from the data generation unit 212 and the type data from the type data generation unit 213, and outputs the received data to the information display apparatus 300 (step S190).

Note that the processing of step S170 and the series of processing from step S175 to S185 are performed in parallel.

1.6 Concrete Example

Figure 7:
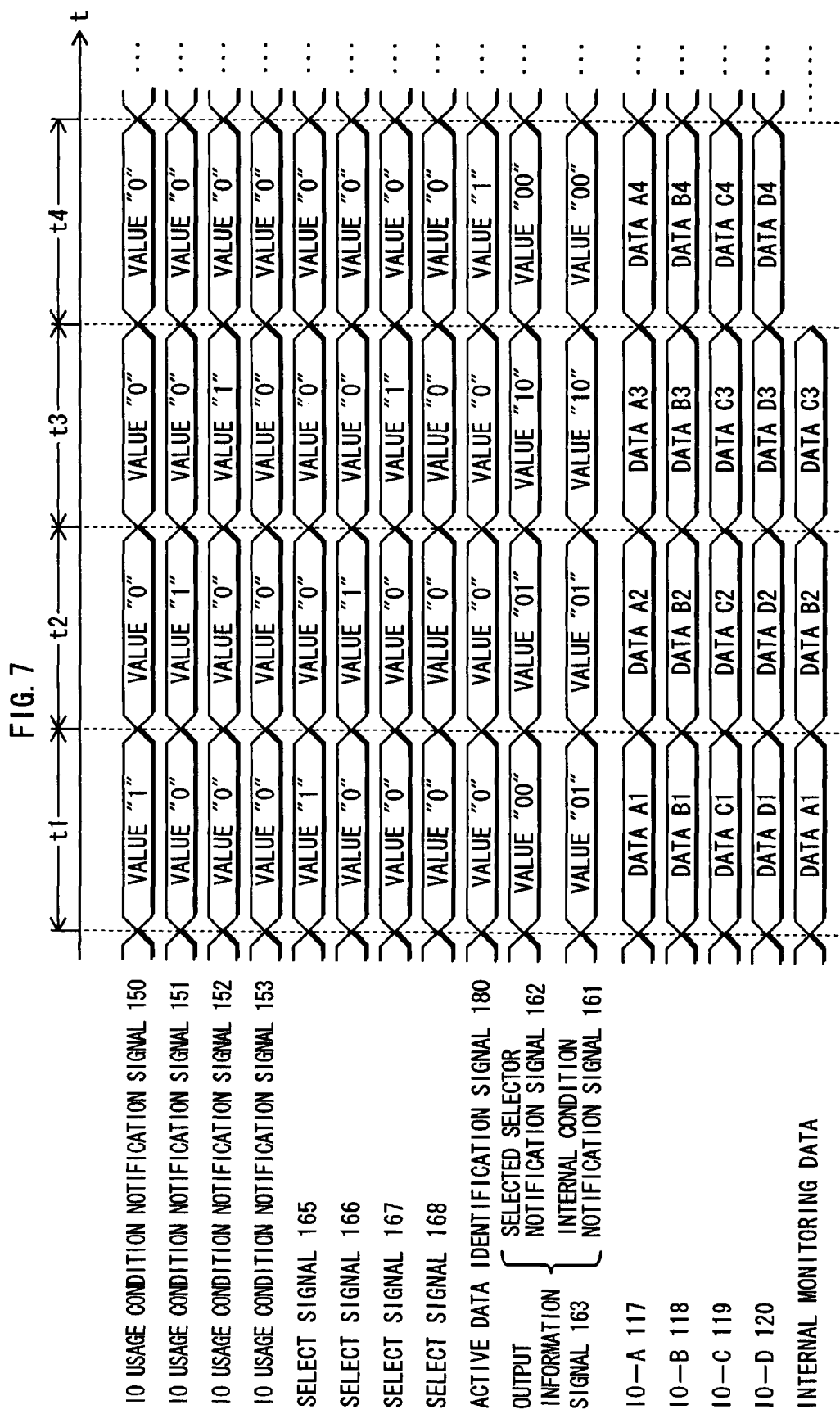
FIG. 7 is a timing chart showing a concrete example of operations performed by the semiconductor operation monitor system 1.

The following describes a concrete example of operations performed by the semiconductor operation monitor system 1, with reference to the timing chart shown in FIG. 7.

(Period t1)

In period t1, the output control unit 112 searches for a selector that can be used in the output of the internal condition output signal 160, based on the values ("1", "0", "0" and "0") indicated by the IO usage condition notification signals 150 to 153.

In accordance with a result of the search, the output control unit 112 outputs the select signal 165 whose value is "1" to the selector A 113, and outputs the select signals 166, 167 and 168 whose values are "0" to the selectors B 114, C 115 and D 116 respectively.

Also, the output control unit 112 outputs, to the information collection apparatus 200, the active data identification signal 180 whose value is "0", and the output information signal 163 composed of the selected selector notification signal 162 whose value is "00" and the internal condition notification signal 161 whose value is "01".

The IO-A 117, IO-B 118, IO-C 119 and IO-D 120 output data A1, data B1, data C1 and data D1 respectively to the information collection apparatus 200.

The information collection apparatus 200 selects the data A1 as the internal condition output signal 160 (internal monitoring data) in accordance with the values indicated by the active data identification signal 180 and selected selector notification signal 162 received from the semiconductor apparatus 101, and outputs the selected data A1 to the information display apparatus 300.

In accordance with the value indicated by the internal condition notification signal 161 received from the semiconductor apparatus 101, the information collection apparatus 200 generates type data (e.g., output data (AV)) indicating that the internal monitoring data being output is data being transferred between the AV processing unit 104 and the memory IF unit 110, and outputs the generated type data to the information display apparatus 300.

The information display apparatus 300 displays the type data (output data (AV)) and the internal monitoring data (data A1).

(Period t2)

In period t2, the output control unit 112 searches for a selector that can be used in the output of the internal condition output signal 160, based on the values ("0", "1", "0" and "0") indicated by the IO usage condition notification signals 150 to 153.

In accordance with a result of the search, the output control unit 112 outputs the select signal 166 whose value is "1" to the selector B 114, and outputs the select signals 165, 167 and 168 whose values are "0" to the selectors A 113, C 115 and D 116 respectively.

Also, the output control unit 112 outputs, to the information collection apparatus 200, the active data identification signal 180 whose value is "0" and the output information signal 163 composed of the selected selector notification signal 162 whose value is "01" and the internal condition notification signal 161 whose value is "01".

The IO-A 117, IO-B 118, IO-C 119 and IO-D 120 output data A2, data B2, data C2 and data D2 respectively to the information collection apparatus 200.

The information collection apparatus 200 performs the same processing as described above in accordance with the values indicated by the signals output from the semiconductor apparatus 101, and the information display apparatus 300 displays the type data (output data (AV)) and the internal monitoring data (data B2).

(Period t3)

In period t3, the output control unit 112 searches for a selector that can be used in the output of the internal condition output signal 160, based on the values ("0", "0", "1" and "0") indicated by the IO usage condition notification signals 150 to 153.

In accordance with a result of the search, the output control unit 112 outputs the select signal 167 whose value is "1" to the selector C 115, and outputs the select signals 165, 166 and 168 whose values are "0" to the selectors A 113, B 114 and D 116 respectively.

Also, the output control unit 112 outputs, to the information collection apparatus 200, the active data identification signal 180 whose value is "0", and the output information signal 163 composed of the selected selector notification signal 162 whose value is "10" and the internal condition notification signal 161 whose value is "10".

The IO-A 117, IO-B 118, IO-C 119 and IO-D 120 output data A3, data B3, data C3 and data D3 respectively to the information collection apparatus 200.

The information collection apparatus 200 performs the same processing as described above in accordance with the values indicated by the signals output from the semiconductor apparatus 101, and the information display apparatus 300 displays the type data (e.g., output data (external bus)) and the internal monitoring data (data C3).

(Period t4)

In period t4, the output control unit 112 searches for a selector that can be used in the output of the internal condition output signal 160, based on the values ("0", "0", "0" and "0") indicated by the IO usage condition notification signals 150 to 153.

In accordance with a result of the search, the output control unit 112 outputs the select signals 165, 166, 167 and 168 whose values are "0" to the selectors A 113, B 114, C 115 and D 116 respectively.

Also, the output control unit 112 outputs, to the information collection apparatus 200, the active data identification signal 180 whose value is "1", and the output information signal 163 composed of the selected selector notification signal 162 whose value is "00" and the internal condition notification signal 161 whose value is "00".

The IO-A 117, IO-B 118, IO-C 119 and IO-D 120 output data A4, data B4, data C4 and data D4 respectively to the information collection apparatus 200.

The information collection apparatus 200 does not perform processing pertaining to data output, in accordance with the value indicated by the active data identification signal 180 output from the semiconductor apparatus 101. In other words, the information collection apparatus 200 ignores the received data A4, B4, C4 and D4.

Here, the semiconductor apparatus 101 outputs, to the information collection apparatus 200, the active data identification signal 180 whose value is "1" as well as the output information signal 180 composed of the selected selector notification signal 162 whose value is "00" and the internal condition notification signal 161 whose value is "00". However, it should be noted that if the value indicated by the active data identification signal 180 is "1", the semiconductor apparatus 101 need not output the output information signal 163. Alternatively, in a case of outputting the output information signal 163, any value may be indicated by the selected selector notification signal 162 and internal condition notification signal 161.

1.7 Conclusion

In the semiconductor operation monitor system 1 having the above-described structure, the internal signal control unit 111 operating in a normal operating condition collects data being transferred between the stream processing unit 105 and the memory IF unit 110, the AV processing unit 104 and the memory IF unit 110, the external bus IF unit 106 and the memory IF unit 110, and the CPU 103 and the memory IF unit 110 as internal condition signals. The internal signal control unit 111 then outputs, in accordance with settings, a portion or all of the collected data to the selectors A 113, B 114, C115 and D116 as internal condition output signals. The internal signal control unit 111 continuously judges whether the memory card IF unit 109 is in a condition of needing to use the IO-A 117 corresponding thereto, or a condition of not needing to use the IO-A 117, and notifies a result of the judgment to the output control unit 112 as an IO usage condition notification signal. In the same way, the IDE IF unit 108, video IF unit 107 and external bus IF unit 106 also perform judgments with respect to the IO-B 118, IO-C 119 and IO-D 120 respectively, and output results of the judgments to the output control unit 112. This enables the output control unit 112 to have information regarding the usage conditions of the IO-A 117, IO-B 118, IO-C 119 and IO-D 120 while the semiconductor apparatus 101 is operating in the normal operating condition.

According to the above structure, instead of using a fixed terminal, the semiconductor apparatus 101 switches between terminals not being used for normal operation and uses the terminal currently switched to for outputting internal monitoring data, thereby enabling an increase in the amount of internal monitoring data that can be output.

1.8 Variations

Although described based on the above embodiment 1, the present invention is of course not limited to embodiment 1. The following variations are also included in the present invention.

(1) Although the active data identification signal 180 and selected selector notification signal 162 are separate signals in embodiment 1, the present invention is not limited to this.

A value indicating that active internal monitoring data is not currently being output from anywhere in the semiconductor apparatus may be included in the selected selector notification signal 162.

For example, the selected selector notification signal 162 may be a 3-bit signal, where values "000", "001", "010" and "011" indicate the same thing as the above-described values "00", "01", "10" and "11" respectively, and a value "111" indicates that active internal monitoring data is not currently being output from anywhere in the semiconductor apparatus 101.

This enables the information collection apparatus 200 to judge, according to the value indicated by the selected selector notification signal 162, whether active internal monitoring data is currently being output from the semiconductor apparatus 101.

Embodiment 2

Figure 8:
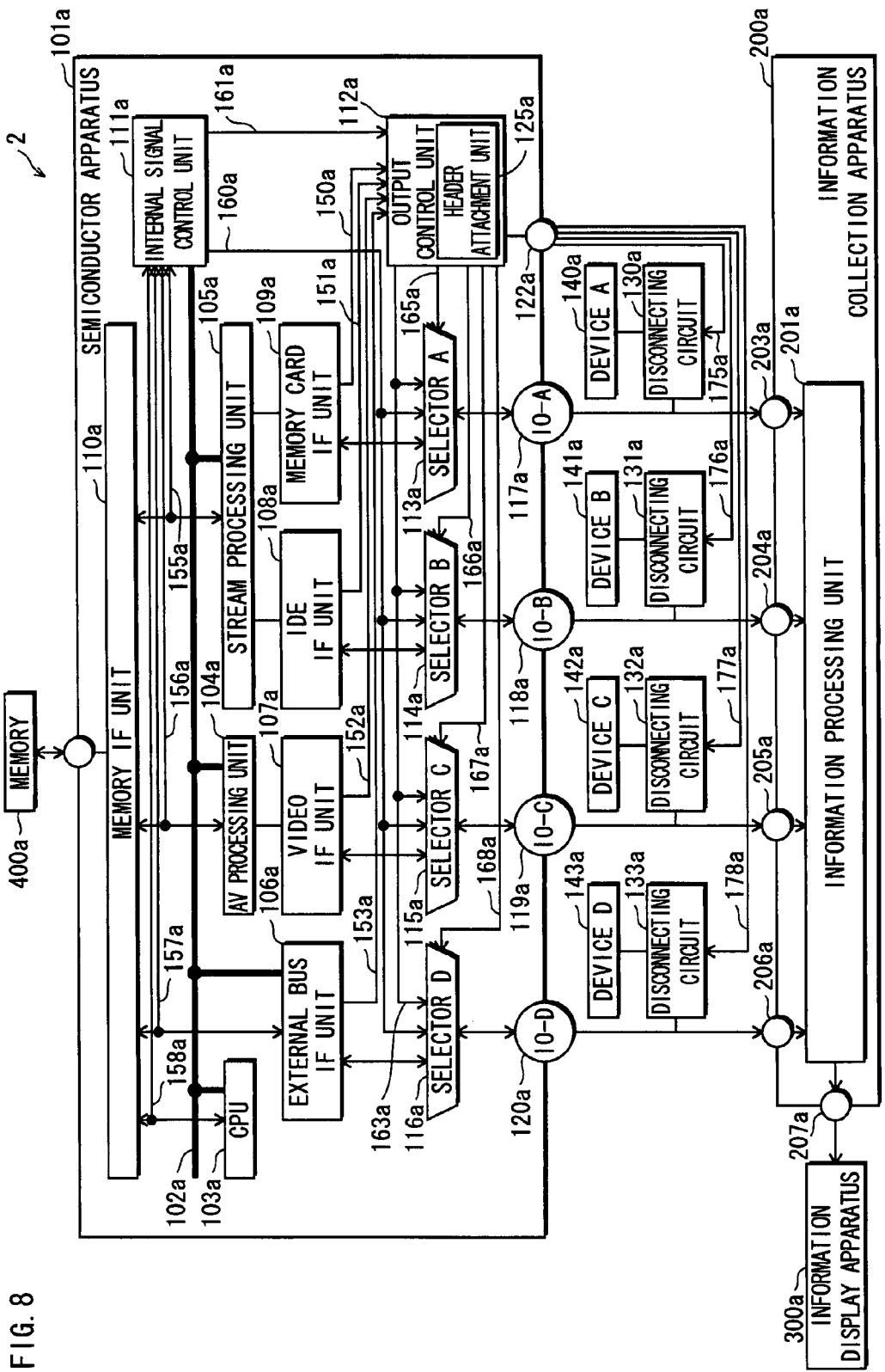
FIG. 8 shows a structure of a semiconductor operation monitor system 2.

FIG. 8 is a block diagram showing a structure of a semiconductor operation monitor system 2 in embodiment 2 of the present invention.

As shown in FIG. 8, the semiconductor operation monitor system 2 includes a semiconductor apparatus 101a, an information collection apparatus 200a, an information display apparatus 300a, a memory 400a such as an SDRAM, disconnecting circuits 130a, 131a, 132a and 133a, and devices A 140a, B 141a, C 142a and D 143a.

The semiconductor operation monitor system 2 differs from the semiconductor operation monitor system 1 of embodiment 1 in that the semiconductor apparatus 101a outputs output information signals to the information collection apparatus without the use of a dedicated terminal (the first output terminal in embodiment 1).

The following describes the semiconductor operation monitor system 2 with focus on differences from the semiconductor operation monitor system 1.

Descriptions of the information display apparatus 300a, disconnecting circuits 130a to 133a, and devices A 140a, B 141a, C 142a and D 143a have been omitted since they are similar to the information display apparatus 300, disconnecting circuits 130 to 133, and devices A 140, B 141, C142 and D 143 described in embodiment 1.

Note that in the present embodiment, the disconnecting circuits 130a, 131a, 132a and 133a respectively receive disconnect instruction signals 175a, 176a, 177a and 178a from the semiconductor apparatus 101a. Descriptions of the disconnect instruction signals 175a to 178a have been omitted since they are similar to the disconnect instruction signals 175 to 178 described in embodiment 1.

2.1 Semiconductor Apparatus 101a

The semiconductor apparatus 101a is, for example, a system LSI. As shown in FIG. 8, the semiconductor apparatus 101a includes an internal bus 102a, a CPU 103a, an AV processing unit 104a, a stream processing unit 105a, an external bus IF unit 106a, a video IF unit 107a, an IDE IF unit 108a, a memory card IF unit 109a, a memory IF unit 110a, an internal signal control unit 111a, an output control unit 112a, selectors A 113a, B 114a, C 115a and D 116a, an IO-A 117a, an IO-B 118a, an IO-C 119a, an IO-D 120a, and an output terminal 122a.

Descriptions of the internal bus 102a, CPU 103a, AV processing unit 104a, stream processing unit 105a, external bus IF unit 106a, video IF unit 107a, IDE IF unit 108a, memory card IF unit 109a, memory IF unit 110a, and internal signal control unit 111a have been omitted since they have the same functions as the internal bus 102, CPU 103, AV processing unit 104, stream processing unit 105, external bus IF unit 106, video IF unit 107, IDE IF unit 108, memory card IF unit 109, memory IF unit 110, and internal signal control unit 111 described in embodiment 1.

Also, descriptions of the IO-A 117a, IO-B 118a, IO-C 119a, and IO-D 120a have been omitted since they have the same functions as the IO-A 117, IO-B 118, IO-C 119, and IO-D 120 described in embodiment 1.

Also, a description of the output terminal 122a has been omitted since it has the same function as the second output terminal 122 described in embodiment 1.

Note that in the present embodiment, the external bus IF unit 106a, video IF unit 107a, IDE IF unit 108a and memory card IF unit 109a respectively output IO usage condition notification signals 153a, 152a, 151a and 150a to the output control unit 112a. Descriptions of the IO usage condition notification signals 150a to 153a output by the IF units have been omitted since they are the same as the IO usage condition notification signals described in embodiment 1.

Also, in the present embodiment, the internal signal control unit 111a receives data, which is being transferred between the memory IF unit 110a and the stream processing unit 105a, as an internal condition signal 155a. The internal signal control unit 111a also receives data, which is being transferred between the memory IF unit 110a and the AV processing unit 104a, as an internal condition signal 156a. The internal signal control unit 111a also receives data, which is being transferred between the memory IF unit 110a and the external bus IF unit 106a, as an internal condition signal 157a. The internal signal control unit 111a also receives data, which is being transferred between the memory IF unit 110a and the CPU 103a, as an internal condition signal 158a. The internal signal control unit 111a outputs the received data to the selectors as an internal condition output signal 160a.

Also, in the present embodiment, the internal signal control unit 111a outputs an internal condition notification signal 161a to the output control unit 112a, and a description of the internal condition notification signal 161a has been omitted since it is similar to the internal condition notification signal 161 described in embodiment 1.

Similarly to embodiment 1, the selectors have been provided in one-to-one correspondence with the IOs.

The following describes the semiconductor apparatus 101a with focus on points that differ from the semiconductor apparatus 101 of embodiment 1.

(1) Output Control Unit 112a

As shown in FIG. 8, the output control unit 112a includes a header attachment unit 125a for generating an output information signal 163a.

The output control unit 112a receives the IO usage condition notification signals 150a to 153a from the external bus IF unit 106a, the video IF unit 107a, the IDE IF-unit 108a, and the memory card IF unit 109a respectively.

The output control unit 112a receives the internal condition notification signal 161a from the internal signal control unit 111a.

The output control unit 112a searches for, according to the received IO usage condition notification signals 150a, 151a, 152a and 153a, any selectors that are not being used in the input/output of data.

According to a result of the search, the output control unit 112a generates select signals 165a, 166a, 167a and 168a for the selectors A 113a, B 114a, C 115a and D 116a respectively. Each select signal indicates an instruction for the corresponding selector to be used in the input/output of normal data, be used in the output of the internal condition output signal 160a, be used in the output of the output information signal 163a from the output control unit 112a, or be used in the output of both the internal condition output signal 160a and the output information signal 163a. The output control unit 112a outputs the generated select signals 165a, 166a, 167a and 168a to the corresponding selector.

Similarly to embodiment 1, the output control unit 112a can be said to generate a select signal for each IF unit connected to a selector. Alternatively, the output control unit 112a can be said to generate one or more select signals for each of the processing units (AV processing unit 104a, stream processing unit 105a and external bus IF unit 106a) connected to the IF units.

The following describes operations performed in accordance with the search result.

(If all of the Selectors are being Used in the Input/Output of Data)

In the case of judging that all of the selectors are being used in the input/output of data, the output control unit 112a outputs, to each of the selectors, a select signal indicating an instruction for the selectors to be used in the input/output of normal data.

(If any of the Selectors are not being Used in the Input/Output of Data)

In the case of judging that any of the selectors are not being used in the input/output of data, the output control unit 112a judges whether two or more of the selectors are not being used in the input/output of data.

In the case of judging that there are two or more such selectors, the output control unit 112a generates a select signal indicating an instruction for one of the such selectors to be used in the output of an internal condition output signal. The output control unit 112a also generates a select signal indicating an instruction for another of the such selectors to be used in the output of the output information signal 163a. The output control unit 112a generates select signals indicating an instruction for the remaining selectors to be used in the input/output of normal data.

In the case of judging that there are not two or more selectors not being used in the input/output of normal data, that is to say, in the case of only one such selector, the output control unit 112a generates a select signal indicating an instruction for the one selector to be used in the output of both the internal condition output signal 160a and the output information signal 163a, and generates select signals indicating an instruction for the remaining selectors to be used in the input/output or normal data.

Furthermore, the output control unit 112a judges whether a selected selector can be used in the output of internal monitoring data, and in the case of an affirmative judgment, generates the selected selector notification signal 162a that indicates the selected selector.

The header attachment unit 125a generates a signal including the internal condition notification signal 161a concatenated to the generated selected selector notification signal 162a. The header attachment unit 125a generates the output information signal 163a by attaching, to the generated signal, header information that identifies the signal as the output information signal 163a.

Similarly to embodiment 1, the output control unit 112a further outputs a disconnect instruction signal 175a, 176a, 177a and 178a to the disconnecting circuits 130a to 133a respectively. For example, if a selector and an IO are to be used in the output of the internal condition output signal 160a, the output information signal 163a, or both, the output control unit 112a outputs a disconnect instruction signal whose value is "1" to the disconnecting circuit corresponding thereto, such that data output from the selector does not arrive at the device connected to the IO corresponding to the selector. If a selector and an IO are to be used in the output of normal data, the output control unit 112a outputs a disconnect instruction signal whose value is "0" to the corresponding disconnecting circuit.

The output control unit 112a outputs the output information signal 163a generated by the header attachment unit 125a to each selector.

(Select Signal 165a)

The following describes an example of the select signal 165a.

The select signal 165a is a 2-bit signal, where a value "00" indicates an instruction to be used in the input/output of normal data, and a value "01" indicates an instruction to be used in the output of the internal condition output signal 160a. A value "10" indicates an instruction to be used in the output of the output information signal 163a, and a value "11" indicates an instruction to be used in the output of both the internal condition output signal 160a and the output information signal 163a.

Note that descriptions of the select signals 166a, 167a and 168a have been omitted since they are the same as the select signal 165a.

(Selected Selector Notification Signal 162a)

A description of the selected selector notification signal 162a has been omitted since it is the same as the selected selector notification signal 162 described in embodiment 1.

(2) Selectors A 113a, B 114a, C 115a and D 116a

The selector A 113a determines, according to the select signal 165a received from the output control unit 112, data to be output to the IO-A 117a. In other words, the selector A 113a determines a source from which to receive data, receives data from the determined source, and outputs the received data to the information collection apparatus 200a via the IO-A 117a.

Specifically, upon receiving the select signal 165a whose value is "00" from the output control unit 112a, the selector A 113a performs the input/output of data between the memory card IF unit 109a and the device A 140a via the IO-A 117a. In other words, the selector A 113a receives data from the memory card IF unit 109a, and outputs the received data to the IO-A 117a. Also, upon receiving data from the device A 140a via the IO-A 117a, the selector A 113a outputs the received data to the memory card IF unit 109a.

Upon receiving the select signal 165a whose value is "01" from the output control unit 112a, the selector A 113a outputs the internal condition output signal 160a (internal monitoring data) received from the internal signal control unit 111a to the information collection apparatus 200a via the IO-A 117a.

Upon receiving the select signal 165a whose value is "10" from the output control unit 112a, the selector A 113a outputs the output information signal 163a received from the output control unit 112a to the information collection apparatus 200a via the IO-A 117a.

Upon receiving the select signal 165a whose value is "11" from the output control unit 112a, the selector A 113a outputs both the internal condition output signal 160a (internal monitoring data) and the output information signal 163a to the information collection apparatus 200a via the IO-A 117a. Here, the selector A 113a allocates, to the output information signal 163a, the signal line connected to the information collection apparatus 200a with priority.

Also, the selectors B 114a, C 115a and D 116a perform similar operations to the selector A 113a.

Upon receiving the select signal 166a whose value is "00" from the output control unit 112a, the selector B 114a performs the input/output of data between the IDE IF unit 108a and the device B 141a via the IO-B 118a. Upon receiving the select signal 166a whose value is "01" from the output control unit 112a, the selector B 114a outputs the internal condition output signal 160a (internal monitoring data) received from the internal signal control unit 111a to the information collection apparatus 200a via the IO-B 118a. Upon receiving the select signal 166a whose value is "10" from the output control unit 112a, the selector B 114a outputs the output information signal 163a received from the output control unit 112a to the information collection apparatus 200a via the IO-B 118a. Upon receiving the select signal 166a whose value is "11" from the output control unit 112a, the selector B 114a outputs both the internal condition output signal 160a (internal monitoring data) and the output information signal 163a to the information collection apparatus 200a via the IO-B 118a. Here, the selector B 114a allocates, to the output information signal 163a, the signal line connected to the information collection apparatus 200a with priority.

Upon receiving the select signal 167a whose value is "00" from the output control unit 112a, the selector C 115a performs the input/output of data between the video IF unit 107a and the device C 142a via the IO-C 119a. Upon receiving the select signal 167a whose value is "01" from the output control unit 112a, the selector C 115a outputs the internal condition output signal 160a (internal monitoring data) received from the internal signal control unit 111a to the information collection apparatus 200a via the IO-C 119a. Upon receiving the select signal 167a whose value is "10" from the output control unit 112a, the selector C 115a outputs the output information signal 163a to the information collection apparatus 200a via the IO-C 119a. Upon receiving the select signal 167a whose value is "11" from the output control unit 112a, the selector C 115a outputs both the internal condition output signal 160a (internal monitoring data) and the output information signal 163a to the information collection apparatus 200a via the IO-C 119a. Here, the selector C 115a allocates, to the output information signal 163a, the signal line connected to the information collection apparatus 200a with priority.

Upon receiving the select signal 168a whose value is "00" from the output control unit 112a, the selector D 116a performs the input/output of data between the external bus IF unit 106a and the device D 143a via the IO-D 120a. Upon receiving the select signal 168a whose value is "01" from the output control unit 112a, the selector D 116a outputs the internal condition output signal 160a (internal monitoring data) received from the internal signal control unit 111a to the information collection apparatus 200a via the IO-D 120a. Upon receiving the select signal 167a whose value is "10" from the output control unit 112a, the selector D 116a outputs the output information signal 163a to the information collection apparatus 200a via the IO-D 120a. Upon receiving the select signal 168a whose value is "11" from the output control unit 112a, the selector D 116a outputs both the internal condition output signal 160a (internal monitoring data) and the output information signal 163a to the information collection apparatus 200a via the IO-D 120a. Here, the selector D 116a allocates, to the output information signal 163a, the signal line connected to the information collection apparatus 200a with priority.

2.2 Information Collection Apparatus 200a

The information collection apparatus 200a is, for example, a logic analyzer. As shown in FIG. 8, the information collection apparatus 200a includes an information processing unit 201a, and connection terminals 203a to 207a.

(1) Connection Terminals 203a to 206a

The connection terminals 203a to 206a receive data (normal data, the internal condition output signal 160a or the output information signal 163a) output from the IO-A 117a, IO-B 118a, IO-C 119a and IO-D 120a of the semiconductor apparatus 101a respectively, and output the received data to the information processing unit 201a.

(2) Connection Terminal 207a

The connection terminal 207a is connected to the information display apparatus 300a by a plurality of signal lines.

Upon receiving data from the information processing unit 201a, the connection terminal 207a outputs the received data to the information display apparatus 300a.

(3) Information Processing Unit 201a

Figure 9:
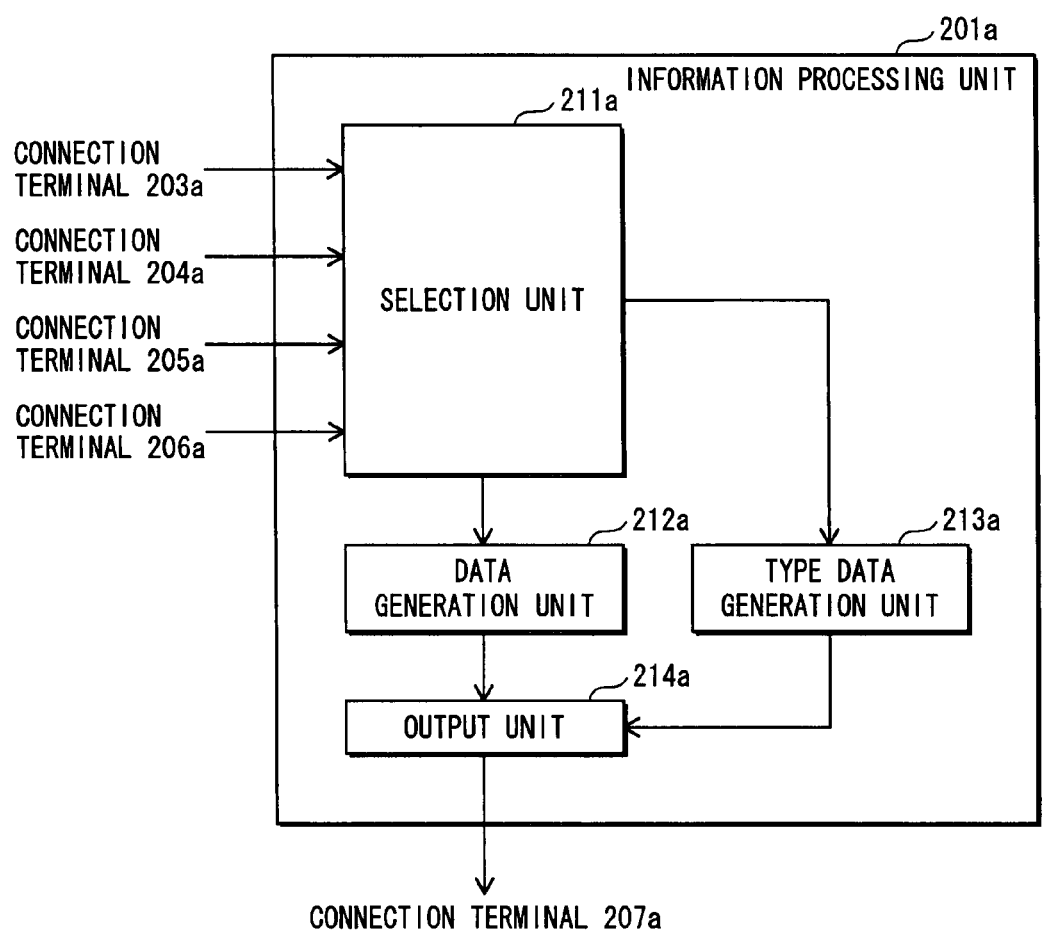

As shown in FIG. 9, the information processing unit 201a includes a selection unit 211a, a data generation unit 212a, a type data generation unit 213a, and an output unit 214a.

(Selection Unit 211a)

The selection unit 211a receives data output from the IO-A 117a, IO-B 118a, IO-C 119a and IO-D 120a of the semiconductor apparatus 101a via the connection terminals 203a, 204a, 205a and 206a respectively. Here, the connection terminals 203a to 206a are in one-to-one correspondence with the selectors A 113a, B 114a, C 115a and D 116a of the semiconductor apparatus 101a.

The selection unit 211a searches the received data for data that includes header information identifying the data as the output information signal 163a.

Upon judging that none of the data includes such header information, the selection unit 211a does not perform processing for outputting internal monitoring data to the information display apparatus 300a.

Upon judging that data including such header information exists, the selection unit 211a separates the received output information signal 163a into the header information, the selected selector notification signal 162a and the internal condition notification signal 161a, and outputs the internal condition notification signal 161a to the type data generation unit 213a.

According to the value of the selected selector notification signal 162a, the selection unit 211a determines which of the selectors A 113a to D 116a has output the internal condition output signal 160a (internal monitoring data).

The selection unit 211a selects, from among the four types of data received from the connection terminals 203a to 206a, data that has been received from the connection terminal corresponding to the determined selector, that is to say, selects the internal condition output signal 160a (internal monitoring data).

The selection unit 211a outputs the selected data (internal monitoring data) to the data generation unit 212a.

(Data Generation Unit 212a)

The data generation unit 212a receives internal monitoring data from the selection unit 211a, successively concatenates the received internal monitoring data and outputs the resulting internal monitoring data to the output unit 214a.

(Type Data Generation Unit 213a)

The type data generation unit 213a receives the internal condition notification signal 161a from the selection unit 211a.

A description of subsequent operations has been omitted since they are similar to the operations performed by the type data generation unit 213 described in embodiment 1.

(Output Unit 214a)

A description of the output unit 214a has been omitted since it is similar to the output unit 214a described in embodiment 1.

2.3 Operations of the Semiconductor Operation Monitor System 2

(1) Overview of Operations

Figure 10:
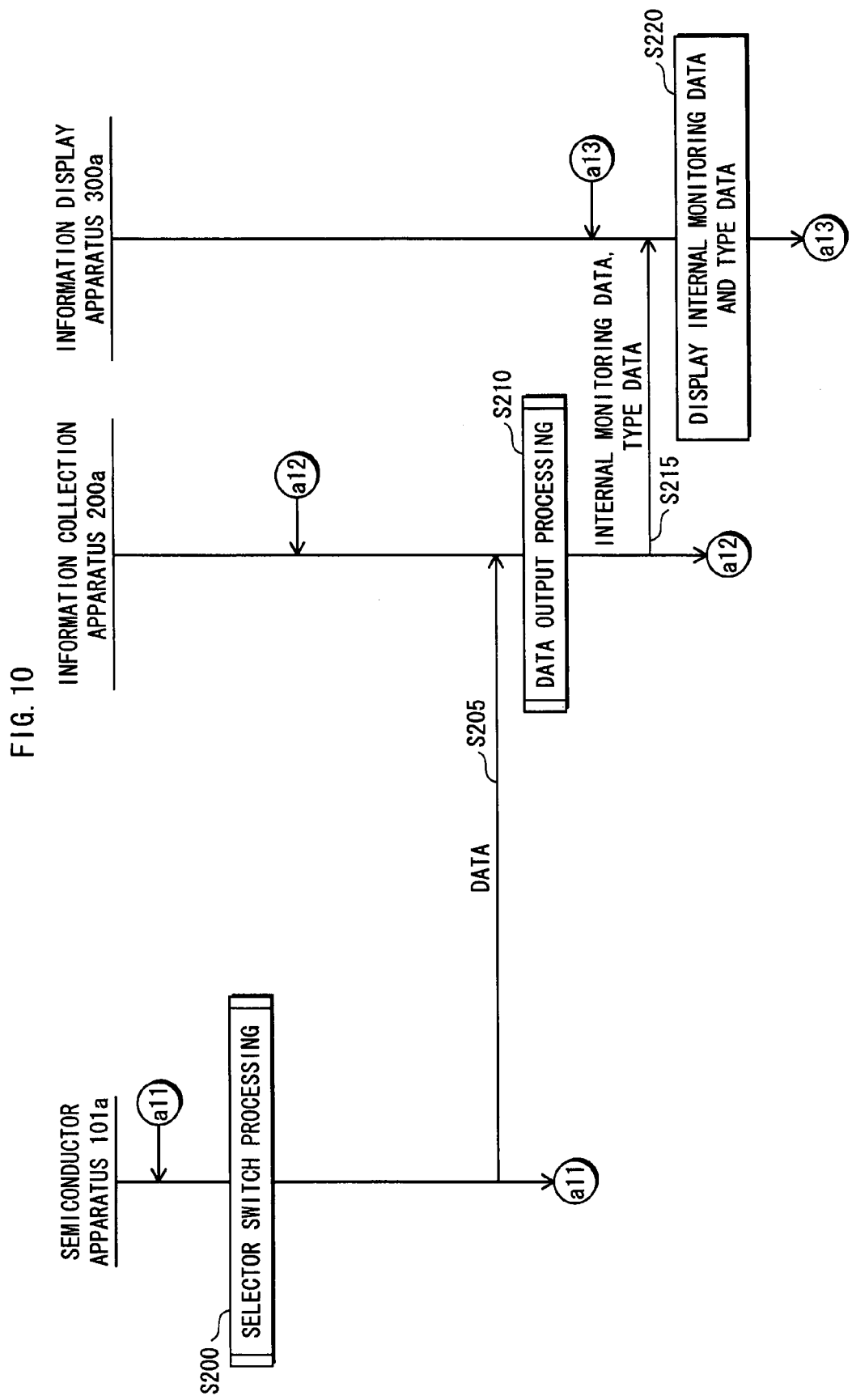
FIG. 10 is a flowchart showing an outline of operations performed by the semiconductor operation monitor system 2.

The following is an overview of operations performed in the semiconductor operation monitor system 2 with reference to the flowchart shown in FIG. 10.

While the debugging program is being executed, the semiconductor apparatus 101a performs selector switch processing for determining sources for the selectors (step S200).

The semiconductor apparatus 101a outputs, to the information collection apparatus 200a, data received from the sources determined in the selector switch processing (step S205).

The information collection apparatus 200a executes data output processing with use of the data received from the semiconductor apparatus 101a (step S210).

The information collection apparatus 200a outputs the internal monitoring data and type data generated in the data output processing to the information display apparatus 300a (step S215).

The information display apparatus 300a displays the internal monitoring data and type data received from the information collection apparatus 200a (step S220).

(2) Selector Switch Processing

Figure 11:
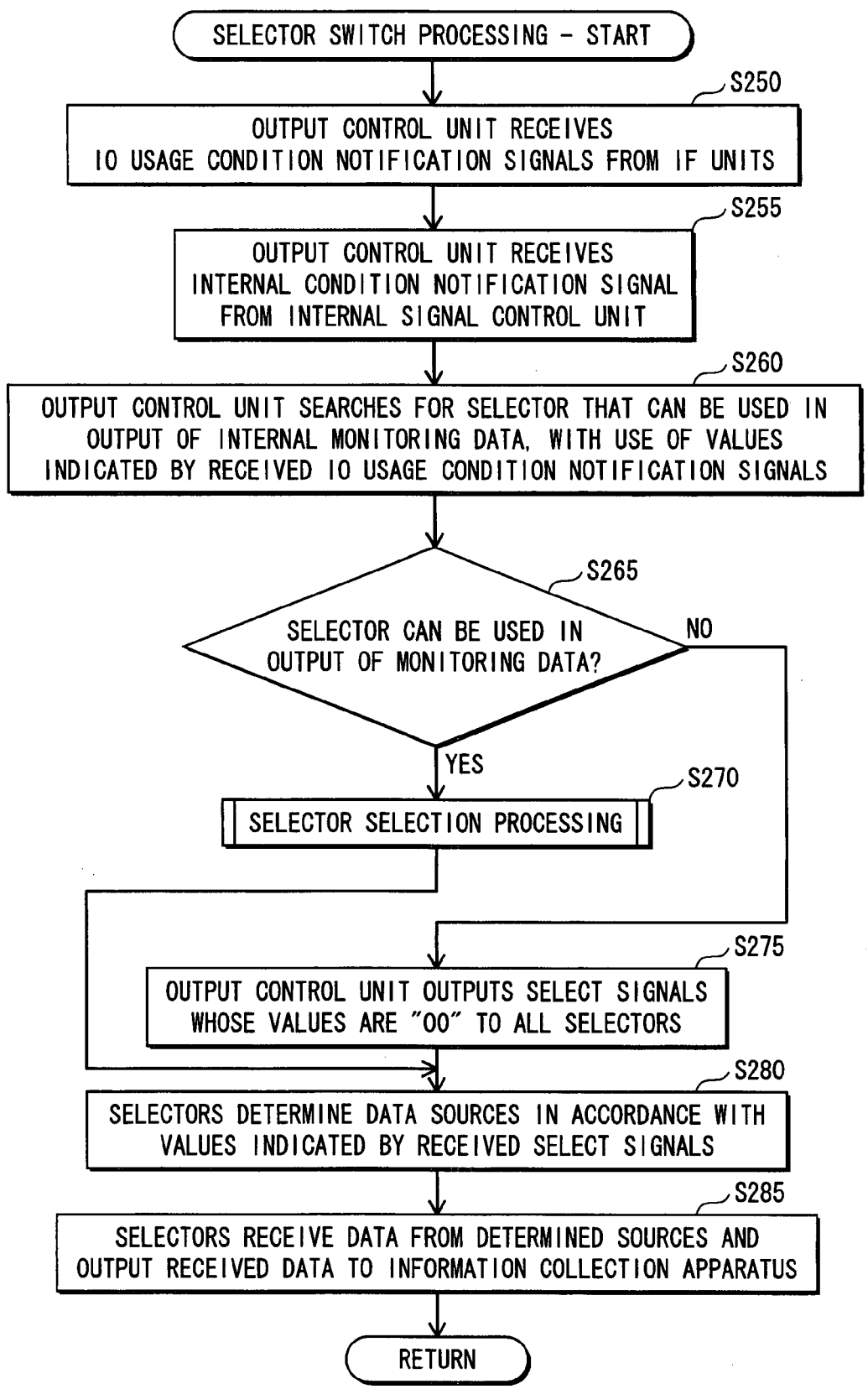

The following describes the selector switch processing performed in step S200 of FIG. 10, with reference to the flowchart shown in FIG. 11.

The output control unit 112a receives the IO usage condition notification signals 150a, 151a, 152a and 153a from the external bus IF unit 106a, the video IF unit 107a, the IDE IF unit 108a and the memory card IF unit 109a respectively (step S250).

The output control unit 112a receives the internal condition notification signal 161a from the internal signal control unit 111a (step S255).

The output control unit 112a searches, with use of the received IO usage condition notification signals 150a to 153a, for a selector that is not being used in the input/output of data, that is to say, a selector that can be used in the output of the internal condition output signal 160a (step S260).

The output control unit 112a judges, in accordance with a result of the search, whether any of the selectors can be used in the output of the internal condition output signal 160a (step S265).

In a case of judging that one or more of the selectors can be used in the output of the internal condition output signal 160a (step S265: YES), the output control unit 112a performs selector selection processing for selecting one of the selectors that can be used in the output of the internal condition output signal 160a (step S270). The selectors A 113a, B 114a, C 115a and D 116a each receive a select signal from the output control unit 112a, and determine a data source according to the received select signal (step S280). The selectors each receive data from the respectively determined source, and output the received data to the information collection apparatus 200a (step S285).

In a case of judging that none of the selectors can be used in the output of the internal condition output signal 160a (step S265: NO), the output control unit 112a generates a select signal whose value is "00", and outputs the generated select signal to each of the selectors (step S275). Thereafter, the selectors perform the above-described steps S280 and S285.

(3) Selector Selection Processing

Figure 12:
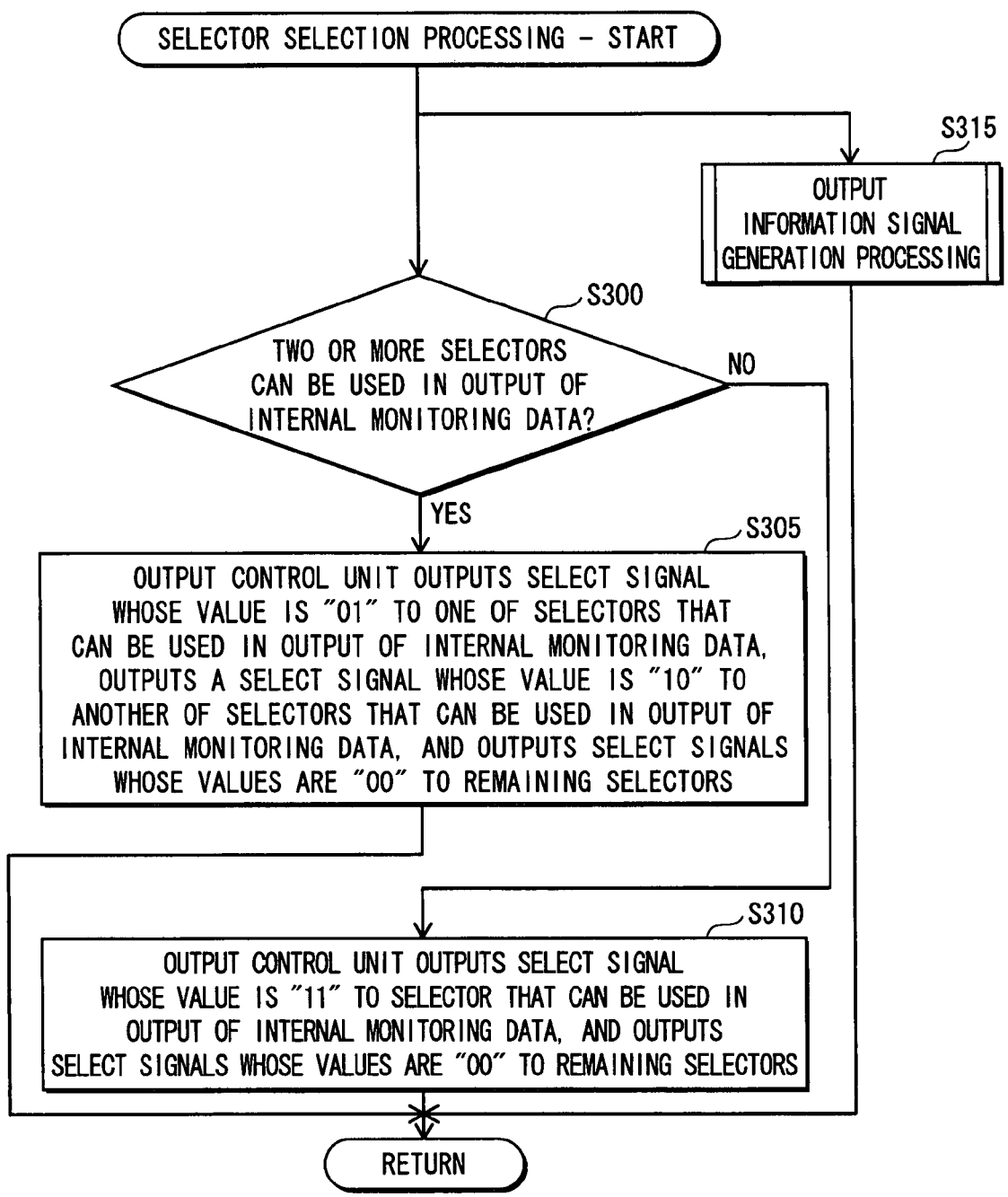

The following describes selector selection processing performed in step S270 of FIG. 11, with reference to the flowchart shown in FIG. 12.

The output control unit 112a judges whether two or more of the selectors can be used in the output of the internal condition output signal 160a in the selector switch processing (step S300).

In the case of judging that there are two or more such selectors (step S300: YES), the output control unit 112a generates a select signal whose value is "01" and outputs the generated select signal to one of the such selectors, generates a select signal whose value is "10" and outputs the generated select signal to another of the such selectors, and generates select signals whose values are "00" and outputs the generated select signals to the remaining selectors (step S305).

In the case of judging that there are not two or more selectors that can be used in the output of the internal condition output signal 160a (step S300: NO), that is to say, in the case of only one such selector, the output control unit 112a generates a select signal whose value is "11" and outputs the generated select signal to the one selector, and generates select signals whose values are "00" and outputs the generated select signals to the remaining selectors (step S310).

Also, the output control unit 112a performs output information signal generation processing, which is for generating output information, in parallel with the processing from step S300 to S310 (step S315).

(4) Output Information Signal Generation Processing

Figure 13:
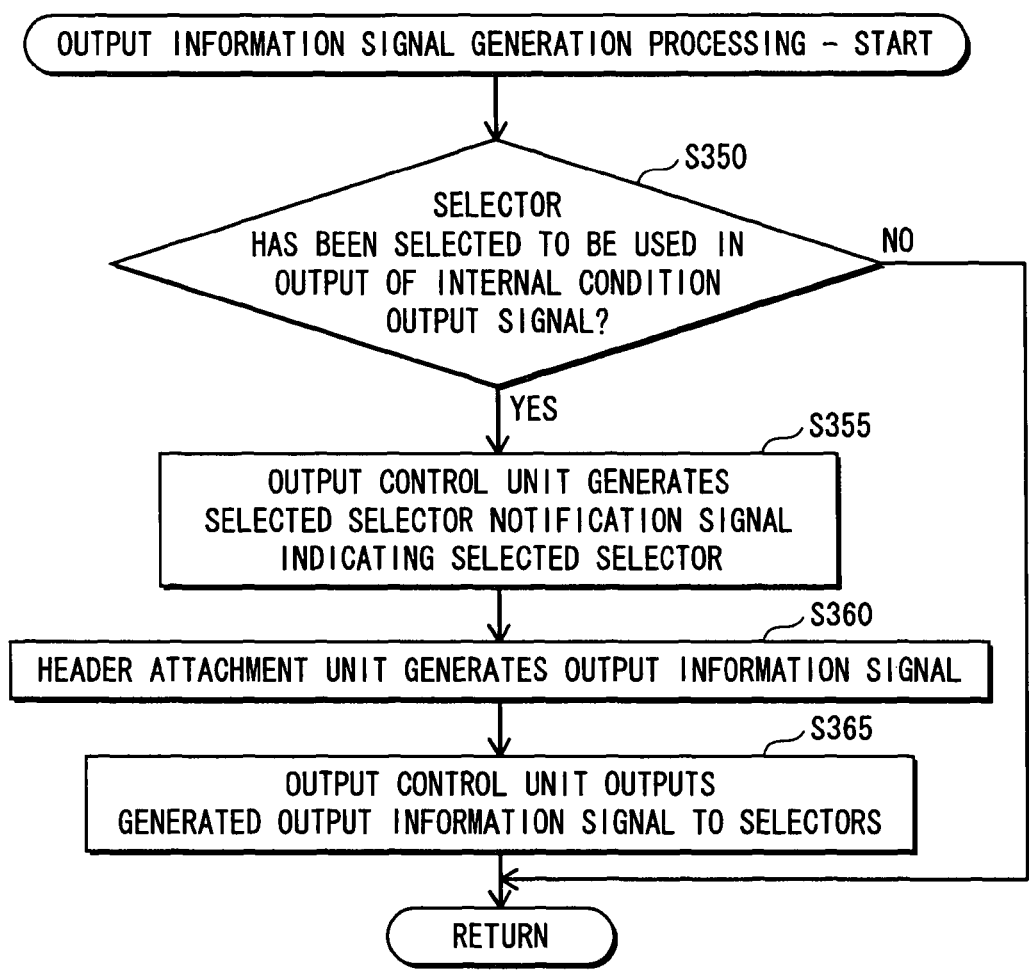

The following describes output information signal generation processing performed in step S315 of FIG. 12, with reference to the flowchart shown in FIG. 13.

The output control unit 112a judges whether a selector that can be used in the output of an internal condition output signal has been selected (step S350).

In a case of judging that a selector has been selected (step S350: YES), the output control unit 112a generates a selected selector notification signal 162a that indicates the selected selector (step S355). The header attachment unit 125a of the output control unit 112a generates the output information signal 163a composed of the header information, the internal condition notification signal 161a and the selected selector notification signal 162a (step S360). The output control unit 112a outputs the output information signal 163a to the selectors (step S365).

In a case of judging that a selector has not been selected (step S350: NO), the output control unit 112a ends processing.

(5) Data Output Processing

Figure 14:
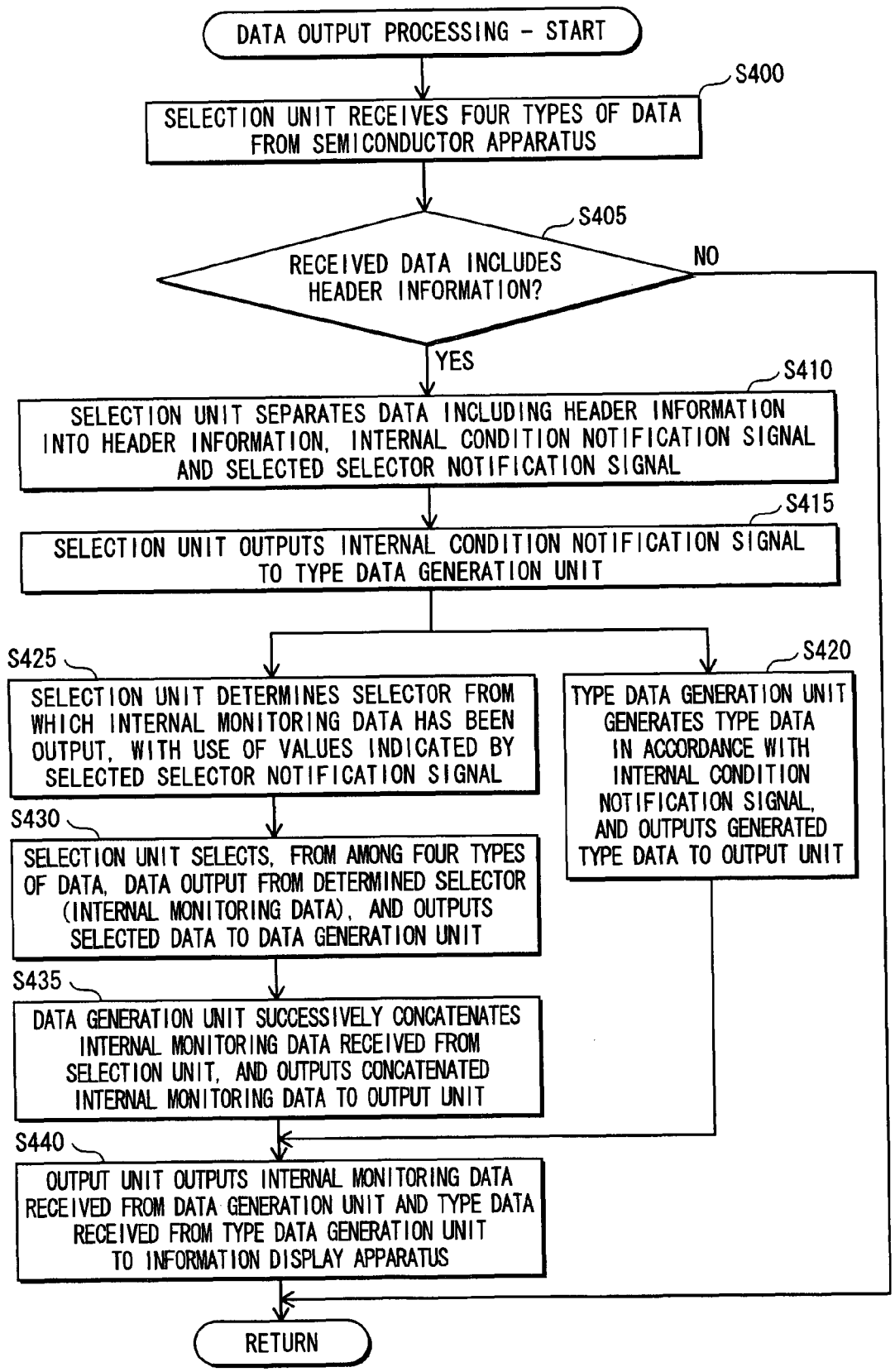

The following describes the data output processing performed in step S210 of FIG. 10, with reference to the flowchart of FIG. 14.

The selection unit 211a of the information processing unit 201a receives the four types of data from the semiconductor apparatus 101a (step S400).

The selection unit 211a judges whether any of the received data includes header information identifying the data as the output information signal 163a (step S405).

Upon judging that none of the received data includes the header information (step S405: NO), the selection unit 211a ends processing.

In a case of judging that data including the header information exists (step S405: YES), the selection unit 211a separates the received output information signal 163a into the header information, the selected selector notification signal 162a and the internal condition notification signal 161a (step S410), and outputs the internal condition notification signal 161a to the type data generation unit 213a (step S415). The type data generation unit 213a receives the internal condition notification signal 161a from the selection unit 211a, determines, according to the value indicated thereby, the type of the internal monitoring data that is currently being output from the semiconductor apparatus 101a, generates type data that indicates the determined type, and outputs the generated type data to the output unit 214a (step S420).

The selection unit 211a determines, according to the value indicated by the selected selector notification signal 162a, which one the selectors A 113a, B 114a, C 115a and D 116a output the internal condition output signal 160a (internal monitoring data) (step S425).

The selection unit 211a selects, from among the four types of data received from the connection terminals 203a to 206a, data received from the connection terminal corresponding to the determined selector, that is to say, selects the internal condition output signal 160a (internal monitoring data), and outputs the selected data (internal monitoring data) to the data generation unit 212a (step S430).

The data generation unit 212a receives the internal monitoring data from the selection unit 211a, successively concatenates the received internal monitoring data and outputs the resulting internal monitoring data to the output unit 214a (step S435).

The output unit 214a successively receives the internal monitoring data from the data generation unit 212a and the type data from the type data generation unit 213a, and outputs the received data to the information display apparatus 300a (step S440).

Note that the processing of step S420 and the series of processing from step S425 to S435 are performed in parallel.

2.6 Concrete Example

Figure 15:
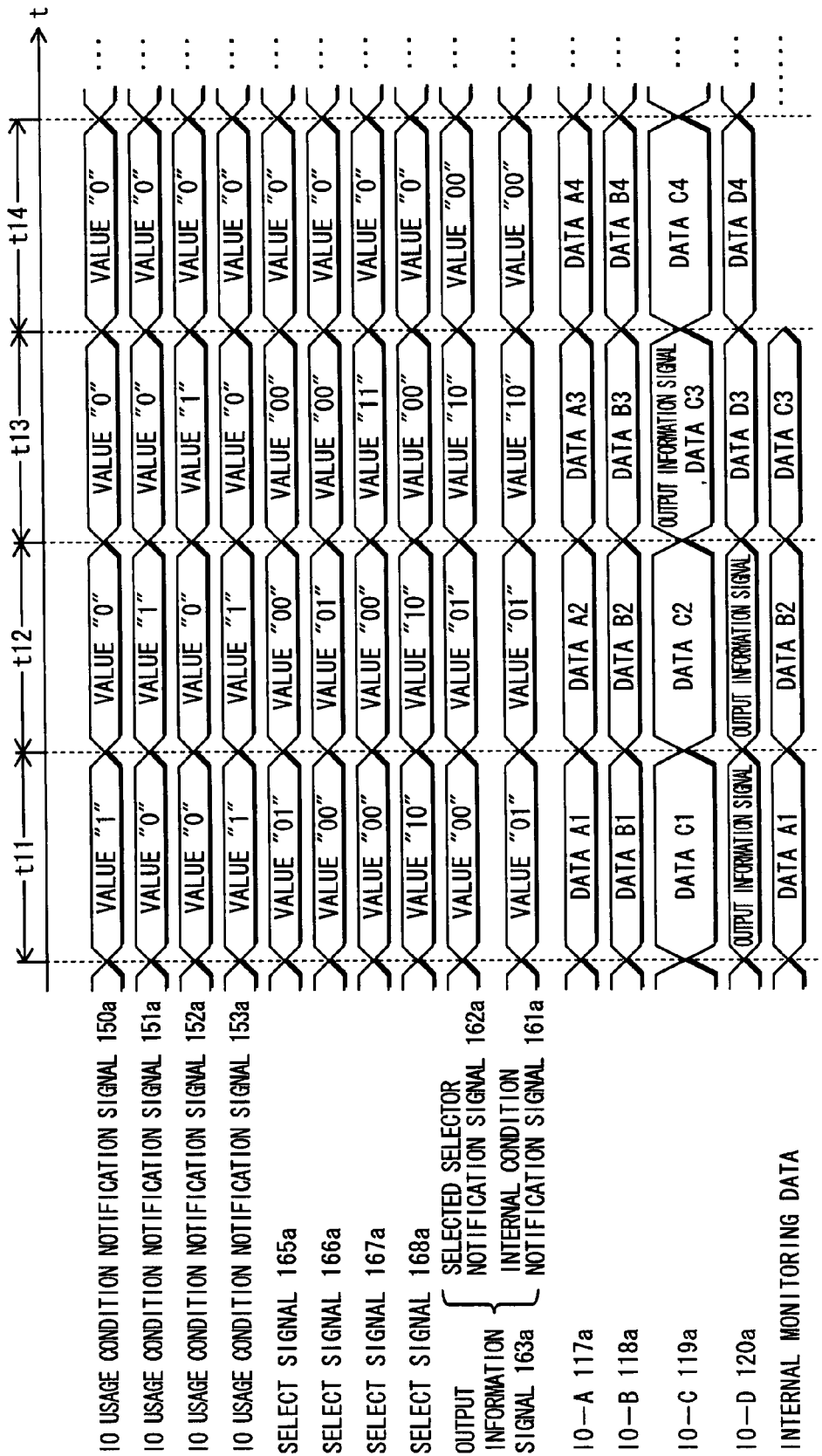
FIG. 15 is a timing chart showing a concrete example of operations performed by the semiconductor operation monitor system 2.

The following describes a concrete example of operations performed by the semiconductor operation monitor system 2, with reference to the timing chart shown in FIG. 15.

(Period t11)

In period t11, the output control unit 112a searches for a selector that can be used in the output of the internal condition output signal 160a and the output information signal 163a, based on the values ("1", "0", "0" and "1") indicated by the IO usage condition notification signals 150a to 153a.

In accordance with a result of the search, the output control unit 112a outputs the select signal 165a whose value is "01" to the selector A 113a, outputs a select signal 168a whose value is "10" to the selector D 116a, and outputs the select signals 166a and 167a whose values are "00" to the selectors B 114a and C 115a respectively.

Also, the output control unit 112a outputs, to the selectors, the header information and the output information signal 163a composed of the selected selector notification signal 162a whose value is "00" and the internal condition notification signal 161a whose value is "01".

In accordance with respective values of the select signals, the IO-A 117a, IO-B 118a, IO-C 119a and IO-D 120a output data A1, data B1, data C1 and the output information signal 163a respectively to the information collection apparatus 200a.

The information collection apparatus 200a searches the data received from the semiconductor apparatus 101a for data that includes header information.

In this case, the information collection apparatus 200a selects the data A1 as the internal monitoring data in accordance with the value indicated by the selected selector notification signal 162a included in the output information signal 163a received from the selector D 116a, and outputs the selected internal monitoring data to the information display apparatus 300a. Also, in accordance with the value indicated by the internal condition notification signal 161a included in the output information signal 163a, the information collection apparatus 200a generates type data (e.g., output data (AV)) indicating that the internal monitoring data being output is data being transferred between the AV processing unit 104a and the memory IF unit 110a, and outputs the generated type data to the information display apparatus 300a.

The information display apparatus 300a displays the type data (output data (AV)) and the internal monitoring data (data A1).

(Period t12)

In period t12, the output control unit 112a searches for a selector that can be used in the output of the internal condition output signal 160a and the output information signal 163a, based on the values ("0", "1", "0" and "1") indicated by the IO usage condition notification signals 150a to 153a.

In accordance with a result of the search, the output control unit 112a outputs the select signal 166a whose value is "01" to the selector B 114a, outputs a select signal 168a whose value is "10" to the selector D 116a, and outputs the select signals 165a and 167a whose values are "00" to the selectors A 113a and C 115a respectively.

Also, the output control unit 112a outputs, to the selectors, the header information and the output information signal 163a composed of the selected selector notification signal 162a whose value is "01" and the internal condition notification signal 161a whose value is "01".

In accordance with respective values of the select signals, the IO-A 117a, IO-B 118a, IO-C 119a and IO-D 120a output data A2, data B2, data C2 and the output information signal 163a respectively to the information collection apparatus 200a.

The information collection apparatus 200a performs operations similar to those described above in accordance with the values indicated by the signals output from the semiconductor apparatus 101a, and the information display apparatus 300a displays the type data (output data (AV)) and the internal monitoring data (data B2).

(Period t13)

In period t13, the output control unit 112a searches for a selector that can be used in the output of the internal condition output signal 160a and the output information signal 163a, based on the values ("0", "0", "1" and "0") indicated by the IO usage condition notification signals 150a to 153a.

In this case, the output control unit 112a judges, in accordance with a result of the search, that the selector C 115a can be used in the output of the internal condition output signal 160a and the output information signal 163a, outputs the select signal 167a whose value is "11" to the selector C 115a, and outputs the select signals 165a, 166a and 168a whose values are "00" to the selectors A 113a, B 114a, and D 116a respectively.

Also, the output control unit 112a outputs, to the selectors, the header information and the output information signal 163a composed of the selected selector notification signal 162a whose value is "10" and the internal condition notification signal 161a whose value is "10".

In accordance with respective values of the select signals, the IO-A 117a, IO-B 118a, IO-C 119a and IO-D 120a output data A3, data B3, the output information signal 163a and the data C3, and the data D3 respectively to the information collection apparatus 200a.

The information collection apparatus 200a performs operations similar to those described above in accordance with the values indicated by the signals output from the semiconductor apparatus 101a, and the information display apparatus 300a displays the type data (e.g., output data (external bus)) and the internal monitoring data (data C3).

(Period t14)

In period t14, the output control unit 112a searches for a selector that can be used in the output of the internal condition output signal 160a, based on the values ("0", "0", "0" and "0") indicated by the IO usage condition notification signals 150a to 153a.

In accordance with a result of the search, the output control unit 112a outputs the select signals 165a, 166a, 167a and 168a whose values are "00" to the selectors A 113a, B 114a, C 115a and D 116a respectively.

The IO-A 117a, IO-B 118a, IO-C 119a and IO-D 120a output data A4, data B4, data C4 and data D4 respectively to the information collection apparatus 200a.

The information collection apparatus 200a searches the data received from the semiconductor apparatus 101a for data that includes header information.

In this case, the information collection apparatus 200a does not perform processing pertaining to data output since none of the received data includes header information. In other words, the information collection apparatus 200a ignores the received data A4, B4, C4 and D4.

Note that the semiconductor apparatus 101a may output, to the selectors, the output information signal 163a composed of the selected selector notification signal 162a whose value is "00" and the internal condition notification signal 161a whose value is "00". Alternatively, in the case of outputting the output information signal 163a to the selectors, any value may be indicated by the selected selector notification signal 162a and internal condition notification signal 161a.

2.7 Conclusion

In the semiconductor operation monitor system 2 having the structure described above, the output control unit 112a outputs the output information signal to the selectors A 113a, B 114a, C 115a and D 116a.

The output control unit 112a judges the usage condition of the IO-A 117a, IO-B 118a, IO-C 118a and IO-D 120a based on the IO usage condition notification signals 150a to 153a, and in accordance with a result of the judgment, controls the selectors A 113a, B 114a, C 115a and D 116a to output the output information signal 163a and internal condition output signal 160a.

According to the above structure, instead of using a fixed terminal, the semiconductor apparatus 101 switches between terminals not being used for normal operation and uses the terminal currently switched to for outputting internal monitoring data, as well as eliminates the need for a dedicated terminal for outputting output information signals. This enables a reduction in cost due to reducing the number of terminals in the semiconductor apparatus.

Embodiment 3

Figure 16:
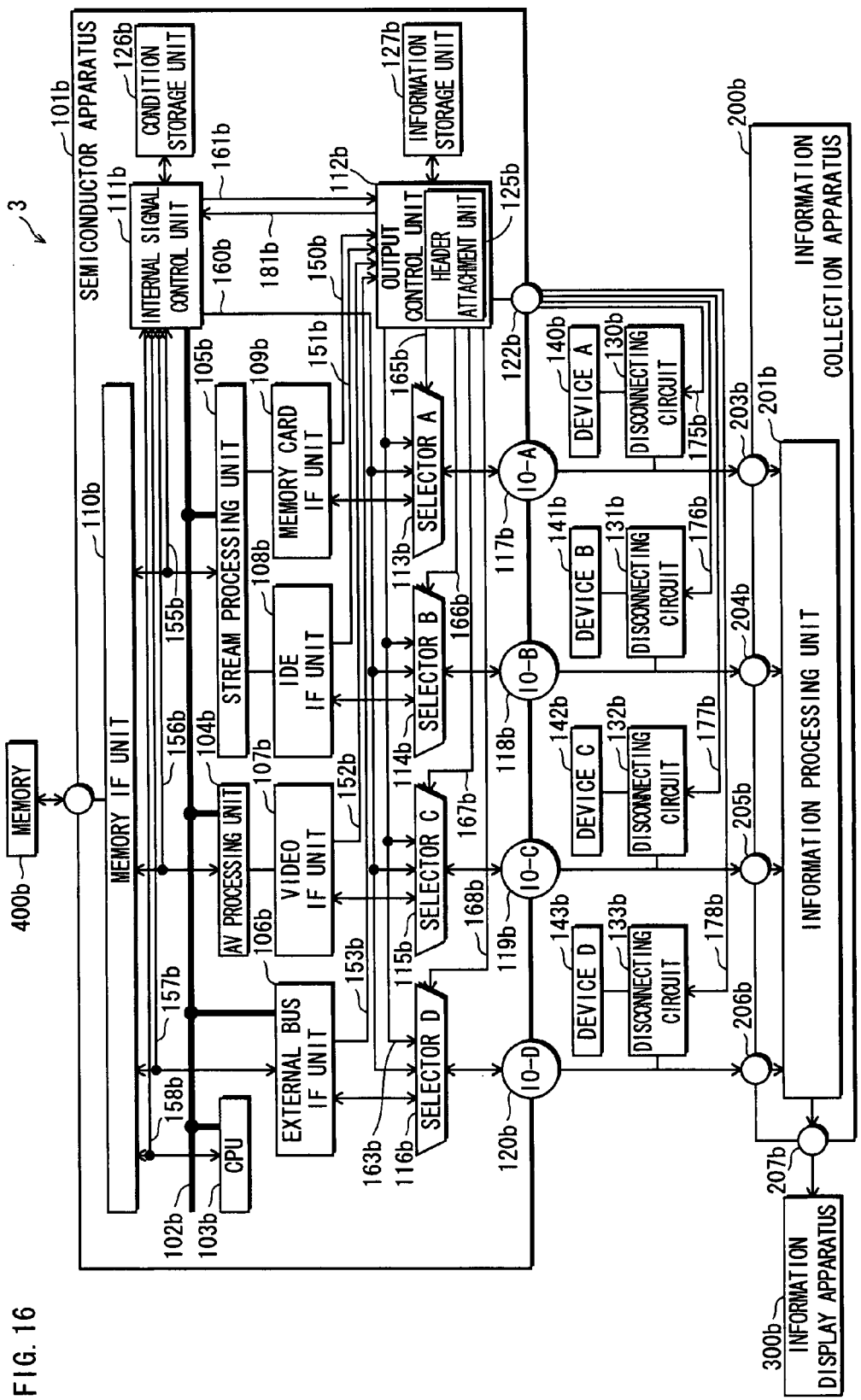
FIG. 16 shows a structure of a semiconductor operation monitor system 3.

FIG. 16 is a block diagram showing a structure of a semiconductor operation monitor system 3 in embodiment 3 of the present invention.

As shown in FIG. 16, the semiconductor operation monitor system 3 includes a semiconductor apparatus 101b, an information collection apparatus 200b, an information display apparatus 300b, a memory 400b such as an SDRAM, disconnecting circuits 130b, 131b, 132b and 133b, and devices A 140b, B 141b, C 142b and D 143b.

The semiconductor operation monitor system 3 differs from the semiconductor operation monitor system 2 of embodiment 2 in the following way. In the semiconductor operation monitor system 2, the internal condition output signals acquired while all of the selectors are being used in the input/output of normal data are not output to the information collection apparatus 200a. However, in the semiconductor operation monitor system 3, the internal condition output signals are output to the information collection apparatus 200b.

The following describes the semiconductor operation monitor system 3 with focus on differences from the semiconductor operation monitor system 2.

Descriptions of the information collection apparatus 200b (e.g., a logic analyzer), the information display apparatus 300b, disconnecting circuits 130b to 133b, and devices A 140b, B 141b, C142b and D 143b have been omitted since they are similar to the information collection apparatus 200a, the information display apparatus 300a, disconnecting circuits 130a to 133a, and devices A 140a, B 141a, C142a and D 143a described in embodiment 2.

Note that in the present embodiment, the disconnecting circuits 130b, 131b, 132b and 133b respectively receive disconnect instruction signals 175b, 176b, 177b and 178b from the semiconductor apparatus 101b. Descriptions of the disconnect instruction signals 175b to 178b have been omitted since they are similar to the disconnect instruction signals 175a to 178a described in embodiment 2.

3.1 Semiconductor Apparatus 101b

The semiconductor apparatus 101b is specifically a system LSI. As shown in FIG. 16, the semiconductor apparatus 101b includes an internal bus 102b, a CPU 103b, an AV processing unit 104b, a stream processing unit 105b, an external bus IF unit 106b, a video IF unit 107b, an IDE IF unit 108b, a memory card IF unit 109b, a memory IF unit 110b, an internal signal control unit 111b, an output control unit 112b, selectors A 113b, B 114b, C 115b and D 116b, an IO-A 117b, an IO-B 118b, an IO-C 119b, an IO-D 120b, an output terminal 122b, a condition storage unit 126b, and an information storage unit 127b.

Descriptions of the internal bus 102b, CPU 103b, AV processing unit 104b, stream processing unit 105b, external bus IF unit 106b, video IF unit 107b, IDE IF unit 108b, memory card IF unit 109b, memory IF unit 110b, and output terminal 122b have been omitted since they have the same functions as the internal bus 102a, CPU 103a, AV processing unit 104a, stream processing unit 105a, external bus IF unit 106a, video IF unit 107a, IDE IF unit 108a, memory card IF unit 109a, memory IF unit 110a, and output terminal 122a described in embodiment 2.

Also, descriptions of the selectors A 113b, B 114b, C 115b and D 116b have been omitted since they have the same functions as the selectors A 113a, B 114a, C 115a and D 116a described in embodiment 2.

Also, descriptions of the IO-A 117b, IO-B 118b, IO-C 119b, and IO-D 120b have been omitted since they have the same functions as the IO-A 117a, IO-B 118a, IO-C 119a, and IO-D 120a described in embodiment 2.

Note that in the present embodiment, the external bus IF unit 106b, video IF unit 107b, IDE IF unit 108b and memory card IF unit 109b respectively output IO usage condition notification signals 153b, 152b, 151b and 150b to the output control unit 112b. Descriptions of the IO usage condition notification signals 150b to 153b output by the IF units have been omitted since they are the same as the IO usage condition notification signals described in embodiment 2.

Similarly to embodiment 1, the selectors have been provided in one-to-one correspondence with the IOs.

The following describes the semiconductor apparatus 101b with focus on points that differ from the semiconductor apparatus 101a of embodiment 2.

(1) Internal Signal Control Unit 111b

The internal signal control unit 111b receives data, which is being transferred between the memory IF unit 110b and the stream processing unit 105b, as an internal condition signal 155b.

The internal signal control unit 111b also receives data, which is being transferred between the memory IF unit 110b and the AV processing unit 104b, as an internal condition signal 156b.

The internal signal control unit 111b also receives data, which is being transferred between the memory IF unit 110b and the external bus IF unit 106b, as an internal condition signal 157b.

The internal signal control unit 111b also receives data, which is being transferred between the memory IF unit 110b and the CPU 103b, as an internal condition signal 158b.

In this way, the internal signal control unit 111b receives the four internal condition signals 155b to 158b that have been input/output to/from the memory IF unit 110b.

In accordance with an instruction from the debugging program being executed, the internal signal control unit 111b selects, from among the received internal condition signals, one internal condition signal to be output to the information collection apparatus 200b, and outputs the selected internal condition signal to the condition storage unit 126b as condition data.

The internal signal control unit 111b outputs the type of the stored condition data (selected internal condition signal) as the internal condition notification signal 161b, and outputs address information indicating a start address showing where the condition data is stored.

The internal signal control unit 111b receives, from the output control unit 112b, the output control signal 181b that indicates whether the stored condition data is to be output.

Upon receiving the output control signal 181b indicating that the stored condition data is to be output, the internal signal control unit 111b furthermore receives, as a subsequent signal, a signal indicating an address for a position from which output is to be started, that is to say, the start address showing where the first condition data to be output is stored. The internal signal control unit 111b considers the received start address to be the output start address, successively acquires the stored condition data in order from the start location, and successively outputs the acquired condition data to the selectors as the internal condition output signal 160b.

Upon receiving the output control signal 181b indicating that condition data is not to be output, the internal signal control unit 111b ends output of the condition data (internal condition output signal 160b) to the selectors.

(Internal Condition Notification Signal 161b)

A description of the internal condition notification signal 161b has been omitted since it is the same as the internal condition notification signal 161a described in embodiment 2.

(Output Control Signal 181b)

The following describes an example of the output control signal 181b.

The output control signal 181b is a 1-bit signal, where a value "0" indicates that condition data is not to be output, and a value "1" indicates that condition data is to be output.

(2) Condition Storage Unit 126b

Figure 17A:
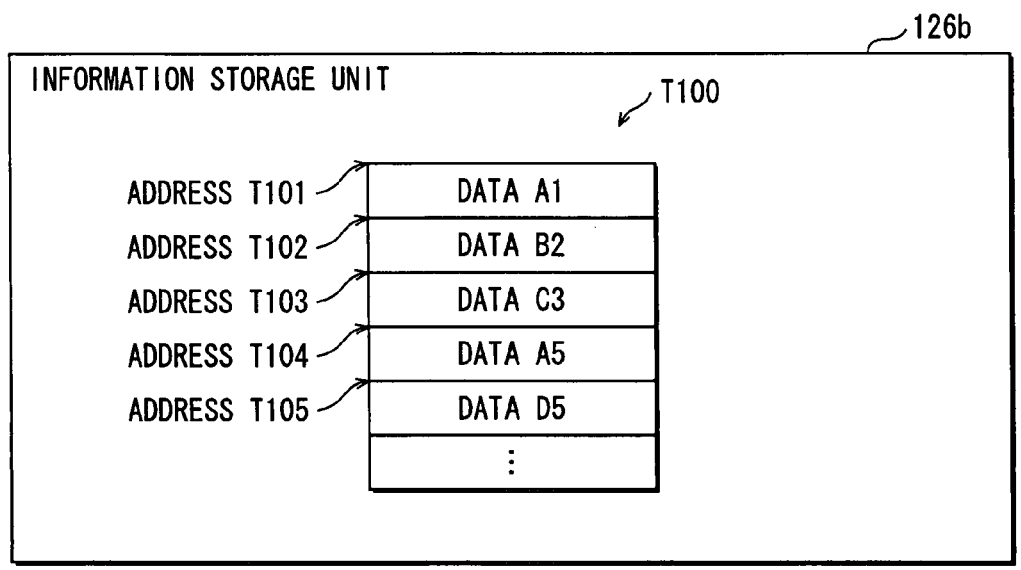
FIG. 17A shows an exemplary data structure of a condition storage table T100.

As shown in FIG. 17A, the condition storage unit 126b has a condition storage table T100 for storing one or more pieces of condition data.

Here, the condition storage table T100 stores data A1, data B2, data C3, data A5, data D5, and so on in order.

Also, addresses T101 to T105 indicate writing start locations (start addresses) for the data A1, data B2, data C3, data A5 and data D5 respectively.

(3) Output Control Unit 112b

As shown in FIG. 16, the output control unit 112b includes a header attachment unit 125b.

The output control unit 112b receives the IO usage condition notification signals 150b to 153b from the external bus IF unit 106b, the video IF unit 107b, the IDE IF unit 108b, and the memory card IF unit 109b respectively.

The output control unit 112b receives the internal condition notification signal 161b and address information from the internal signal control unit 111b, generates type information according to the type indicated by the received internal condition notification signal 161b, and stores the type information and the address information in the information storage unit 127b in correspondence with each other.

The output control unit 112b searches for, according to the received IO usage condition notification signals 150b, 151b, 152b and 153b, any selectors that are not being used in the input/output of data.

According to a result of the search, the output control unit 112b generates select signals 165b, 166b, 167b and 168b for the selectors A 113b, B 114b, C 115b and D 116b respectively. Each select signal indicates an instruction for the corresponding selector to be used in the input/output of normal data, be used in the output of the internal condition output signal 160b, be used in the output of the output information signal 163b from the output control unit 112b, or be used in the output of both the internal condition output signal 160b and the output information signal 163b. The output control unit 112b outputs the generated select signals 165b, 166b, 167b and 168b to the corresponding selector.

According to the result of the search, the output control unit 112b outputs the output control signal 181b having a value "0" or "1" to the internal signal control unit 111b.

Similarly to embodiment 1, the output control unit 112b can be said to generate a select signal for each IF unit connected to a selector. Alternatively, the output control unit 112b can be said to generate one or more select signals for each of the processing units (AV processing unit 104b, stream processing unit 105b and external bus IF unit 106b) connected to the IF units.

The following describes operations performed in accordance with the search result.

(If all of the Selectors are being Used in the Input/Output of Data)

In the case of judging that all of the selectors are being used in the input/output of data, the output control unit 112b outputs, to each of the selectors, a select signal indicating an instruction for the selectors to be used in the input/output of normal data.

The output control unit 112b outputs the output control signal 181b whose value is "0" to the internal signal control unit 111b.

(If any of the Selectors are not being Used in the Input/Output of Data)

In the case of judging that any of the selectors are not being used in the input/output of data, the output control unit 112b judges whether two or more of the selectors are not being used in the input/output of data.

In the case of judging that there are two or more such selectors, the output control unit 112b generates a select signal indicating an instruction for one of the such selectors to be used in the output of the internal condition output signal 160b. The output control unit 112b also generates a select signal indicating an instruction for another of the such selectors to be used in the output of the output information signal 163b. The output control unit 112b generates select signals indicating an instruction for the remaining selectors to be used in the input/output of normal data.

In the case of judging that there are not two or more selectors not being used in the input/output of normal data, that is to say, in the case of only one such selector, the output control unit 112b generates a select signal indicating an instruction for the one selector to be used in the output of both the internal condition output signal 160b and the output information signal 163b, and generates select signals indicating an instruction for the remaining selectors to be used in the input/output or normal data.

The output control unit 112b acquires, from the information storage unit 127b, the address information indicating the start address showing where the first condition data to be output is stored. The output control unit 112b outputs the output control signal 181b whose value is "1" to the internal signal control unit 111b, and thereafter outputs a signal indicating the acquired address information (start address) to the internal signal control unit 111b.

Furthermore, the output control unit 112b judges whether a selected selector can be used in the output of internal monitoring data, and in the case of an affirmative judgment, generates the selected selector notification signal 162b that indicates the selected selector.

The header attachment unit 125b acquires the type information corresponding to the signal indicating the address information (start address) that has been output to the internal signal control unit 111b, and generates an internal condition notification signal 161b that indicates the acquired type information.

The header attachment unit 125b generates a signal including the internal condition notification signal 161b concatenated to the generated selected selector notification signal 162b that indicates the selector that has been selected to output the internal condition output signal 160b. The header attachment unit 125b generates the output information signal 163b by attaching, to the generated signal, header information that identifies the signal as the output information signal 163b. The header attachment unit 125b acquires the type information in order according to the sequence in which the type information is stored, and successively generates the output information signal 163b. At this time, the header attachment unit 125b deletes the acquired type information and corresponding address information.

Furthermore, the output control unit 112b outputs a disconnect instruction signal 175b, 176b, 177b and 178b to the disconnecting circuits 130b to 133b respectively. For example, if a selector and an IO are to be used in the output of the internal condition output signal 160b, the output information signal 163b, or both, the output control unit 112b outputs a disconnect instruction signal whose value is "1" to the disconnecting circuit corresponding thereto, such that data output from the selector does not arrive at the device connected to the IO corresponding to the selector. If a selector and an IO are to be used in the output of normal data, the output control unit 112b outputs a disconnect instruction signal whose value is "0" to the corresponding disconnecting circuit.

The output control unit 112b successively outputs the output information signal 163b generated by the header attachment unit 125b to each selector.

(Select Signals 165b to 168b)

Descriptions of the select signals 165b to 168b have been omitted since they are the same as the select signal 165b described in embodiment 2.

(Selected Selector Notification Signal 162b)

A description of the selected selector notification signal 162b has been omitted since it is the same as the selected selector notification signal 162b described in embodiment 2.

(4) Information Storage Unit 127b

Figure 17B:
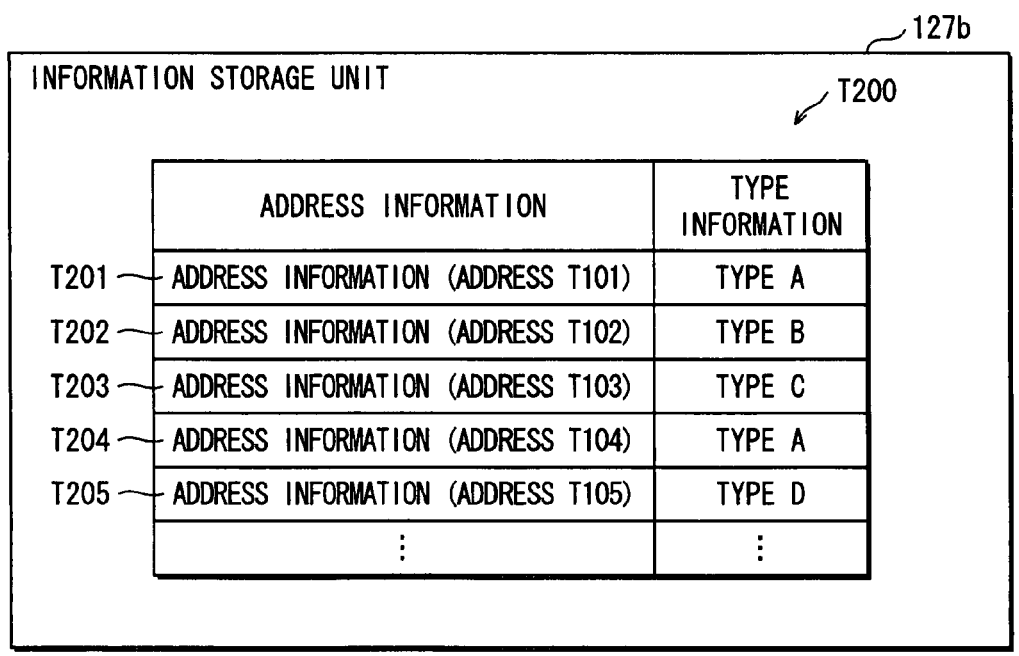
FIG. 17B shows an exemplary data structure of an information storage table T200.

As shown in FIG. 17B, the information storage unit 127b has an information storage table T200 for storing one or more pieces of type information and address information in correspondence with each other.

Address information T201 to T205 indicates the address information T101 to T105 in the condition storage table T100 respectively.

Also, type A indicates that the data traveling between the stream processing unit 105b and the memory IF unit 110b is data whose beginning position is at an address indicated by the address information corresponding to the type information type A. Type B indicates that the data traveling between the AV processing unit 104b and the memory IF unit 110b is data whose beginning position is at an address indicated by the address information corresponding to the type information type B. Type C indicates that the data traveling between the external bus IF unit 106b and the memory IF unit 110b is data whose beginning position is at an address indicated by the address information corresponding to the type information type C. Type D indicates that the data traveling between the CPU 103b and the memory IF unit 110b is data whose beginning position is at an address indicated by the address information corresponding to the type information type D.

3.2 Operations of the Semiconductor Operation Monitor System 3

The following describes operations performed in the semiconductor operation monitor system 3, with focus on differences from operations performed in the semiconductor operation monitor system 2 described in embodiment 2.

(1) Overview of Operations

The following is an overview of changed operations performed in the semiconductor operation monitor system 3 with reference to the flowchart shown in FIG. 10.

While the debugging program is being executed, the semiconductor apparatus 101b performs selector switch processing (step S200) and stores data to the condition storage unit 126b and the information storage unit 127b.

(2) Selector Switch Processing

The following describes changes to the selector switch processing performed by the semiconductor apparatus 101b, with reference to the flowchart shown in FIG. 11.

First, step S505 is not performed. This is because, as mentioned above, data is stored to the condition storage unit 126b and the information storage unit 127b while the selector switch processing (step S200) is being performed.

In step S275, the output control unit 112b outputs select signals whose values are "00" to all of the selectors, and outputs the output control signal 181b whose value is "0" to the internal signal control unit 111b.

After receiving the output control signal 181b whose value is "0", the internal signal control unit 111b does not output the internal condition output signal 160b.

(3) Selector Selection Processing

The following describes changes to the selector selection processing performed by the semiconductor apparatus 101b, with reference to the flowchart of FIG. 12.

After performing step S305 or S310, the output control unit 112b outputs the output control signal 181b whose value is "1" and a signal indicating a start address to the internal signal control unit 111b.

Upon receiving the output control signal 181b whose value is "1", the internal signal control unit 111b sets the received start address as the output start location, successively acquires stored condition data in order from the start location, and successively outputs the acquired condition data to the selectors as an internal condition output signal 160b.

(4.) Output Information Signal Generation Processing

The following describes changes to the output information signal generation processing performed by the semiconductor apparatus 101b, with reference to the flowchart of FIG. 13.

The header attachment unit 125b of the output control unit 112b performs the following operations in step S360.

The header attachment unit 125b acquires the type information corresponding to the signal indicating the address information (start address) that has been output to the internal signal control unit 111b, and generates an internal condition notification signal 161b that indicates the acquired type information.

The header attachment unit 125b generates a signal including the internal condition notification signal 161b concatenated to the generated selected selector notification signal 162b that indicates the selector that has been selected to output the internal condition output signal 160b.

The header attachment unit 125b generates the output information signal 163b by attaching, to the generated signal, header information that identifies the signal as the output information signal 163b.

The header attachment unit 125b acquires the type information in order according to the sequence in which the type information is stored, and successively generates the output information signal 163b. At this time, the header attachment unit 125b deletes the acquired type information and corresponding address information.

(5) Data Output Processing

A description of the data output processing performed by the information collection apparatus 200b has been omitted since it can be realized by the same processing shown in the flowchart of FIG. 14.

3.3. Concrete Example

The following describes a concrete example of operations performed by the semiconductor operation monitor system 3, with reference to FIGS. 15 and 17.

In the following description, the condition storage unit 126b and the information storage unit 127b of the semiconductor apparatus 101b are assumed to be storing the information shown in FIGS. 17A and 17B, and "b" has been appended to the reference characters of FIGS. 17A and 17B in place of "a".

(Period t11)

In period t11, the output control unit 112b searches for a selector that can be used in the output of the internal condition output signal 160b and the output information signal 163b, based on the values ("1", "0 ", "0", "0" and "1") indicated by the IO usage condition notification signals.

In this case, the output control unit 112b outputs the output control signal 181b whose value is "1" and the signal indicating the start address of address information T201 to the internal signal control unit 111b.

Upon receiving the output control signal 181b whose value is "1" and the signal indicating the start address of address information T201, the internal signal control unit 111b acquires the data A1 in accordance with the signal indicating the start address, and outputs the data A1 to the selectors.

Note that descriptions of operations for outputting the select signals and the output information signals, and operations performed by the information collection apparatus 200b and the information display apparatus 300b have been omitted since they are the same as the operations described in embodiment 2.

(Period t12)

In period t12, the output control unit 112b searches for a selector that can be used in the output of the internal condition output signal 160b and the output information signal 163b, based on the values ("0", "1", "0" and "1") indicated by the IO usage condition notification signals.

In this case, the output control unit 112b outputs the output control signal 181b whose value is "1" and the signal indicating the start address of address information T202 to the internal signal control unit 111b.

Upon receiving the output control signal 181'b whose value is "1" and the signal indicating the start address of address information T202, the internal signal control unit 111b acquires the data B2 in accordance with the signal indicating the start address, and outputs the data B2 to the selectors.

Note that descriptions of operations for outputting the select signals and the output information signals, and operations performed by the information collection apparatus 200b and the information display apparatus 300b have been omitted since they are the same as the operations described in embodiment 2.

(Period t13)

In period t13, the output control unit 112b searches for a selector that can be used in the output of the internal condition output signal 160b and the output information signal 163b, based on the values ("0", "0", "1" and "0") indicated by the IO usage condition notification signals.

In this case, the output control unit 112b outputs the output control signal 181b whose value is "1" and the signal indicating the start address of address information T203 to the internal signal control unit 111b.

Upon receiving the output control signal 181b whose value is "1" and the signal indicating the start address of address information T203, the internal signal control unit 111b acquires the data C3 in accordance with the signal indicating the start address, and outputs the data C3 to the selectors.

Note that descriptions of operations for outputting the select signals and the output information signals, and operations performed by the information collection apparatus 200b and the information display apparatus 300b have been omitted since they are the same as the operations described in embodiment 2.

(Period t14)

In period t14, the output control unit 112b searches for a selector that can be used in the output of the internal condition output signal 160b, based on the values ("0", "0", "0" and "0") indicated by the IO usage condition notification signals.

In this case, the semiconductor apparatus 101b stores data to the condition storage unit 126b and the information storage unit 127b without outputting the internal condition output signal 160b or the output information signal 163b.

Also, normal data (data A4, data B4, data C4 and data D4) are output from and received by the IOs.

(After Period t14)

After period t14, in a case of judging that one of the selectors can be used in the output of an internal condition output signal 160b, the semiconductor apparatus 101b outputs the data after data A4 to the information collection apparatus 200b.

3.4 Conclusion

According to the semiconductor operation monitor system 2 having the structure described above, even if none of the terminals can be used, internal condition output signals are stored until at least one of the terminals can be used, and thereafter the internal condition output signals are output. This enables further increasing the amount of internal monitoring data that can be output.

3.5 Variations

Although described based on the above embodiment 3, the present invention is of course not limited to embodiment 3. The following variations are also included in the present invention.

(1) Although data is stored only if none of the terminals can be used in embodiment 3, the present invention is not limited to this.

For example, when only once series (one IO) can be used, the semiconductor apparatus 101b may output only the internal condition output signal to the information collection apparatus 200b, and only store the internal information signal.

(2) Although separate storage units (the condition storage unit 126b and the information storage unit 127b) are used to store condition data and type information in embodiment 3, the present embodiment is not limited to this.

One storage unit may be used to store both the condition data and the type information.

For example, the internal signal control unit 111b may store the condition data and type data in the above-described condition storage unit 126b in accordance with each other.

Here, in a case of judging that a selector is not being used in the input/output of data, the output control unit 112b outputs only the output control signal whose value is "1" to the internal signal control unit 111b.

Upon receiving the output control signal whose value is "1", the internal signal control unit 111b acquires, from the condition storage unit 126b, condition information to be output and type information corresponding thereto. The internal signal control unit 111b outputs the acquired condition information to the selectors, and outputs the acquired type information to the output control unit 112b.

(3) The above embodiment and variations may be combined.

Embodiment 4

Figure 18:
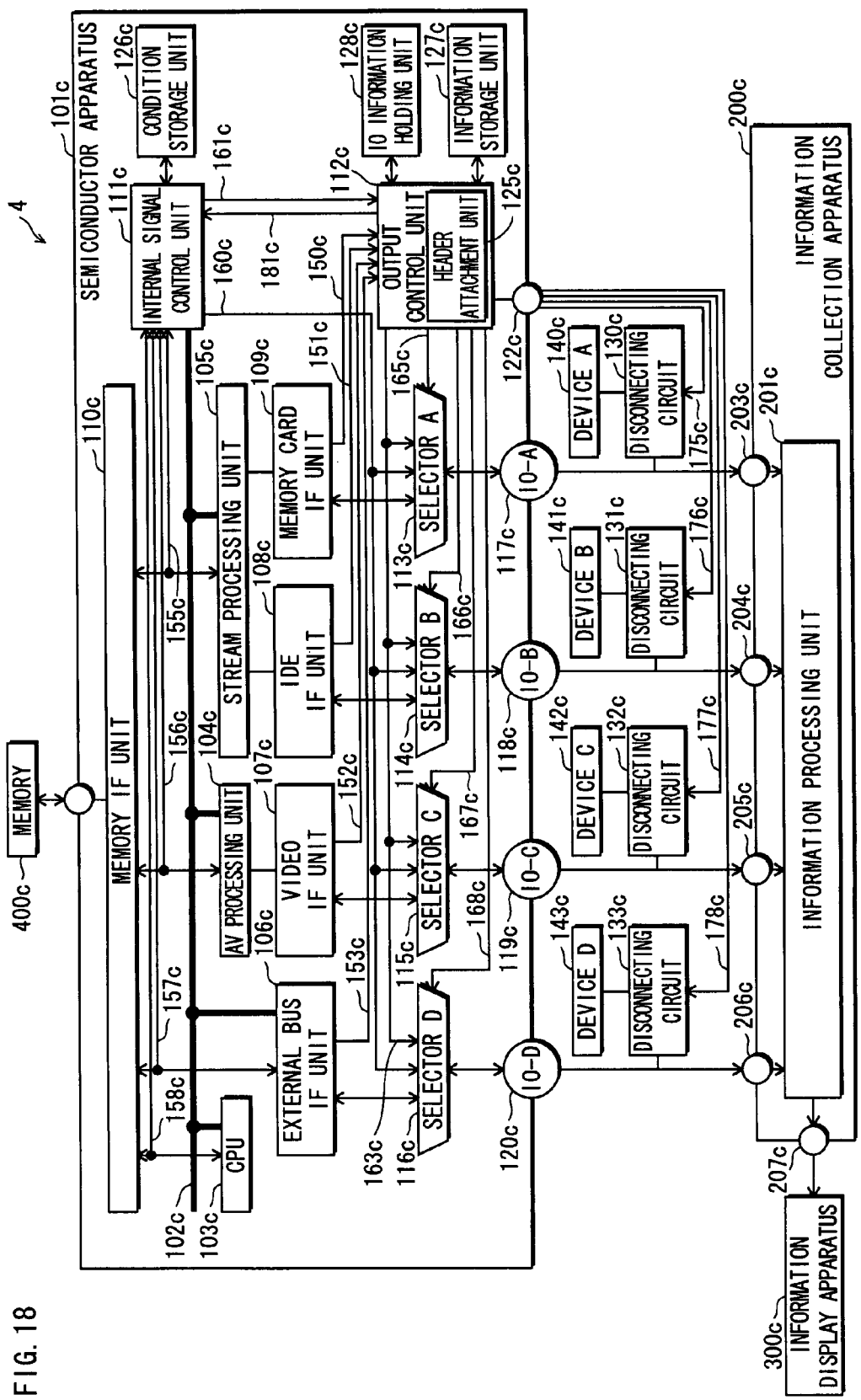
FIG. 18 shows a structure of a semiconductor operation monitor system 4.

FIG. 18 is a block diagram showing a structure of a semiconductor operation monitor system 4 in embodiment 4 of the present invention.

As shown in FIG. 18, the semiconductor operation monitor system 4 includes a semiconductor apparatus 101c, an information collection apparatus 200c, an information display apparatus 300c, a memory 400c such as an SDRAM, disconnecting circuits 130c, 131c, 132c and 133c, and devices A 140c, B 141c, C 142c and D 143c.

The semiconductor operation monitor system 4 differs from the semiconductor operation monitor system 3 of embodiment 3 in the following way. In the semiconductor operation monitor system 3, an internal condition output signal is stored instead of being output to the information collection apparatus 200b while all of the selectors are being used in the input/output of normal data. However, in the semiconductor operation monitor system 4, even if all of the selectors are being used in the input/output of normal data, one of the selectors is used to output an internal condition output signal to the information collection apparatus 200c.

The following describes the semiconductor operation monitor system 4 with focus on differences from the semiconductor operation monitor system 3.

Descriptions of the information collection apparatus 200c (e.g., a logic analyzer), the information display apparatus 300c, disconnecting circuits 130c to 133c, and devices A 140c, B 141c, C 142c and D 143c have been omitted since they are similar to the information collection apparatus 200b, the information display apparatus 300b, disconnecting circuits 130b to 133b, and devices A 140b, B 141b, C 142b and D 143b described in embodiment 3.

Note that in the present embodiment, the disconnecting circuits 130c, 131c, 132c and 133c respectively receive disconnect instruction signals 175c, 176c, 177c and 178c from the semiconductor apparatus 101c. Descriptions of the disconnect instruction signals 175c to 178c have been omitted since they are similar to the disconnect instruction signals 175b to 178b described in embodiment 3.

4.1 Semiconductor Apparatus 101c

The semiconductor apparatus 101c is, for example, a system LSI. As shown in FIG. 18, the semiconductor apparatus 101c includes an internal bus 102c, a CPU 103c, an AV processing unit 104c, a stream processing unit 105c, an external bus IF unit 106c, a video IF unit 107c, an IDE IF unit 108c, a memory card IF unit 109c, a memory IF unit 110c, an internal signal control unit 111c, an output control unit 112c, selectors A 113c, B 114c, C 115c and D 116c, an IO-A 117c, an IO-B 118c, an IO-C 119c, an IO-D 120c, an output terminal 122c, a condition storage unit 126c, an information storage unit 127c, and an IO information holding unit 128c.

Descriptions of the internal bus 102c, CPU 103c, AV processing unit 104c, stream processing unit 105c, external bus IF unit 106c, video IF unit 107c, IDE IF unit 108c, memory card IF unit 109c, memory IF unit 110c, internal signal control unit 111c, output terminal 122c, condition storage unit 126c, and information storage unit 127c have been omitted since they have the same functions as the internal bus 102b, CPU 103b, AV processing unit 104b, stream processing unit 105b, external bus IF unit 106b, video IF unit 107b, IDE IF unit 108b, memory card IF unit 109b, memory IF unit 110b, internal signal control unit 111b, output terminal 122b, condition storage unit 126b, and information storage unit 127b described in embodiment 3.

Note that the condition storage table T100 and the information storage table T200 shown in FIGS. 17A and 17B are used in the following description when necessary.

Also, descriptions of the selectors A 113c, B 114c, C 115c and D 116c have been omitted since they have the same functions as the selectors A 113b, B 114b, C 115b and D 116b described in embodiment 3.

Also, descriptions of the IO-A 117c, IO-B 118c, IO-C 119c, and IO-D 120c have been omitted since they have the same functions as the IO-A 117b, IO-B 118b, IO-C 119b, and IO-D 120b described in embodiment 3.

Note that in the present embodiment, the external bus IF unit 106c, video IF unit 107c, IDE IF unit 108c and memory card IF unit 109c respectively output IO usage condition notification signals 153c, 152c, 151c and 150c to the output control unit 112c. Descriptions of the IO usage condition notification signals 150c to 153c output by the IF units have been omitted since they are the same as the IO usage condition notification signals described in embodiment 3.

Also, the internal signal control unit 111c receives data, which is being transferred between the memory IF unit 110c and the stream processing unit 105c, as an internal condition signal 155c. The internal signal control unit 111c also receives data, which is being transferred between the memory IF unit 110c and the AV processing unit 104c, as an internal condition signal 156c. The internal signal control unit 111c also receives data, which is being transferred between the memory IF unit 110c and the external bus IF unit 106c, as an internal condition signal 157c. The internal signal control unit 111c also receives data, which is being transferred between the memory IF unit 110c and the CPU 103c, as an internal condition signal 158c. The internal signal control unit 111c outputs the received data to the selectors as an internal condition output signal 160c.

Also, in the present embodiment, the internal signal control unit 111c outputs an internal condition notification signal 161c to the output control unit 112c, and a description of the internal condition notification signal 161c has been omitted since it is similar to the internal condition notification signal 161b described in embodiment 3.

Also, in the present embodiment, the internal signal control unit 111c receives the output control signal 181c from the output control unit 112c. The output control signal 181c is similar to the output control signal 181b described in embodiment 3.

Similarly to embodiment 1, the selectors have been provided in one-to-one correspondence with the IOs.

The following describes the semiconductor apparatus 101c with focus on points that differ from the semiconductor apparatus 101b of embodiment 3.

(1) IO Information Holding Unit 128c

As shown in FIG. 19, the IO information holding unit 128c has an IO information table T300.

The IO information table T300 stores priority levels for the IO-A 117c, IO-B 118c, IO-C 119c and IO-D 120c. The priority levels pertain to the use of the IOs for outputting the internal condition output signal 160c, the output information signal 163c, or both.

The priority levels are expressed as an integer from 1 to 4, where a higher value indicates that the IO cannot be used for outputting the internal condition output signal 160c, the output information signal 163c, or both. Here, the priority level whose value is "4" is the highest, and the priority level whose value is "1" is the lowest.

Also, the priority levels assigned to the IOs are different for a case of being used in the input/output of normal data and a case of not being in use.

For example, the priority level for the IO-A 117c is "4" in a case of being used in the input/output of normal data, and "2" in a case of not being in use.

(2) Output Control Unit 112c

The output control unit 112c differs from the output control unit 112b described in embodiment 3 with respect to operations that are performed after searching for a selector that is not being used in the input/output of data.

Similarly to embodiment 1, the output control unit 112c can be said to generate a select signal for each IF unit connected to a selector. Alternatively, the output control unit 112c can be said to generate one or more select signals for each of the processing units (AV processing unit 104c, stream processing unit 105c and external bus IF unit 106c) connected to the IF units.

The following describes operations performed in accordance with the search result.

(If all of the Selectors are being Used in the Input/Output of Data)

In the case of judging that all of the selectors are being used in the input/output of data, the output control unit 112c acquires, from the IO information table T300, the in-use priority levels for all of the IOs.

The output control unit 112c selects the lowest of the acquired priority levels, and selects the IO corresponding to the selected priority level.

The output control unit 112c outputs, to the selector corresponding to the selected IO, a select signal indicating an instruction be used in the output of the internal condition output signal 160c and the output information signal 163c, and outputs to the remaining selectors a select signal indicating an instruction to be used in the output of normal data. For example, the output control unit 112c outputs an intervention signal to the IF unit connected to the selector that is to output the internal condition output signal 160c and the output information signal 163c, in order to stop the IF unit from performing input/output.

Furthermore, the output control unit 112c acquires, from the information storage unit 127c, the address information indicating the start address showing where the first condition data to be output is stored. The output control unit 112c outputs the output control signal 181c whose value is "1" to the internal signal control unit 111c, and thereafter outputs a signal indicating the acquired address information (start address) to the internal signal control unit 111c.

(If any of the Selectors are not being Used in the Input/Output of Data)

In the case of judging that any of the selectors are not being used in the input/output of data, the output control unit 112c acquires, from the IO information table T300, the not-in-use priority level for the unused IO.

The output control unit judges whether there are two or more selectors not being used.

In the case of judging that there are two or more such selectors, the output control unit 112c selects the lowest of the acquired priority levels, and selects the IO corresponding to the selected priority level. The output control unit 112c outputs a select signal indicating an instruction for the selector corresponding to the selected IO to be used in the output of the internal condition output signal 160c. The output control unit 112c also selects the lowest priority level from among the previously unselected priority levels, and selects the IO corresponding to the selected priority level. The output control unit 112c outputs a select signal indicating an instruction for the selector corresponding to the selected IO to be used in the output of the output information signal 163c. The output control unit 112c outputs select signals indicating an instruction for the remaining selectors to be used in the input/output of normal data.

In the case of judging that there are not two or more selectors not being used in the input/output of normal data, that is to say, in the case of only one such selector, the output control unit 112c outputs a select signal indicating an instruction for the one selector to be used in the output of both the internal condition output signal 160c and the output information signal 163c, and outputs select signals indicating an instruction for the remaining selectors to be used in the input/output or normal data.

The output control unit 112c acquires, from the information storage unit 127c, the address information indicating the start address showing where the first condition data to be output is stored. The output control unit 112c outputs the output control signal 181c whose value is "1" to the internal signal control unit 111c, and thereafter outputs a signal indicating the acquired address information (start address) to the internal signal control unit 111c.

Furthermore, the output control unit 112c judges whether a selected selector can be used in the output of internal monitoring data, and in the case of an affirmative judgment, generates the selected selector notification signal 162c that indicates the selected selector.

The header attachment unit 125c acquires the type information corresponding to the signal indicating the address information (start address) that has been output to the internal signal control unit 111c, and generates an internal condition notification signal 161c that indicates the acquired type information.

The header attachment unit 125c generates a signal including the internal condition notification signal 161c concatenated to the generated selected selector notification signal 162c that indicates the selector that has been selected to output the internal condition output signal 160c. The header attachment unit 125c generates the output information signal 163c by attaching, to the generated signal, header information that identifies the signal as the output information signal 163c. The header attachment unit 125c acquires the type information in order according to the sequence in which the type information is stored, and successively generates the output information signal 163c. At this time, the header attachment unit 125c deletes the acquired type information and corresponding address information.

Similarly to embodiment 3, the output control unit 112c further outputs a disconnect instruction signal 175c, 176c, 177c and 178c to the disconnecting circuits 130c to 133c respectively. Here, if a selector and an IO are to be used in the output of the internal condition output signal 160c, the output information signal 163c, or both, the output control unit 112c outputs a disconnect instruction signal, which instructs breaking of the connection between the IO and the device, to the disconnecting circuit corresponding thereto, such that data output from the selector does not arrive at the device connected to the IO corresponding to the selector. If a selector and an IO are to be used in the output of normal data, the output control unit 112c outputs a disconnect instruction signal, which instructs making a connection between the IO and the device, to the corresponding disconnecting circuit.

The output control unit 112c successively outputs the output information signal 163c generated by the header attachment unit 125c to each selector.

(Select Signals 165c to 168c)

Descriptions of the select signals 165c to 168c have been omitted since they are the same as the select signals described in embodiment 3.

(Selected Selector Notification Signal 162c)

A description of the selected selector notification signal 162c has been omitted since it is the same as the selected selector notification signal 162b described in embodiment 3.

4.2 Operations of the Semiconductor Operation Monitor System 4

The following describes operations performed in the semiconductor operation monitor system 4, with focus on differences from operations performed in the semiconductor operation monitor systems 1, 2 and 3 described in the above embodiments.

(1) Overview of Operations

The following is an overview of changed operations performed in the semiconductor operation monitor system 4 with reference to the flowchart shown in FIG. 10.

While the debugging program is being executed, the semiconductor apparatus 101c performs selector switch processing (step S200) and stores data to the condition storage unit 126c and the information storage unit 127c.

In other words, the overview of operations performed by the semiconductor operation monitor system 4 is similar to the overview of operations performed by the semiconductor operation monitor system 3 described in embodiment 3.

(2) Selector Switch Processing

Figure 20:
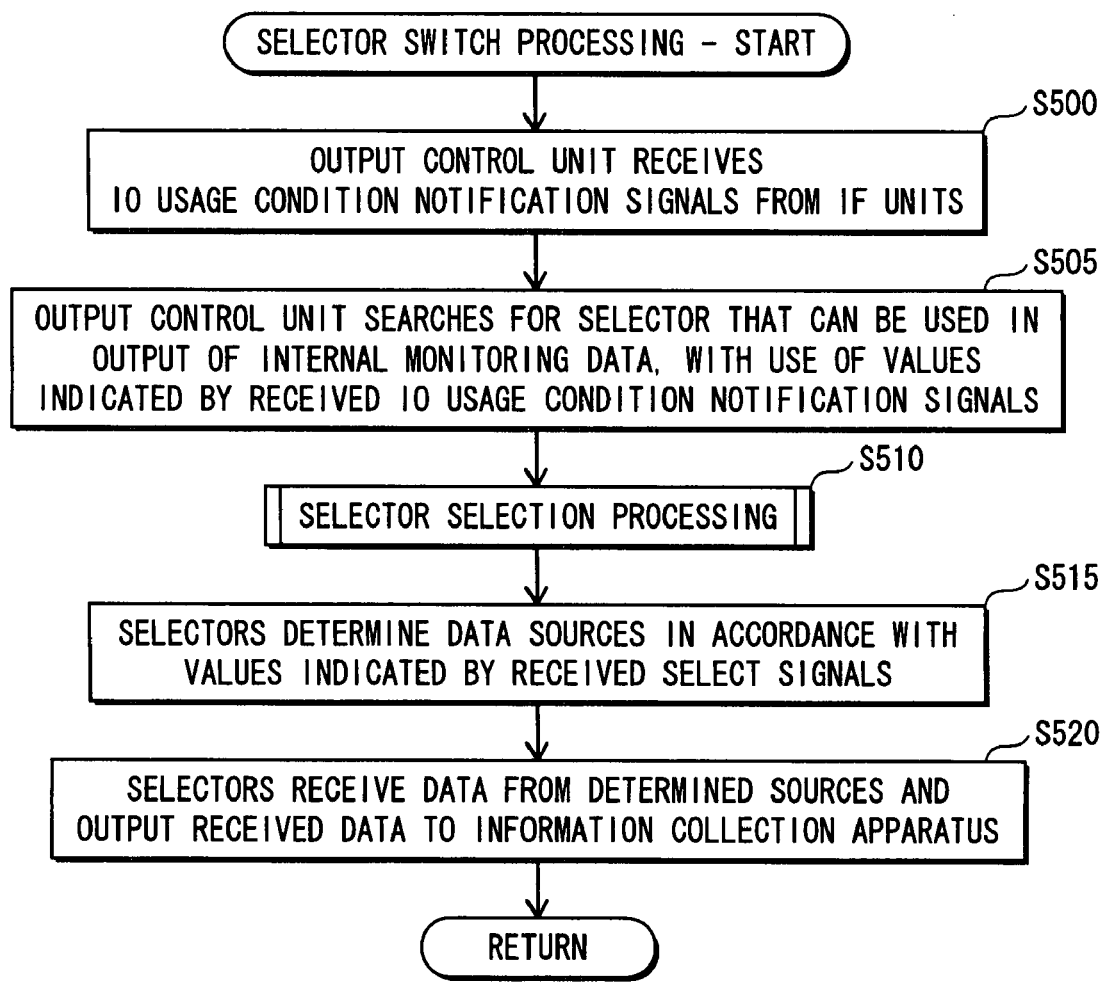
FIG. 20 is a flowchart showing selector switch processing in a semiconductor apparatus 101c.

The following describes changes to the selector switch processing performed by the semiconductor apparatus 101c, with reference to the flowchart shown in FIG. 20.

Descriptions of steps S500 and S505 performed by the output control unit 112c of the semiconductor apparatus 101c have been omitted since they are the same as steps S250 and S260 shown in FIG. 11.

Thereafter, the output control unit 112c performs selector selection processing to select a selector for outputting the internal condition output signal 160c and the output information signal 163c (step S515).

Each selector determines a source for data according to the value of the select signal output from the output control unit 112c (step S520).

Each selector receives data from the determined source, and outputs the received data to the information collection apparatus 200c (step S525).

(3) Selector Selection Processing

Figure 21:
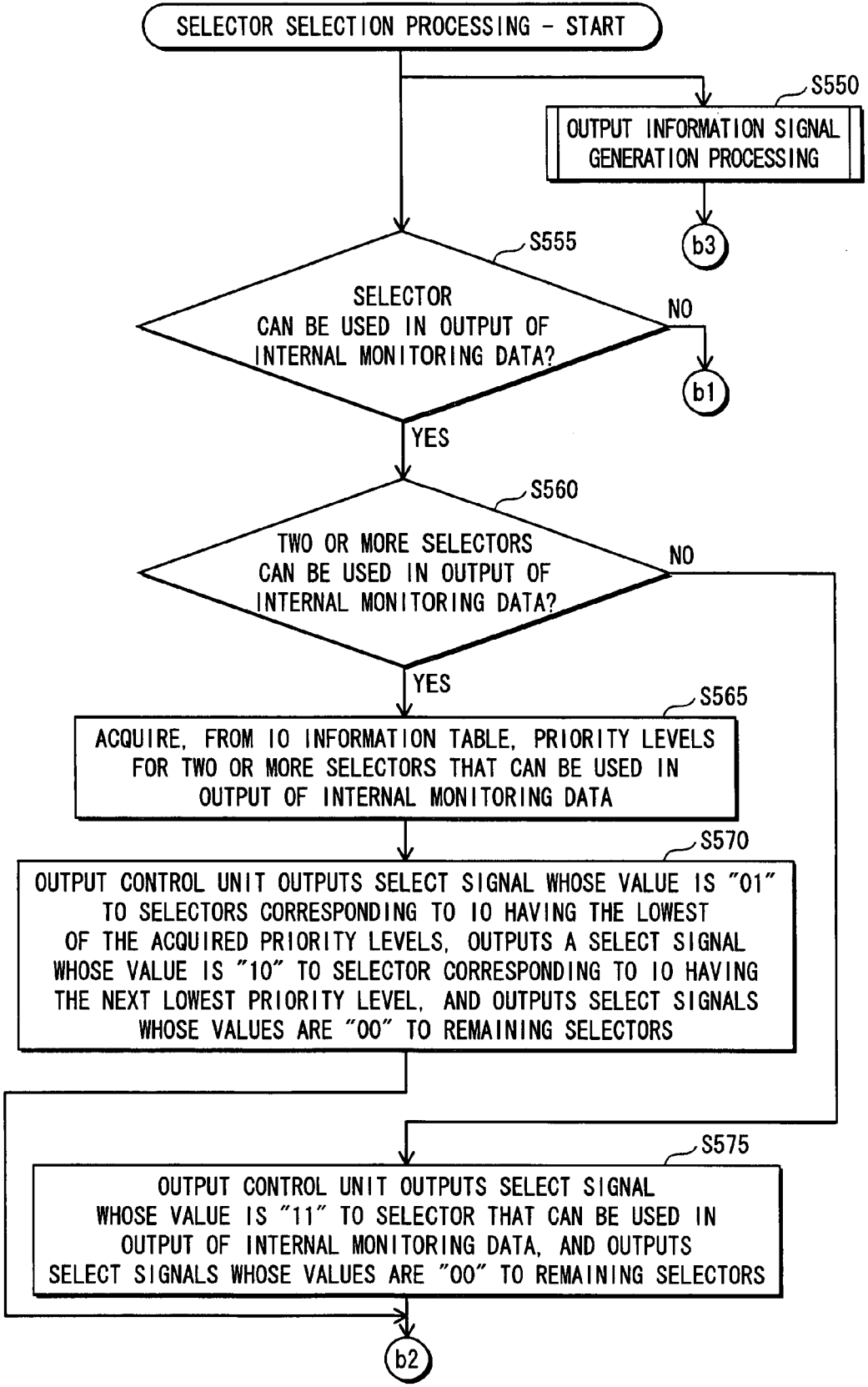
FIG. 21 is a flowchart showing selector selection processing in the semiconductor apparatus 101c, continued in FIG. 22.
Figure 22:
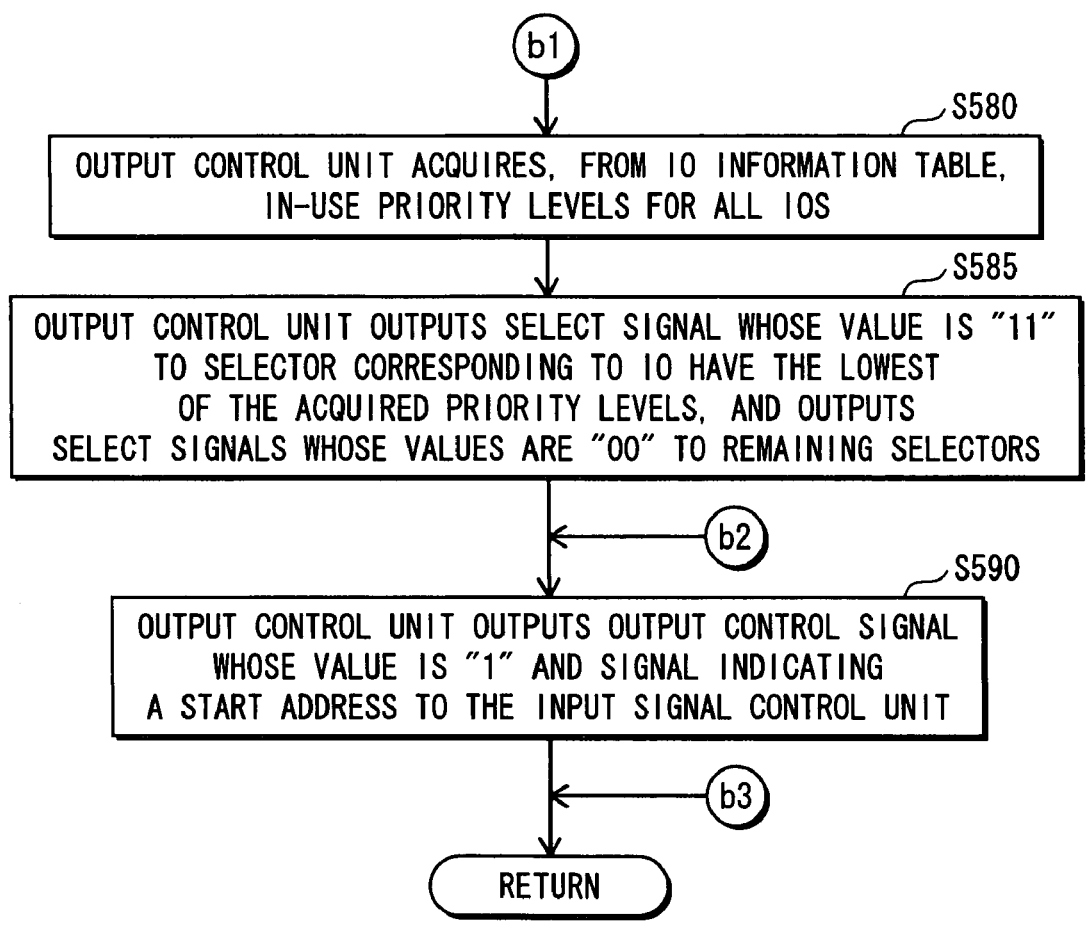
FIG. 22 is a flowchart showing selector selection processing in the semiconductor apparatus 101c, continued from FIG. 21.

The following describes changes to the selector selection processing performed by the semiconductor apparatus 101c, with reference to the flowcharts of FIGS. 21 and 22.

The output control unit 112c judges, with use of the search result of step S260 shown in FIG. 11, whether any of the selectors can be used in the output of the internal condition output signal 160c (step S555).

In the case of an affirmative judgment (step S555: YES), the output control unit 112c judges whether two or more selectors can be used in the output of the internal condition output signal 160c (step S560).

In the case of judging that there are two or more such selectors (step S560: YES), the output control unit 112c acquires, from the IO information table T300, the not-in-use priority levels for the one or more IOs not currently being used (step S565). The output control unit 112c generates and outputs a select signal whose value is "01" to the selector corresponding to the IO with the lowest of the received priority levels, generates and outputs a select signal whose value is "10" to the selector corresponding to the next lowest of the received priority levels, and generates and outputs a select signal whose value is "00" to the remaining selectors (step S570). The output control unit 112c acquires, from the information storage unit 127c, the address information indicating the start address showing where the first condition data to be output is stored, and outputs the output control signal 181c whose value is "1" and a signal indicating the acquired address information (start address) to the internal signal control unit 111c (step S590).

In the case of judging that there are not two or more selectors not being used in the input/output of normal data, that is to say, in the case of only one such selector (step S560: NO), the output control unit 112c outputs a select signal whose value is "11" to the one selector, and outputs select signals whose values are "00" the remaining selectors (step S575), and performs the above-described step S590.

In the case of judging that none of the selectors can be used in the output of the internal condition output signal 160c (step S555: NO), the output control unit 112c acquires, from the IO information table T300, the in-use priority levels for all of the IOs (step S580). The output control unit 112c selects the lowest of the acquired priority levels, and outputs a select signal whose value is "11" to the selector corresponding to the IO having the selected lowest priority, and outputs a select signal whose value is "00" to the remaining selectors (step S585). Thereafter, the output control unit 112c performs the above-described step S590.

Also, the output control unit 112c performs the output information signal generation processing (step S550) in parallel with the processing of steps S555 to S590.

Upon receiving the output control signal 181c whose value is "1", the internal signal control unit 111c sets the received start address as the output start location, successively acquires the stored condition data in order from the start location, and successively outputs the acquired condition data to the selectors as the internal condition output signal 160c.

(4) Output Information Signal Generation Processing

A description of the output information signal generation processing shown in step S500 of FIG. 21 has been omitted since it can be realized by the output information signal generation processing described in embodiment 3 with reference to the flowchart of FIG. 13.

(5) Data Output Processing

A description of the data output processing performed by the information collection apparatus 200c has been omitted since it can be realized by the same processing shown in the flowchart of FIG. 14.

4.3 Concrete Example

Figure 23:
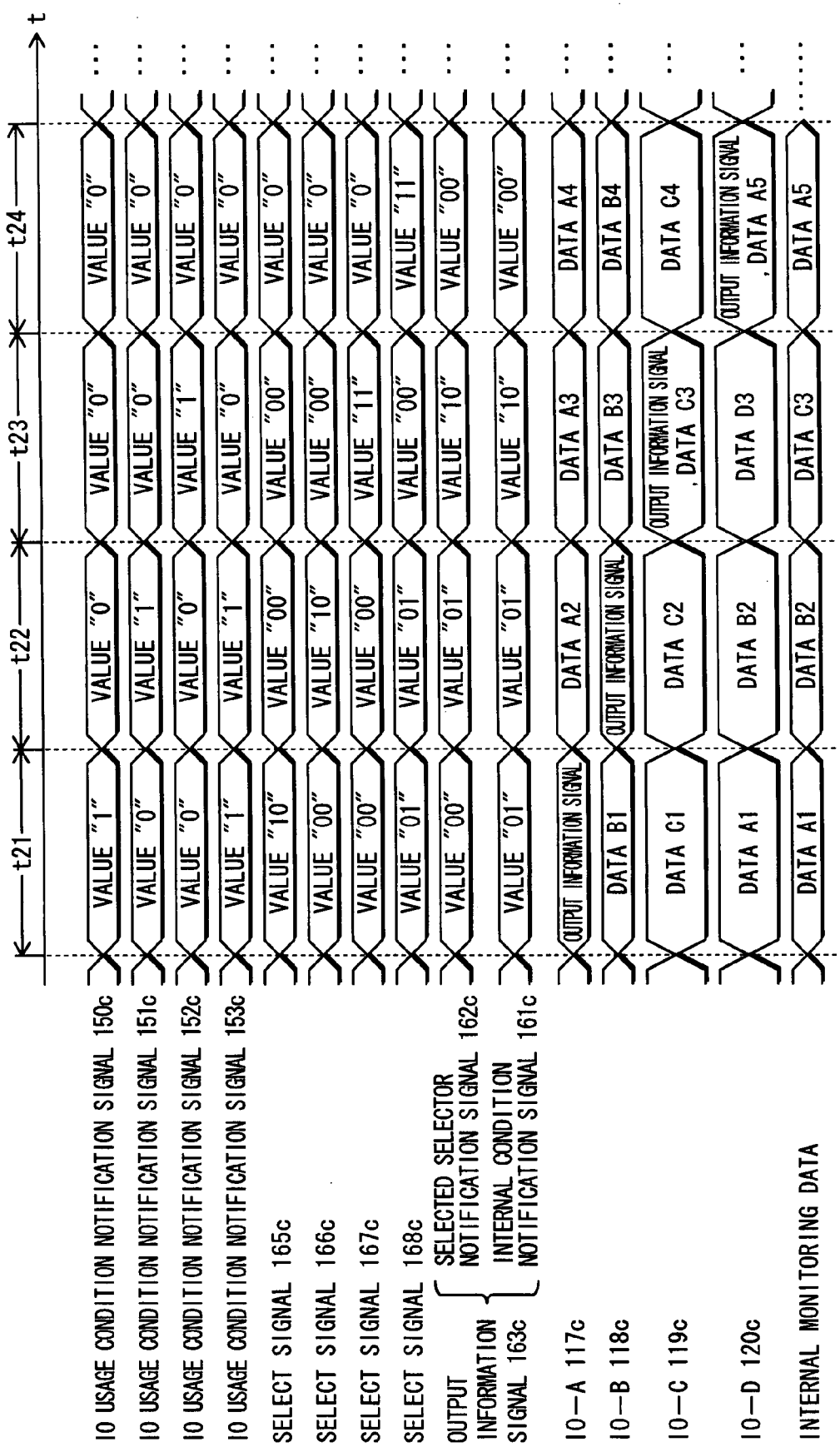
FIG. 23 is a timing chart showing a concrete example of operations performed by the semiconductor operation monitor system 4.

The following describes a concrete example of operations performed by the semiconductor operation monitor system 4, with reference to FIGS. 17, 19 and 23.

In the following description, the condition storage unit 126c and the information storage unit 127c of the semiconductor apparatus 101c are assumed to be storing the information shown in FIGS. 17A and 17B, and the IO information holding unit 128c is assumed to be storing the IO information table T300 shown in FIG. 19.

(Period t21)

In period t21, the output control unit 112c searches for a selector that can be used in the output of the internal condition output signal 160c and the output information signal 163c, based on the values ("1", "0", "0" and "1") indicated by the IO usage condition notification signals.

The output control unit 112c judges, with use of the search result, whether two or more selectors can be used.

In this case, the output control unit 112c judges that two selectors (here, the selectors A 113c and D 116c) can be used in the output of the internal condition output signal 160c and the output information signal 163c, and acquires, from the IO information table T300, the priority levels for the IO-A 117c and the IO-D 120c that correspond to the selectors A 113c and D 116c respectively. Here, the output control unit 112c acquires the not-in-use priority levels "2" and "1" for the IO-A 117c and the IO-D 120c respectively.

In accordance with the values indicated by the acquired priority levels, the output control unit 112c outputs the select signal 165c whose value is "10" to the selector A 113c, outputs the select signal 168c whose value is "01" to the selector D 116c, and outputs the select signals 166c and 167c whose values are "00" to the selectors B 114c and C 115c respectively.

In this case, the output control unit 112b outputs the output control signal 181b whose value is "1" and the signal indicating the start address of address information T201 to the internal signal control unit 111b.

Upon receiving the output control signal 181b whose value is "1" and the signal indicating the start address of address information T201, the internal signal control unit 111b acquires the data A1 in accordance with the signal indicating the start address, and outputs the data A1 to the selectors.

Note that descriptions of operations for outputting the select signals and the output information signals, and operations performed by the information collection apparatus 200c and the information display apparatus 300c have been omitted since they are the same as the operations described in FIG. 15

(Period t22)

In period t22, the output control unit 112c searches for a selector that can be used in the output of the internal condition output signal 160c and the output information signal 163c, based on the values ("0", "1", "0" and "1") indicated by the IO usage condition notification signals.

The output control unit 112c judges, with use of the search result, whether two or more selectors can be used.

In this case, the output control unit 112c judges that two selectors (here, the selectors B 114c and D 116c) can be used in the output of the internal condition output signal 160c and the output information signal 163c, and acquires, from the IO information table T300, the priority levels for the IO-B 118c and the IO-D 120c that correspond to the selectors B 114c and D 116c respectively. Here, the output control unit 112c acquires the not-in-use priority levels "2" and "1" for the IO-B 118c and the IO-D 120c respectively.

In accordance with the values indicated by the acquired priority levels, the output control unit 112c outputs the select signal 166c whose value is "10" to the selector B 114c, outputs the select signal 168c whose value is "01" to the selector D 116c, and outputs the select signals 165c and 167c whose values are "00" to the selectors A 113c and C 115c respectively.

Descriptions of the subsequent operations have been omitted since they are the same as the operations described in period t21.

(Period t23)

In period t23, the output control unit 112c searches for a selector that can be used in the output of the internal condition output signal 160c and the output information signal 163c, based on the values ("0", "0", "1" and "0") indicated by the IO usage condition notification signals.

The output control unit 112c judges, with use of the search result, whether two or more selectors can be used.

In this case, the output control unit 112c judges that one selector (here, the selector C 115c) can be used in the output of the internal condition output signal 160c and the output information signal 163c, and outputs the select signal 167c whose value is "11" to the selector C 115c, and outputs the select signals 165c, 166c and 168c whose values are "00" to the selectors A 113c, B 114c and C 115c respectively.

Descriptions of the subsequent operations have been omitted since they are the same as the operations described in period t21.

(Period t24)

In period t24, the output control unit 112c searches for a selector that can be used in the output of the internal condition output signal 160c, based on the values ("0", "0", "0" and "0") indicated by the IO usage condition notification signals.

Given that none of the selectors can be used, the output control unit 112c acquires, from the IO information table T300, the in-use priority levels for all of the IOs. Here, the output control unit 112c acquires the in-use priority levels "3", "4", "4" and "2" for the IO-A 117c, IO-B 118c, 10-C 119c and IO-D 120c respectively.

In accordance with the values indicated by the acquired priority levels, the output control unit 112c outputs the select signal 168c whose value is "11" to the selector D 116c, and outputs the select signals 165c, 166c and 167c whose values are "00" to the selectors A 113c, B 114c and C 115c respectively.

Descriptions of the subsequent operations have been omitted since they are the same as the operations described in period t21.

4.4 Conclusion

According to the semiconductor operation monitor system 4 having the structure described above, even if none of the terminals can be used, a terminal to be used in the output of internal monitoring data is selected in accordance with the priority levels of the terminals, and data input/output being performed by the selected terminal is forcibly stopped. This enables a terminal with a low priority level to be used in the output of internal monitoring data.

4.5 Variations

Although described based on the above embodiment 4, the present invention is of course not limited to embodiment 4. The following variations are also included in the present invention.

(1) Although the IO information holding unit 128c holds IO priority levels, the present invention is not limited to this.

There is no limit on the type of information held by the IO information holding unit 128c. The IO information holding unit 128c may hold any type of information that can be used for determining a source for the internal condition output signal 160c.

For example, the IO information holding unit 128c may hold ranges of frequencies that can be used when outputting signals, for the IO-A 117c, IO-B 118c, IO-C 119c and IO-D 120c. In this case, the internal signal control unit 111c attaches, to the internal condition notification signal 161c, type information (indicating a frequency, bus width, etc.) of the internal condition output signal 160c to be output to the selectors, and outputs the internal condition notification signal 161c to the output control unit 112c.

The output control unit 112c receives the internal condition notification signal 161c from the internal signal control unit 111c, and selects a most appropriate IO in accordance with the attached type information (indicating a frequency, bus width, etc.) of the internal condition output signal 160c.

For example, in a case in which the IO information holding unit 128c is holding information indicating that the IO-A 117c is a terminal compatible with 50 to 60 MHz signals, the IO-B 118c is a terminal compatible with 80 MHz signals, and the IO-C 119c and IO-D D120c are terminals compatible with 90 to 120 MHz signals, and the frequency of the internal condition output signal 160c is 100 MHz, the output control unit 112c judges the condition (usage condition) of the IO-C 119c or IO-D 120c, and performs subsequent processing.

The above structure enables outputting an internal condition output signal from the most appropriate terminal with respect to the properties of the IO terminals, thereby improving the quality of the internal condition output signal.

Note that if the IO holding unit holds only one value for each of the IOs, the frequency range is composed of the value. For example, when the IO-B 118c is compatible with an 80 Mhz signal as mentioned above, the frequency range is only 80 MHz.

Also, the IO information holding unit 128c may store the number of pins for each IO.

(2) Although the internal condition output signal 160c is output from only the terminal compatible with the frequency range including the frequency of the signal 160c in the above-described variation (1), the internal condition output signal 160c may be output from a terminal compatible with a frequency range that does not include the frequency of the signal 160c. In this case, information indicating that output is being performed by a terminal compatible with a frequency range that does not include the frequency of the signal 160c may be attached to the output information signal 163c before output to the information collection apparatus 200c.

(3) Although the semiconductor apparatus 101c includes the condition storage unit 126c and the information storage unit 127c in embodiment 4, the present invention is not limited to this.

The semiconductor apparatus 101c need not include the condition storage unit 126c and the information storage unit 127c.

In this case, the internal signal control unit 111c performs the same operations as the internal signal control unit 111a described in embodiment 2.

Also, the output control unit 112c does not output the output control signal 181c or the signal indicating the start address.

(4) In embodiment 4, in a case of acquiring two or more not-in-use priority levels for IOs, the output control unit 112c causes the selector corresponding to the IO having the lowest priority to be used in the input/output of the internal condition output signal. The present invention, however, is not limited to this. The output control unit 112c may cause the selector corresponding to the IO having the lowest priority to be used in the input/output of the output information signal, and cause the selector corresponding to the IO having the next lowest priority to output the internal condition output signal.

(5) In embodiment 4, in a case of all of the selectors being currently in use, the output control unit 112c selects one of the selectors currently in use in accordance with the in-use priority levels, in order to cause the selected selector to output the internal condition output signal 160c and the output information signal 163c to the information collection apparatus 200c. The present invention, however, is not limited to this.

If all of the selectors are currently in use, the output control unit 112c may select two of selectors in accordance with the in-use priority levels. In this case, the internal condition output signal 160c is output from one of the selected signals, and the output information signal 163c is output from another of the selected signals.

(6) In embodiment 4, in a case of any of the selectors not being currently in use, the output control unit 112c acquires only the priority levels of IOs corresponding to the one or more selectors not currently being used. The present invention, however, is not limited to this.

In this case, the output control unit 112c may acquire the priority levels of IOs corresponding to one or more selectors currently being used, in addition to the priority levels of IOs corresponding to the one or more selectors not currently being used.

In this case, the output control unit 112c may select a selector to be used in the input/output of the internal condition output signal 160c and the output information signal 163c in accordance with the values of all of the acquired priority levels.

Here, one selector may be selected, or two selectors may be selected.

(7) The above embodiment and variations may be combined.

Embodiment 5

Figure 24:
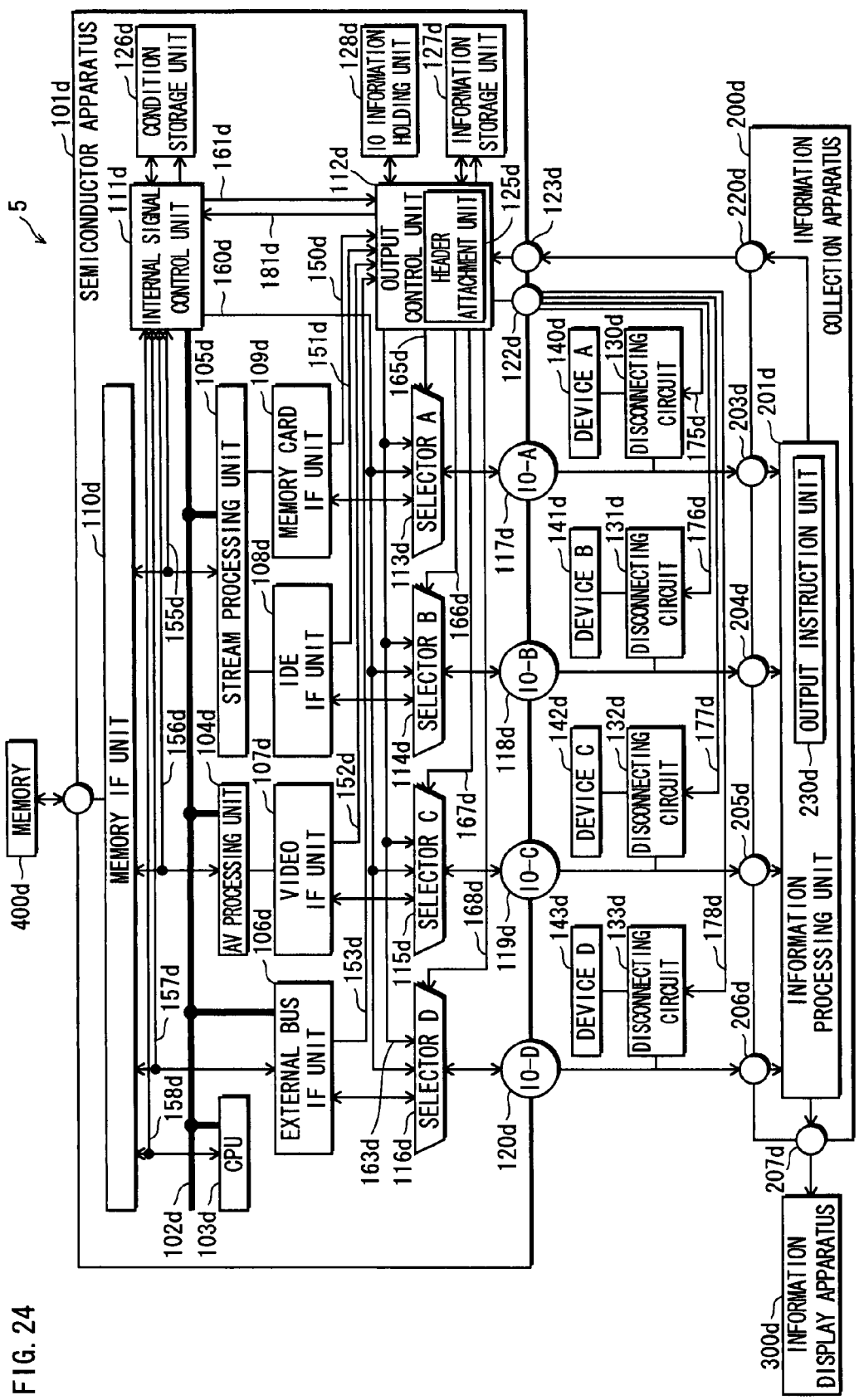
FIG. 24 shows a structure of a semiconductor operation monitor system 5.

FIG. 24 is a block diagram showing a structure of a semiconductor operation monitor system 5 in embodiment 5 of the present invention.

As shown in FIG. 24, the semiconductor operation monitor system 5 includes a semiconductor apparatus 101d, an information collection apparatus 200d, an information display apparatus 300d, a memory 400d such as an SDPAM, disconnecting circuits 130d, 131d, 132d and 133d, and devices A 140d, B 141d, C 142d and D 143d.

The semiconductor operation monitor system 5 differs from the semiconductor operation monitor system 4 of embodiment 4 in that the semiconductor apparatus 101d receives a user instruction from the information collection apparatus 200d, and executes processing in accordance with the received instruction.

The following describes the semiconductor operation monitor system 5 with focus on differences from the semiconductor operation monitor system 4.

The information collection apparatus 200d is, for example, a logic analyzer. The information collection apparatus 200d includes the functions of the information collection apparatus 200c described in embodiment 4, and additionally receives an instruction from a user and outputs the received instruction to the semiconductor apparatus 101d.

Descriptions of the information display apparatus 300d, disconnecting circuits 130d to 133d, and devices A 140d, B 141d, C142d and D 143d have been omitted since they are similar to the information display apparatus 300c, disconnecting circuits 130c to 133c, and devices A 140c, B 141c, C142c and D 143c described in embodiment 4.

Note that in the present embodiment, the disconnecting circuits 130d, 131d, 132d and 133d respectively receive disconnect instruction signals 175d, 176d, 177d and 178d from the semiconductor apparatus 101d. Descriptions of the disconnect instruction signals 175d to 178d have been omitted since they are similar to the disconnect instruction signals 175c to 178c described in embodiment 4.

5.1 Semiconductor Apparatus 101d

The semiconductor apparatus 101d is, for example, a system LSI. As shown in FIG. 24, the semiconductor apparatus 101d includes an internal bus 102d, a CPU 103d, an AV processing unit 104d, a stream processing unit 105d, an external bus IF unit 106d, a video IF unit 107d, an IDE IF unit 108d, a memory card IF unit 109d, a memory IF unit 110d, an internal signal control unit 111d, an output control unit 112d, selectors A 113d, B 114d, C 115d and D 116d, an IO-A 117d, an IO-B 118d, an IO-C 119d, an IO-D 120d, an output terminal 122d, a condition storage unit 126d, an information storage unit 127d, an IO information holding unit 128d, and an input terminal 123d.

Descriptions of the internal bus 102d, CPU 103d, AV processing unit 104d, stream processing unit 105d, external bus IF unit 106d, video IF unit 107d, IDE IF unit 108d, memory card IF unit 109d, memory IF unit 110d, output terminal 122d, condition storage unit 126d, information storage unit 127d, and IO information holding unit 128d have been omitted since they have the same functions as the internal bus 102c, CPU 103c, AV processing unit 104c, stream processing unit 105c, external bus IF unit 106c, video IF unit 107c, IDE IF unit 108c, memory card IF unit 109c, memory IF unit 110c, output terminal 122c, condition storage unit 126c, information storage unit 127c, and IO information holding unit 128c described in embodiment 4.

Note that the condition storage table T100 of FIG. 17A, the information storage table T200 of FIG. 17B, and the IO information table T300 of FIG. 19 are used in the following description when necessary.

Also, descriptions of the selectors A 113d, B 114d, C 115d and D 116d have been omitted since they have the same functions as the selectors A 113c, B 114c, C 115c and D 116c described in embodiment 4.

Also, descriptions of the IO-A 117d, IO-B 118d, IO-C 119d, and IO-D 120d have been omitted since they have the same functions as the IO-A 117c, IO-B 118c, IO-C 119c, and IO-D 120c described in embodiment 4.

Note that in the present embodiment, the external bus IF unit 106d, video IF unit 107d, IDE IF unit 108d and memory card IF unit 109d respectively output IO usage condition notification signals 153d, 152d, 151d and 150d to the output control unit 112d. Descriptions of the IO usage condition notification signals 150d to 153d output by the IF units have been omitted since they are the same as the IO usage condition notification signals described in embodiment 4.

Similarly to embodiment 1, the selectors have been provided in one-to-one correspondence with the IOs.

The following describes the semiconductor apparatus 101d with focus on points that differ from the semiconductor apparatus 101c of embodiment 4.

(1) Input Terminal 123d

The input terminal 123d receives, from the information collection apparatus 200d, user instruction information that includes a user instruction. The input terminal 123d outputs the received user instruction information to the output control unit 112d.

The following describes the user instruction information.

The user instruction information is composed of information indicating an instruction to change the type of internal condition signal to be acquired by the internal signal control unit 111d (hereinafter, called first information), information indicating an instruction to change a priority level stored in the IO condition holding unit (hereinafter, called second information), information indicating an instruction to forcibly change a source or destination of an internal condition output signal (hereinafter, called third information), or information indicating an instruction to cancel the forced change made by the third information (hereinafter, called fourth information).

The first information includes a signal identifier for identifying the internal condition signal to be acquired after a change has been made.

The second information includes an IO identifier for identifying an IO whose priority level is to be changed, and values for the new in-use and not-in-use priority levels.

The third information includes a selector identifier for identifying a selector to be changed to.

(2) Output Control Unit 112d

The output control unit 112d has the same functions as the output control unit 112c described in embodiment 4.

Note that in the present embodiment, the output control unit 112d outputs select signals 165d to 168d to the selectors. Descriptions of the select signals 165d to 168d have been omitted since they are the same as the select signals described in embodiment 4.

Also, in the present embodiment, the output control unit 112d outputs, to the information collection apparatus 200d, the output information signal 163d, which is composed of the selected selector notification signal 162d and the internal condition notification signal 161d that has been output from the internal signal control unit 111d. Here, the internal condition notification signal 161d is the same as the internal condition notification signal 161c described in embodiment 4, and the selected selector notification signal 162d is the same as the selected selector notification signal 162c described in embodiment 4.

Also, in the present invention, the output control unit 112d outputs the output control signal 181d to the internal signal control unit 111d. The output control signal 181d is the same as the output control signal 181c described in embodiment 4.

The output control unit 112d additionally has the following functions.

The output control unit 112d has a flag that indicates whether the source of the internal condition output signal 160d has been forcibly changed. For example, an ON flag indicates that the source has been forcibly changed, and an OFF flag indicates that the source of the internal condition output signal 160d has been determined in accordance with the IO usage condition notification signals. The default value of the flag is OFF.

The output control unit 112d receives the user instruction information from the information collection apparatus 200 via the input terminal 123d, and analyzes the content of the received user instruction information.

(If the User Instruction Information is the First Information)

In a case of judging that the received user instruction information is composed of the first information, the output control unit 112d outputs the received user instruction information to the internal signal control unit 111d.

(If the User Instruction Information is the Second Information)

In a case of judging that the received user instruction information is composed of the second information, the output control unit 112d changes the content of the IO information table T300 in accordance with the received user instruction information, that is to say, the content indicated by the second information. For example, if the received second information includes an IO identifier indicating the IO-A 117d and post-change priority levels ("4" when being used, and "1" when not being used), the output control unit 112d changes the priority levels assigned to the IO-A 117d ("3" when being used, and "2" when not being used) to the received priority levels ("4" when being used, and "1" when not being used).

(If the User Instruction Information is the Third Information)

In a case of judging that the received user instruction information is composed of the third information, the output control unit 112d sets the flag to ON, and selects a selector to output the internal condition output signal 160d, in accordance with the received user instruction information, that is to say, the content indicated by the third information. The output control unit 112d judges, with use of the IO usage condition notification signals output from the selectors, whether another selector can be used to output the output information signal 163d.

Upon judging that other selectors can be used to output the output information signal 163d, the output control unit 112d selects one of the other selectors in accordance with the priority levels thereof. The output control unit 112d outputs a select signal whose value is "01" to the selector that is to output the internal condition output signal 160d, outputs a select signal whose value is "10" to the selector that is to output the output information signal 163d, and outputs select signals whose values are "00" to the remaining selectors.

In a case of judging that another selector cannot be used to output the output information signal 163d, the output control unit 112d outputs a select signal whose value is "11" to the selector that has been selected to output the internal condition output signal 160d, and outputs select signals whose values are "00" to the remaining selectors.

Also, if the selector selected to output the internal condition output signal 160d is being used in the input/output of normal data, the output control unit 112d outputs an intervention signal to the IF unit connected to the selected selector to stop the IF unit from performing input/output.

For example, If the received third information includes a selector identifier that indicates the selector B 114d, and the selector D 116d is not being used, the output control unit 112d outputs the select signal 166d whose value is "01" to the selector B 114d, outputs the select signal 168d whose value is "10" to the selector D 116d, and outputs the select signals 165d and 167d whose values are "00" to the selectors A 113d and C 115d.

Also, if the received third information includes a selector identifier that indicates the selector B 114d, and all of the selectors are currently being used, the output control unit 112d outputs the select signal 166d whose value is "11" to the selector B 114d, outputs the select signal 165d, 167d and 168d whose values are "00" to the selectors A 113d, C 115d and D 116d respectively, and outputs the intervention signal to the IDE IF unit 108.

Note that while the flag is ON, IO usage condition notification signals received from the IF units are ignored, and the internal condition output signal 160d is output from the selected selector.

(If the User Instruction Information is the Fourth Information)

In a case of judging that the received user instruction information is composed of the fourth information, the output control unit 112d sets the flag to OFF, and determines the source of the internal condition output signal 160d by the same method that is described in embodiment 4.

(3) Internal Signal Control Unit 111d

The internal signal control unit 111d has the same functions as the internal signal control unit 111c described in embodiment 4.

Note that in the present embodiment, the internal signal control unit 111d receives data, which is being transferred between the memory IF unit 110d and the stream processing unit 105d, as an internal condition signal 155d. The internal signal control unit 111d also receives data, which is being transferred between the memory IF unit 110d and the AV processing unit 104d, as an internal condition signal 156d. The internal signal control unit 111d also receives data, which is being transferred between the memory IF unit 110d and the external bus IF unit 106d, as an internal condition signal 157d. The internal signal control unit 111d also receives data, which is being transferred between the memory IF unit 110d and the CPU 103d, as an internal condition signal 158d. The internal signal control unit 111d also outputs internal monitoring data to the selectors as the internal condition output signal 160d.

The internal signal control unit 111d also has the additional functions.

Upon receiving the user instruction information (here, the first information) from the output control unit 112d, the internal signal control unit 111d changes the internal condition signal to be selected, in accordance with the signal identifier included in the received first information, and sets the new internal condition signal as condition data. Descriptions of operations pertaining to storage of the condition data have been omitted since they are the same as the operations described in embodiment 4.

5.2 Information Collection Apparatus 200d

The information collection apparatus 200d is, for example, a logic analyzer. As shown in FIG. 24, the information collection apparatus 200d includes an information processing unit 201d, connection terminals 203d to 207d, and the output terminal 220d.

(1) Connection Terminals 203d to 206d

The connection terminals 203d to 206d receive data (normal data, the internal condition output signal 160d or the output information signal 163d) output from the semiconductor apparatus 101d, and output the received data to the information processing unit 201d.

(2) Connection Terminal 207d

The connection terminal 207d is connected to the information display apparatus 300d by a plurality of signal lines.

Upon receiving data from the information processing unit 201d, the connection terminal 207d outputs the received data to the information display apparatus 300d.

(3) Information Processing Unit 201*d*

The information processing unit 201*d* includes the constituent elements shown in FIG. 9 and the output instruction unit 230*d* shown in FIG. 24.

The following describes the output instruction unit 230*d*.

(Output Instruction Unit 230*d*)

The output instruction unit 230*d* receives a user instruction indicating a change to the type of internal condition signal to be received by the internal signal control unit 111*d*, generates user instruction information composed of first information, and outputs the generated user instruction information to the semiconductor apparatus 101*d* via the output terminal 220*d*.

Upon receiving a user instruction indicating a change to a priority level, the output instruction unit 230*d* generates user instruction information composed of second information.

Upon receiving a user instruction indicating a forced change to the source or destination of an internal condition output signal, the output instruction unit 230*d* generates user instruction information composed of third information.

Upon receiving a user instruction indicating canceling of the forced change to the source or destination of the internal condition output signal, the output instruction unit 230*d* generates user instruction information composed of fourth information.

The output instruction unit 230*d* outputs generated user instruction information to the semiconductor apparatus 101*d* via the output terminal 220*d*.

(4) Output Terminal 220*d*

Upon receiving user instruction information from the output instruction unit 230*d*, the output terminal 220*d* outputs the received user instruction information to the semiconductor apparatus 101*d* via the input terminal 123*d*.

5.3 Operations of the Semiconductor Operation Monitor System 5

The following describes operations performed in the semiconductor operation monitor system 5, with focus on differences from operations performed in the semiconductor operation monitor systems 1, 2, 3 and 4 described in the above embodiments.

(1) Overview of Operations

The following overview of operations performed by the semiconductor operation monitor system 5 includes the overview of operations performed by the semiconductor operation monitor system 4 described in embodiment 4, as well as the following operations.

Upon receiving a user instruction, the information collection apparatus 200*d* outputs, to the semiconductor apparatus 101*d*, user instruction information that has been generated with use of the received instruction. Note that this operation is performed in parallel with the execution of data output processing.

(2) Selector Switch Processing

Figure 25:
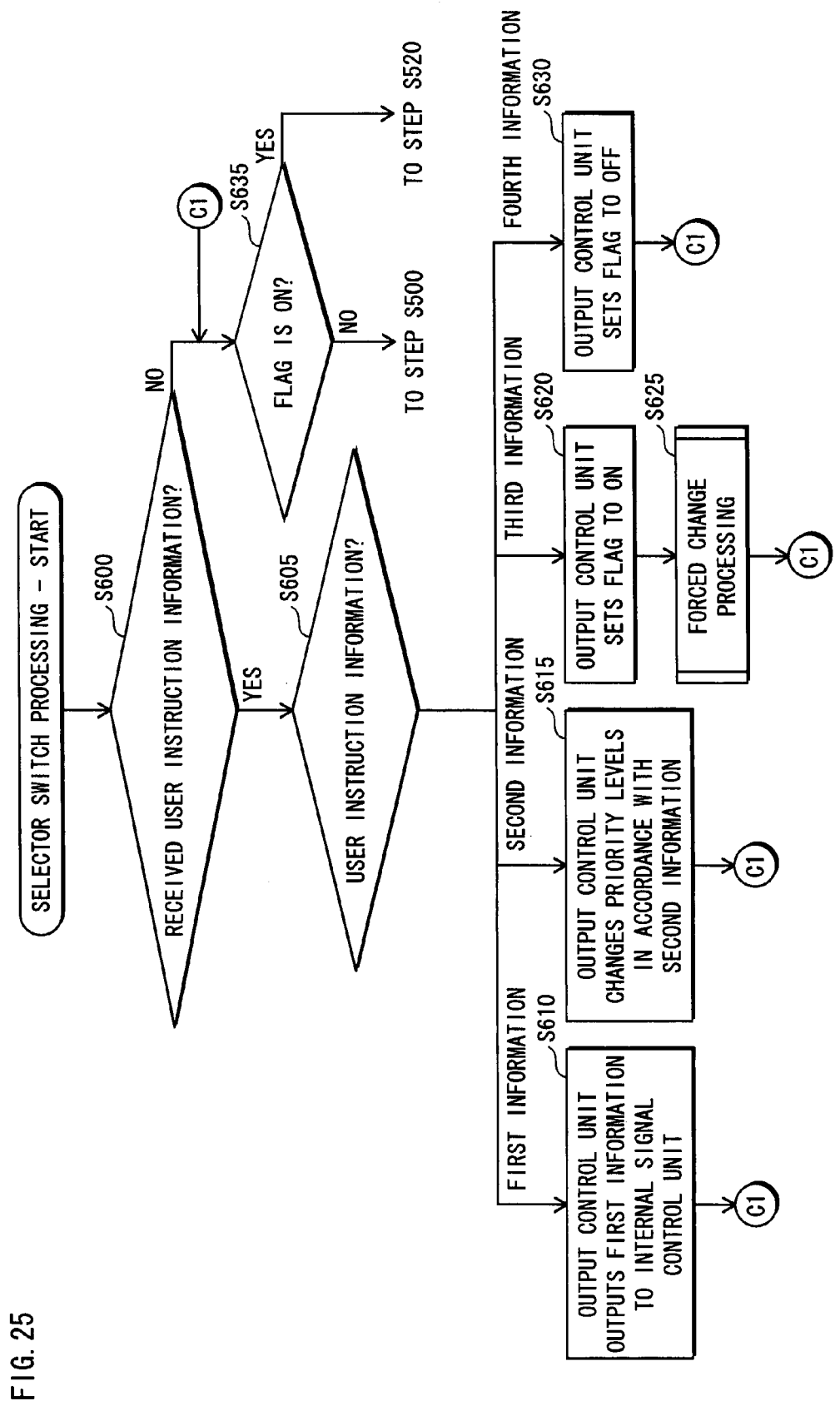
FIG. 25 is a flowchart showing a part of selector switch processing in a semiconductor apparatus 101d.

The following describes the selector switch processing performed by the semiconductor apparatus 101*d*, with reference to FIGS. 20 and 25.

The output control unit 112*d* judges whether user instruction information has been received from the information collection apparatus 200*d* (step S600).

In a case of judging that user instruction information has not been received (step S600: NO), the output control unit 112*d* judges whether the flag is set to ON (step S635).

In a case of judging that the flag is set to ON (step S635: YES), the output control unit 112*d* performs the same processing as from step S520 of FIG. 20.

In a case of judging that the flag is not set to ON, that is to say, that the flag is OFF (step S635: NO), the output control unit 112*d* performs the same processing as from step S500 of FIG. 20.

In a case of judging that user instruction information has been received (step S600: YES), the output control unit 112*d* judges the content of the received user instruction information (step S605).

In a case of judging that the received user instruction information is composed of first information (step S605: first information), the output control unit 112*d* outputs the received user instruction information (first information) to the internal signal control unit 111*d* (step S610), and processing moves to step S635.

In a case of judging that the received user instruction information is composed of second information (step S605: second information), the output control unit 112*d* changes the priority levels corresponding to an IO in accordance with the content of the received user instruction information (second information) (step S615), and processing moves to step S635.

In a case of judging that the received user instruction information is composed of third information (step S605: third information), the output control unit 112*d* sets the flag to ON (step S620) and performs forced change processing (step S625), and processing moves to step S635.

In a case of judging that the received user instruction information is composed of fourth information (step S605: fourth information), the output control unit 112*d* sets the flag to OFF (step S630), and processing moves to step S635.

(3) Forced Change Processing

The following describes the forced change processing shown in step S625 of FIG. 25, with reference to the flowchart of FIG. 26.

The output control unit 112*d* selects a selector for outputting the internal condition output signal 160*d*, in accordance with the content of the received user instruction information (third information) (step S650).

The output control unit 112*d* judges whether any other selectors can be used to output the output information signal 163*d* (step S655).

In the case of judging that another selector can be used to output the output information signal 163*d* (step S655: YES), the output control unit 112*d* acquires, from the IO information table T300, the priority levels for the one or more IOs not currently being used (step S660). The output control unit 112*d* generates and outputs a select signal whose value is "01" to the selector selected in step S650, generates and outputs a select signal whose value is "10" to the selector corresponding to IO having the lowest of the received priority levels, and generates and outputs a select signal whose value is "00" to the remaining selectors (step S665). The output control unit 112*d* acquires, from the information storage unit 127*d*, the address information indicating the start address showing where the first condition data to be output is stored, and outputs the output control signal 181*d* whose value is "1" and a signal indicating the acquired address information (start address) to the internal signal control unit 111*d* (step S675).

In the case of judging that no other selectors can be used to output the output information signal 163*d* (step S655: NO), the output control unit 112*d* outputs a select signal whose value is "11" to the selector selected in step S655, and outputs select signals whose values are "00" to the remaining selectors (step S670), and performs the above-described step S675.

Also, the output control unit 112*d* performs the output information signal generation processing (step S680) in parallel with the processing of steps S650 to S675.

Upon receiving the output control signal 181d whose value is "1", the internal signal control unit 111d sets the received start address as the output start location, successively acquires the stored condition data in order from the start location, and successively outputs the acquired condition data to the selectors as the internal condition output signal 160d.

(4) Selector Selection Processing

A description of the selector selection processing executed when the semiconductor apparatus 101d performs selector switch processing has been omitted since it can be realized by the processing shown in FIGS. 21 and 22.

(5) Output Information Signal Generation Processing

A description of output information signal generation processing performed in both the selector selection processing and the forced change processing executed by the semiconductor apparatus 101d has been omitted since it can be realized by the output information signal generation processing described in embodiment 3.

(6) Data Output Processing

A description of the data output processing performed by the information collection apparatus 200d has been omitted since it can be realized by the same processing shown in FIG. 14.

5.4 Conclusion

The semiconductor operation monitor system 5 having this structure enables internal condition monitoring to be performed in accordance with a user instruction received by the information collection apparatus 200d.

For example, the semiconductor operation monitor system 5 can forcibly select a terminal to be used in the output of internal monitoring data in accordance with a terminal specified by a user, and cause the selected selector to be used in the output of internal monitoring data.

5.5 Variations

Although described above based on embodiment 5, the present invention is of course not limited to embodiment 5. The following variations are also included in the present invention.

(1) In embodiment 5, the semiconductor apparatus 101d forcibly changes the selector to be used in the output of the internal condition output signal 160d, in accordance with user instruction information composed of third information. The present invention, however, is not limited to this.

The semiconductor apparatus 101d may use the third information as a basis for the judgment performed when selecting the selector to be used in the output of the internal condition output signal 160d.

For example, the semiconductor apparatus 101d may perform the following operations in order to use the third information as a basis for the judgment.

Upon receiving third information, the output control unit 112d of the semiconductor apparatus 101d judges whether the selector indicated by the third information is currently being used.

In a case of judging that the indicated selector is not currently being used, the output control unit 112d selects the indicated selector to be used in the output of the internal condition output signal 160d. Descriptions of processing performed thereafter has been omitted due to be previously described above.

In a case of judging that the indicated selector is currently being used, the output control unit 112d searches for a selector that is not currently being used in the input/output of data, and performs the same operations as the output control unit 112c described in FIG. 4, in accordance with a result of the search.

Variations

Although described based on the above embodiments, the present invention is of course not limited to the above embodiments. The following variations are also included in the present invention.

(1) The input/output terminals in the present invention correspond to constituent elements composed of the IOs and selectors described in the above embodiments.

(2) Although the internal condition output signal is a single-series signal in the above embodiments, the present invention is not limited to this. The internal condition output signal may be a multi-series signal.

Also, it is obvious that a plurality of terminals may output internal conditions simultaneously.

It is also obvious that the same effects can be achieved when there are two or more IO terminal blocks, memory card IF blocks, or the like.

(3) Although a monitor is the destination for data output from the information processing unit in the above embodiments, the present invention is not limited to this. The output data (internal monitoring data) may be output to any unit capable of making use thereof.

(4) Data being exchanged in the internal bus may also be monitored in the above embodiments.

Here, the types of data can be distinguished by making the internal condition notification signal a 3-bit signal.

(5) In the above embodiments, the internal signal control unit selects, from among the received internal condition signals, one internal condition signal to be output to the information collection apparatus, in accordance with an instruction from a debugging program being executed. The present invention, however, is not limited to this.

Any means for selecting an internal condition signal to be output to the information collection apparatus may be used. For example, the selection may be made by a user operation.

(6) Although the disconnecting signals are output from the semiconductor apparatus in the above embodiments, the present invention is not limited to this.

The disconnecting signals may be output from the information collection apparatus.

In this case, the values of the disconnecting signals are determined in accordance with the selected selector notification signal included in the output information signal output from the semiconductor apparatus.

(7) Although the information collection apparatus is a logic analyzer in the above embodiments, the present invention is not limited to this.

The information collection apparatus may be an LSI instead of a measuring device such as a logic analyzer or a measuring circuit on a substrate.

(8) Although the semiconductor apparatus includes a plurality of IO terminals in the above embodiments, the present invention is not limited to this.

The semiconductor apparatus may include one or more IO terminals. In other words, the output control unit may control one selector.

(9) In embodiment 1, if a connected IO terminal is being used in the input/output of normal data, that is to say, if a connected IF unit is performing the input/output of data with the corresponding device, the disconnecting circuit connected to the IO terminal may break the connection between the information collection apparatus and the IO terminal.

This enables the information collection apparatus to reliably receive the internal condition output signal since only the internal condition output signal is output to the information collection apparatus.

(10) The devices of the above embodiments and variations may be computer systems structured specifically from a microprocessor, a ROM, a RAM, a hard disk unit, a display unit, a keyboard, a mouse, etc. A computer program is stored in the RAM or the hard disk unit. The devices achieve their functions as the microprocessor operates in accordance with the computer program. Instruction code which indicates commands to the computer is structured as a combination of multiple instruction codes in order for the computer program to achieve predetermined functions.

(11) A portion or all of the constituent elements of the devices of the above embodiments and variations may be structured as a single system LSI (Large Scale Integration). A system LSI is a super multifunctional LSI manufactured by integrating a plurality of structural units onto a single chip. Specifically, it is a computer system including a microprocessor, a ROM, a RAM, and the like. A computer program is stored in the RAM. The system LSI achieves its functions as the microprocessor operates in accordance with the computer program.

Also, the units of the constituent elements of the devices may be constituted as separate chips. A portion or all of the units may be constituted as a single chip.

An integrated circuit may also be referred to as an IC, an LSI, a super LSI, or an ultra LSI, depending on the degree of integration. The integration is also not limited to LSI, but instead may be realized by a dedicated circuit or a general-purpose process. After LSI manufacture, the use of a field programmable gate array (FPGA) or a silicon flexible processor in which the connection and settings of circuit cells in the LSI can be restructured is possible.

Furthermore, if integration technology is developed that replaces LSIs due to progressive or derivative semiconductor technology, integration of functional blocks using this technology is naturally possible. For example, the application of biotechnology is a possibility.

(12) The present invention may be realized as methods for performing the above-described functions. Also, the present invention may be realized as a computer program for causing a computer to operate by the methods. Also, the present invention may be realized as digital signals representing the computer program.

The present invention may be realized as a computer-readable recording medium (for example, a flexible disk, a hard disk, CD-ROM, MO, DVD, DVD-ROM, DVD-RAM, BD (Blue-ray Disc), or a semiconductor memory) containing the above computer program or digital signals recorded thereon. Also, the present invention may be realized as the computer program or the digital signals recorded on the computer-readable recording medium.

The computer program or the digital signals as the present invention may be transferred via telecommunication lines, radio communications, communication lines, or a network such as the Internet.

The present invention may be realized as a computer system including a microprocessor and a memory, where the memory stores the computer program, and the microprocessor operates in accordance with the computer program. Also, the computer program or the digital signals as the present invention may be transferred to another computer system by means of the computer-readable recording medium recording them, the network or the like so that the other computer system can operate in the same manner.

(13) The present invention may be any combination of the above embodiments.

CONCLUSION

Functional blocks in the present invention correspond to elements composed of a processing unit and an IF (e.g., a set including the stream processing unit and the memory card IF unit), or an IF unit (e.g., the external bus IF unit).

Also, the acquisition step of the present invention corresponds to operations performed by the internal signal control unit of the above embodiments for selecting an internal condition signal.

Also, the instruction generation step of the present invention corresponds to operations performed by the output control unit for generating select signals.

The semiconductor operation monitor apparatus of the present invention includes: a semiconductor apparatus that has a plurality of functional blocks that are interconnected by signal lines, and a plurality of external IO terminals that are in one-to-one correspondence with the functional blocks, the semiconductor apparatus including: an internal signal control unit operable to collect various pieces of debugging information that is generated by operation of the semiconductor apparatus, the debugging information including a functional block operation condition, a signal line operation condition, etc., and selectively output the debugging information pieces; a plurality of selectors operable to selectively connect the external IO terminals to input/output signals from the functional blocks and the debugging information output from the internal signal control unit; and an output control unit operable to monitor a usage condition of each of the external IO terminals and output selection signals to the selectors in accordance with the usage conditions, and externally output an output information signal that is generated with use of the usage conditions and selection information of the selectors, the output information signal indicating how the external IO terminals are being used, the semiconductor operation monitor system further including an information collection unit that is external to the semiconductor apparatus and that is connected to the output information signal and output from the external IO terminals, the information collection unit including an information processing unit that processes a plurality of data pieces output from the external IO terminals, based on usage information of the external IO terminals that has been obtained from the output information signal.

According to this structure, an external 10 terminal not being used in normal operations is searched for and used to externally output LSI debugging information, thereby realizing a broadband semiconductor operation monitor apparatus without the provision of a dedicated terminal for debugging.

Furthermore, in the semiconductor apparatus, the plurality of selectors selectively connect the external IO terminals to an output information signal output from the output control unit, input/output signals from the functional blocks and the debugging information output from the internal signal control unit, and in the information collection unit, the information processing unit processes the plurality of data pieces output from the external IO terminals, based on usage information of the external IO terminals that has been obtained from the output information signal.

This structure eliminates the need for an output information signal notification IO terminal, and furthermore realizes a broadband semiconductor operation monitor apparatus with a small number of IOs.

Furthermore, in the semiconductor apparatus, the internal signal control unit outputs an internal condition notification signal that indicates a type of debugging information being output therefrom, and the output control unit outputs information indicated by the internal condition notification signal as the output information.

According to this structure, the information collection unit external to the LSI receives a notification of the type of debugging information that is being output, thereby realizing a semiconductor operation monitoring apparatus that facilitates the analysis of debugging information.

Furthermore, the output information signal includes information indicating a period in which the external IO terminals cannot be used in output of the debugging information.

According to this structure, the information collection unit external to the LSI receives a notification regarding a period of active information, thereby realizing a semiconductor operation monitoring apparatus that facilitates the analysis of debugging information.

Furthermore, the output information signal may include a header indicating a signal type.

This structure enables the information collection unit external to the LSI to identify whether output data is signal indicating debugging information or an attribute of debugging information.

Furthermore, the semiconductor apparatus includes an output signal storage unit operable to store information indicating how the external IO terminals are being used, and output the output information signal after a predetermined time has elapsed.

This structure enables acquisition of the output information after operations have been completed, instead of in real-time.

Furthermore, the semiconductor apparatus includes a debugging signal storage unit operable to store the debugging information from the internal signal control unit during the period in which the external IO terminals are not be used in output of the debugging information, and output the debugging information to the selectors when one or more of the external IO terminals is able to be used in output of the debugging information.

This structure enables increasing the amount of debugging information that can be secured by the information collection unit.

Furthermore, the semiconductor apparatus includes a priority level holding unit operable to hold flags that indicate priority levels for the external IO terminals, and the output control unit operable to, during the period in which the external IO terminals cannot be used in output of the debugging information, output to the functional blocks an instruction to forcibly enable one of the external IO terminals that has a lowest priority to be used in output of the debugging information.

This structure enables increasing the amount of debugging information that can be secured by the information collection unit.

Furthermore, the semiconductor apparatus includes an IO terminal information holding unit operable to hold IO terminal information pertaining to the external IO terminals, and the output control unit compares the IO terminal information and the attribute of the debugging information obtained from the internal condition notification signal, and judges which of the external IO terminals is to be used in output of the debugging information.

This structure improves the reliability of the debugging information since an external IO terminal is selected according to the characteristics of the debugging information.

Furthermore, the IO terminal information includes ranges of frequencies that the external IO terminals are compatible with.

This structure improves the reliability of the debugging information since an external IO terminal is selected according to the operation frequency of the debugging information.

Furthermore, the information collection unit includes a terminal selection instruction unit operable to output, to the output control unit, a terminal selection signal indicating which of the external IO terminals is to be used in output of the debugging information, and in the semiconductor apparatus, the output control unit receives the terminal selection signal and uses the received terminal selection signal as a basis for judging with respect to which selector selection signal generation is to be performed.

This structure enables accommodating a request from the information collection unit which is the debugging information collection side, thereby constructing a more flexible system.

According to the semiconductor operation monitor apparatus of the present invention, effects on the original operations of the semiconductor apparatus are minimized, thereby enabling an extremely highly reliable operation condition. Also, a rise in LSI cost can be kept at a minimum. Also, there is a dramatic improvement in the ease of developing the semiconductor apparatus since internal operation conditions that conventionally could not be output due to limitations on external IO terminals can now be output to a much greater extent.

INDUSTRIAL APPLICABILITY

A semiconductor operation monitor apparatus pertaining to the present invention is structured such that internal signals are externally output without limitations, and is useful as a method for verifying whether the semiconductor is operating properly. The present invention can also be applied when, for example, making system adjustments for performance improvements.

The present invention can be used economically as well as continuously and repeatedly in electrical device industries that manufacture and sell semiconductor apparatuses.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An operation monitor system including a semiconductor apparatus that has one or more connection terminals and one or more devices connected thereto in one-to-one correspondence, and an information collection apparatus that collects condition information from the semiconductor apparatus, the condition information indicating an operation condition of the semiconductor apparatus, the semiconductor apparatus comprising:
one or more functional blocks, each operable to perform a predetermined operation, one or more of the functional blocks being an IO functional block whose predetermined operation includes performing input/output of operation information with respect to at least one of the one or more devices;
an acquisition unit operable to acquire the condition information from one of the one or more functional blocks;

an instruction generation unit operable to generate one of a first instruction and a second instruction for each IO functional block in accordance with a current input/output condition of the IO functional block; and one or more selectors provided in one-to-one correspondence with the one or more connection terminals, each selector being operable to perform connection switching so as to (i) connect the corresponding connection terminal and said IO functional block, when the first instruction has been generated for the IO functional block that is to perform the input/output of the operation information via the corresponding connection terminal, and (ii) connect the corresponding connection terminal and the acquisition unit, when the second instruction has been generated for said IO functional block, wherein while the acquisition unit and the corresponding connection terminal are connected via the selector, the semiconductor apparatus outputs the condition information to the information collection apparatus via the corresponding connection terminal, and the information collection apparatus collects the condition information from the corresponding connection terminal that is connected to the acquisition unit via the selector;

each IO functional block is further operable to judge whether the input/output of the operation information is being performed by the IO functional block, and output a judgment result to the instruction generation unit, and the instruction generation unit is further operable to (i) receive the judgment result from each IO functional block, (ii) perform a search based on each received judgment result for one or more functional blocks that are not performing the input/output of the operation information, upon finding one or more functional blocks that are not performing the input/output of the operation information, (iii) specify the one or more selectors whose connection targets are said one or more functional blocks, (iv) select one of the specified selectors to be used in output of the condition information, and (v) generate the second instruction to cause the selected selector to connect the connection terminal corresponding thereto and the acquisition unit.

2. A semiconductor apparatus that has one or more connection terminals and one or more devices connected thereto in one-to-one correspondence, and that externally outputs condition information indicating an internal operation condition, comprising:

one or more functional blocks, each operable to perform a predetermined operation, one or more of the functional blocks being an IO functional block whose predetermined operation includes performing input/output of operation information with respect to at least one of the one or more devices;

an acquisition unit operable to acquire the condition information from one of the one or more functional blocks;

an instruction generation unit operable to generate one of a first instruction and a second instruction for each IO functional block in accordance with a current input/output condition of the IO functional block; and one or more selectors provided in one-to-one correspondence with the one or more connection terminals, each selector being operable to perform connection switching so as to (i), connect the corresponding connection terminal and said IO functional block, when the first instruction has been generated for the IO functional block that is to perform the input/output of the operation information via the corresponding connection terminal, and (ii) connect the corresponding connection terminal and the acquisition unit, when the second instruction has been generated for said IO functional block, wherein each IO functional block is further operable to judge whether the input/output of the operation information is being performed by the IO functional block, and output a judgment result to the instruction generation unit, and the instruction generation unit is further operable to (i) receive the judgment result from each IO functional block, (ii) perform a search based on each received judgment result for one or more functional blocks that are not performing the input/output of the operation information, upon finding one or more functional blocks that are not performing the input/output of the operation information, (iii) specify the one or more selectors whose connection targets are said one or more functional blocks, (iv) select one of the specified selectors to be used in output of the condition information, and (v) generate the second instruction to cause the selected selector to connect the connection terminal corresponding thereto and the acquisition unit.

3. The semiconductor apparatus of claim 2, wherein
the instruction generation unit is further operable to output the second instruction to the selected selector, and output the first instruction to remaining ones of the one or more selectors, and each selector is further operable to receive the first instruction or the second instruction from the instruction generation unit, set one of the one or more functional blocks as the connection target upon receiving the first instruction, and the acquisition unit as the connection target upon receiving the second instruction.

4. The semiconductor apparatus of claim 3, further comprising:

an output terminal, wherein
the instruction generation unit is further operable to, upon selecting the selector to be used in the output of the condition information, generate identification information that identifies the selected selector, and externally output the generated identification information via the output terminal.

5. The semiconductor apparatus of claim 2, wherein
the instruction generation unit is further operable to, upon selecting the selector to be used in the output of the condition information, generate identification information that identifies the selected selector, and generate a third instruction, and each selector is further operable to, when the third instruction has been generated by the instruction generation unit, set the instruction generation unit as the connection target, and externally output the identification information via the corresponding connection terminal.

6. The semiconductor apparatus of claim 5, wherein
the instruction generation unit is further operable to, upon performing the selection, select, from among the one or more specified selectors, a selector to be used in the output of the identification information, output the second instruction to the selector selected to be used in the output of the condition information, output the third instruction to the selector selected to be used in the output of the identification information, and output the first instruction to remaining ones of the one or more selectors, and each selector is further operable to receive the first instruction, the second instruction or the third instruction from the instruction generation unit, and upon receiving the first instruction, set one of the one or more IO functional blocks as the connection target, upon receiving the second corresponding, set the acquisition unit as the connection target, and upon receiving the third instruction, set the instruction generation unit as the connection target.

7. The semiconductor apparatus of claim 6, wherein
upon finding two or more functional blocks that are not currently performing the input/output, the instruction generation unit selects, from among two or more of the specified selectors, another selector other than the selector selected to be used in the output of the condition information, the another selector to be used in output of the identification information.

8. The semiconductor apparatus of claim 6, wherein
upon finding only one functional block that is not currently performing the input/output, the instruction generation unit selects the selector that is to be used in the output of the condition information to also be used in the output of the identification information,
the instruction generation unit is further operable to generate a fourth instruction and output the generated fourth instruction to the selector that has been selected to be used in the output of both the identification information and the condition information, and
each selector is further operable to receive the fourth instruction and set the acquisition unit and the instruction generation unit as the connection targets.

9. The semiconductor apparatus of claim 6, wherein
the instruction generation unit is further operable to attach header information to the identification information, the header information indicating that the identification information is identification information.

10. The semiconductor apparatus of claim 2, further comprising:
a storage unit operable to have stored therein the condition information, wherein
the acquisition unit acquires the condition information stored in the acquisition unit only when the instruction generation unit has selected the selector to be used in the output of the condition information.

11. The semiconductor apparatus of claim 2, further comprising:
a storage unit operable to have stored therein one or more in-use priority levels and not-in-use priority levels in one-to-one correspondence with the one or more connection terminals, wherein
the instruction generation unit acquires, in accordance with a result of the search, the in-use priority levels or not-in-use priority levels corresponding to at least two connection terminals, and selects the selector corresponding to the connection terminal that has a lowest priority level among the received priority levels, the selected selector to be used in the output of the condition information.

12. The semiconductor apparatus of claim 11, wherein
upon specifying two or more selectors, the instruction generation unit acquires the not-in-use priority levels of the connection terminals that correspond to the two or more specified selectors.

13. The semiconductor apparatus of claim 12, wherein
when all of the IO functional blocks are performing the input/output, the instruction generation unit acquires all of the in-use priority levels.

14. The semiconductor apparatus of claim 11, wherein
upon specifying one or more selectors, the instruction generation unit acquires the not-in-use priority level of the one or more connection terminals corresponding to the one or more specified selectors, and acquires the in-use priority level of the remaining one or more selectors.

15. The semiconductor apparatus of claim 2, further comprising:
a storage unit operable to have stored therein one or more terminal information pieces in one-to-one correspondence with the one or more connection terminals, each terminal information piece indicating a property of the corresponding connection terminal, wherein
the instruction generation unit acquires property information that indicates a property of the condition information, and with use of the acquired property information and each terminal information piece, specifies one or more of the functional blocks to be a target for the search.

16. The semiconductor apparatus of claim 15, wherein
each terminal information piece indicates a frequency range in which information is to be input/output,
the property information indicates an operation frequency of the condition information, and
the instruction generation unit specifies one or more of the connection terminals whose frequency range includes the operation frequency, and sets the one or more functional blocks that are connection targets of the one or more specified connection terminals as targets for the search.

17. The semiconductor apparatus of claim 2, further comprising:
an instruction reception unit operable to externally receive specification information that specifies one of the one or more connection terminals to output the condition information, wherein
upon reception of the specification information, the instruction generation unit generates an instruction for causing the selector connected to the specified connection terminal to be used in the output of the condition information, so as to cause the condition information to be output via the connection terminal specified by the specification information, regardless of a result of the search.

18. An output method of externally outputting condition information that indicates an operation condition in a semiconductor apparatus that has one or more connection terminals and one or more devices connected thereto in one-to-one correspondence,
the semiconductor apparatus comprising:
one or more functional blocks, each operable to perform a predetermined operation, one or more of the functional blocks being an IO functional block whose predetermined operation includes performing input/output of operation information with respect to at least one of the one or more devices;
an acquisition unit operable to acquire the condition information from one of the one or more functional blocks; and
one or more selectors provided in one-to-one correspondence with the one or more connection terminals, and
the output method including an instruction generation step of generating one of a first instruction and a second instruction for each IO functional block in accordance with a current input/output condition of the IO functional block, wherein
the one or more selectors are each operable to perform connection switching so as to (i) connect the corresponding connection terminal and said IO functional block, when the first instruction has been generated for the IO functional block that is to perform the input/output of the operation information via the corresponding connection terminal, and (ii) connect the corresponding connection terminal and the acquisition unit, when the second instruction has been generated for said IO functional block, each IO functional block is further operable to judge whether the input/output of the operation information is being performed by the IO functional block, and output a judgment result, and the instruction generation step includes (i) receiving the judgment result from each IO functional block, (ii) performing a search based on each received judgment result for one or more functional blocks that are not performing the input/output of the operation information, upon finding one or more functional blocks that are not performing the input/output of the operation information, (iii) specifying the one or more selectors whose connection targets are said one or more functional blocks, (iv) selecting one of the specified selectors to be used in output of the condition information, and (v) generating the second instruction to cause the selected selector to connect the connection terminal corresponding thereto and the acquisition unit.

* * * * *